US009368477B2

(12) United States Patent
Crisp et al.

(10) Patent No.: US 9,368,477 B2
(45) Date of Patent: Jun. 14, 2016

(54) CO-SUPPORT CIRCUIT PANEL AND MICROELECTRONIC PACKAGES

(71) Applicant: Invensas Corporation, San Jose, CA (US)

(72) Inventors: Richard Dewitt Crisp, Hornitos, CA (US); Belgacem Haba, Saratoga, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/841,052

(22) Filed: Mar. 15, 2013

(65) Prior Publication Data

US 2014/0110832 A1    Apr. 24, 2014

Related U.S. Application Data

(63) Continuation-in-part of application No. 13/595,486, filed on Aug. 27, 2012, now abandoned.

(51) Int. Cl.
*H01L 23/48* (2006.01)
*H01L 25/065* (2006.01)
*G11C 5/06* (2006.01)
(Continued)

(52) U.S. Cl.
CPC ............ *H01L 25/0652* (2013.01); *G11C 5/063* (2013.01); *H01L 23/49822* (2013.01); *H01L 23/49827* (2013.01); *H01L 23/5385* (2013.01); *H01L 23/5389* (2013.01); *H05K 1/0298* (2013.01); *H05K 1/111* (2013.01); *H01L 25/0655* (2013.01); *H01L 25/105* (2013.01);
(Continued)

(58) Field of Classification Search
None
See application file for complete search history.

(56) References Cited

U.S. PATENT DOCUMENTS 3,670,208 A     6/1972   Hovnanian et al.
4,747,081 A     5/1988   Heilveil et al.
(Continued)

FOREIGN PATENT DOCUMENTS

EP       1205977 A2     5/2002
JP       61-093694      5/1986
(Continued)

OTHER PUBLICATIONS

Office Action from Taiwan for Application No. 101125197 dated May 19, 2014.
(Continued)

*Primary Examiner* — Mohammad Islam
*Assistant Examiner* — Jay C Chang
(74) *Attorney, Agent, or Firm* — Lerner, David, Littenberg, Krumholz & Mentlik, LLP

(57) ABSTRACT

A circuit panel can include contacts exposed at a connection site of a major surface thereof and configured to be coupled to terminals of a microelectronic package. The connection site can define a peripheral boundary on the major surface surrounding a group of the contacts that is configured to be coupled to a single microelectronic package. The group of contacts can include first, second, third, and fourth sets of first contacts. Signal assignments of the first and third sets of first contacts can be symmetric about a theoretical plane normal to the major surface with signal assignments of the respective second and fourth sets of first contacts. Each of the sets of first contacts can be configured to carry identical signals. Each of the sets of first contacts can be configured to carry address information sufficient to specify a location within a memory storage array of the microelectronic package.

25 Claims, 17 Drawing Sheets

(51) Int. Cl.
*H05K 1/11* (2006.01)
*H01L 23/498* (2006.01)
*H01L 23/538* (2006.01)
*H05K 1/02* (2006.01)
*H01L 25/10* (2006.01)

(52) U.S. Cl.
CPC ............... *H01L 2924/0002* (2013.01); *H05K 2201/10159* (2013.01)

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,163,024 A | 11/1992 | Heilveil et al. | |
| 5,210,639 A | 5/1993 | Redwine et al. | |
| 5,480,840 A | 1/1996 | Barnes et al. | |
| 5,679,977 A | 10/1997 | Khandros et al. | |
| 5,691,570 A | 11/1997 | Kozuka | |
| 5,751,553 A | 5/1998 | Clayton | |
| 5,777,391 A | 7/1998 | Nakamura et al. | |
| 5,821,614 A | 10/1998 | Hashimoto et al. | |
| 5,899,705 A | 5/1999 | Akram | |
| 5,929,517 A | 7/1999 | Distefano et al. | |
| 5,936,305 A | 8/1999 | Akram | |
| 5,949,700 A | 9/1999 | Furukawa et al. | |
| 5,973,403 A | 10/1999 | Wark | |
| 6,086,386 A | 7/2000 | Fjelstad et al. | |
| 6,130,116 A | 10/2000 | Smith et al. | |
| 6,159,837 A | 12/2000 | Yamaji et al. | |
| 6,177,636 B1 | 1/2001 | Fjelstad | |
| 6,197,665 B1 | 3/2001 | DiStefano et al. | |
| 6,252,264 B1 | 6/2001 | Bailey et al. | |
| 6,255,899 B1 | 7/2001 | Bertin et al. | |
| 6,261,867 B1 | 7/2001 | Robichaud et al. | |
| 6,297,960 B1 | 10/2001 | Moden et al. | |
| 6,313,532 B1 | 11/2001 | Shimoishizaka et al. | |
| 6,323,436 B1 | 11/2001 | Hedrick et al. | |
| 6,343,019 B1 | 1/2002 | Jiang et al. | |
| 6,376,769 B1 | 4/2002 | Chung | |
| 6,380,318 B1 | 4/2002 | Saito et al. | |
| 6,384,473 B1 | 5/2002 | Peterson et al. | |
| 6,426,560 B1 | 7/2002 | Kawamura et al. | |
| 6,433,422 B1 | 8/2002 | Yamasaki | |
| 6,445,594 B1 | 9/2002 | Nakagawa et al. | |
| 6,452,266 B1 | 9/2002 | Iwaya et al. | |
| 6,461,895 B1 | 10/2002 | Liang et al. | |
| 6,462,423 B1 | 10/2002 | Akram et al. | |
| 6,521,981 B2 | 2/2003 | Miyazaki et al. | |
| 6,560,134 B2 | 5/2003 | Brox et al. | |
| 6,577,004 B1 | 6/2003 | Rumsey et al. | |
| 6,611,057 B2 | 8/2003 | Mikubo et al. | |
| 6,617,695 B1 | 9/2003 | Kasatani | |
| 6,619,973 B2 | 9/2003 | Perino et al. | |
| 6,620,648 B2 | 9/2003 | Yang | |
| 6,633,078 B2 | 10/2003 | Hamaguchi et al. | |
| 6,658,530 B1 | 12/2003 | Robertson et al. | |
| 6,661,089 B2 | 12/2003 | Huang | |
| 6,692,987 B2 | 2/2004 | Lim et al. | |
| 6,707,141 B2 | 3/2004 | Akram | |
| 6,720,666 B2 | 4/2004 | Lim et al. | |
| 6,742,098 B1 | 5/2004 | Halbert et al. | |
| 6,744,137 B2 | 6/2004 | Kinsman | |
| 6,765,288 B2 | 7/2004 | Damberg | |
| 6,781,220 B2 | 8/2004 | Taube et al. | |
| 6,821,815 B2 | 11/2004 | Smith et al. | |
| 6,836,007 B2 | 12/2004 | Michii et al. | |
| 6,876,088 B2 | 4/2005 | Harvey | |
| 6,894,379 B2 | 5/2005 | Feurle | |
| 6,894,381 B2 | 5/2005 | Hetzel et al. | |
| 6,906,415 B2 | 6/2005 | Jiang et al. | |
| 6,943,057 B1 | 9/2005 | Shim et al. | |
| 6,977,440 B2 | 12/2005 | Pflughaupt et al. | |
| 6,982,485 B1 | 1/2006 | Lee et al. | |
| 7,061,092 B2 | 6/2006 | Akram et al. | |
| 7,061,105 B2 | 6/2006 | Masuda et al. | |
| 7,061,121 B2 | 6/2006 | Haba | |
| 7,091,064 B2 | 8/2006 | Jiang | |
| 7,122,897 B2 | 10/2006 | Aiba et al. | |
| 7,123,497 B2 | 10/2006 | Matsui et al. | |
| 7,138,709 B2 | 11/2006 | Kumamoto | |
| 7,141,879 B2 | 11/2006 | Wakamiya et al. | |
| 7,145,226 B2 | 12/2006 | Kumamoto | |
| 7,151,319 B2 | 12/2006 | Iida et al. | |
| 7,164,149 B2 | 1/2007 | Matsubara | |
| 7,170,158 B2 | 1/2007 | Choi et al. | |
| 7,262,507 B2 | 8/2007 | Hino et al. | |
| 7,272,888 B2 | 9/2007 | DiStefano | |
| 7,294,928 B2 | 11/2007 | Bang et al. | |
| 7,324,352 B2 | 1/2008 | Goodwin | |
| 7,368,319 B2 | 5/2008 | Ha et al. | |
| 7,372,169 B2 | 5/2008 | Chang | |
| 7,389,937 B2 | 6/2008 | Ito | |
| 7,405,471 B2 | 7/2008 | Kledzik et al. | |
| 7,414,312 B2 | 8/2008 | Nguyen et al. | |
| 7,420,284 B2 | 9/2008 | Miyazaki et al. | |
| 7,476,975 B2 | 1/2009 | Ogata | |
| 7,518,226 B2 | 4/2009 | Cablao et al. | |
| 7,535,110 B2 | 5/2009 | Wu et al. | |
| 7,550,842 B2 | 6/2009 | Khandros et al. | |
| 7,589,409 B2 | 9/2009 | Gibson et al. | |
| 7,633,146 B2 | 12/2009 | Masuda et al. | |
| 7,633,147 B2 | 12/2009 | Funaba et al. | |
| 7,642,635 B2 | 1/2010 | Kikuchi et al. | |
| 7,692,931 B2 | 4/2010 | Chong et al. | |
| 7,763,964 B2 | 7/2010 | Matsushima | |
| 7,763,969 B2 | 7/2010 | Zeng et al. | |
| RE41,478 E | 8/2010 | Nakamura et al. | |
| RE41,721 E | 9/2010 | Nakamura et al. | |
| RE41,722 E | 9/2010 | Nakamura et al. | |
| 7,795,721 B2 | 9/2010 | Kurita | |
| RE41,972 E | 11/2010 | Lenander et al. | |
| 7,855,445 B2 | 12/2010 | Landry et al. | |
| 7,989,940 B2 | 8/2011 | Haba et al. | |
| RE42,972 E | 11/2011 | Nakamura et al. | |
| 8,072,037 B2 | 12/2011 | Murphy et al. | |
| 8,138,015 B2 | 3/2012 | Joseph et al. | |
| 8,254,155 B1 * | 8/2012 | Crisp et al. | 365/63 |
| 8,278,764 B1 | 10/2012 | Crisp et al. | |
| 8,338,963 B2 | 12/2012 | Haba et al. | |
| 8,345,441 B1 | 1/2013 | Crisp et al. | |
| 8,378,478 B2 | 2/2013 | Desai et al. | |
| 8,405,207 B1 | 3/2013 | Crisp et al. | |
| 8,426,983 B2 | 4/2013 | Takeda et al. | |
| 8,432,046 B2 | 4/2013 | Miyata et al. | |
| 8,436,457 B2 | 5/2013 | Crisp et al. | |
| 8,436,477 B2 | 5/2013 | Crisp et al. | |
| 8,441,111 B2 | 5/2013 | Crisp et al. | |
| 8,502,390 B2 | 8/2013 | Crisp et al. | |
| 8,513,813 B2 | 8/2013 | Crisp et al. | |
| 8,513,817 B2 | 8/2013 | Haba et al. | |
| 8,525,327 B2 | 9/2013 | Crisp et al. | |
| 8,610,260 B2 | 12/2013 | Crisp et al. | |
| 8,629,545 B2 | 1/2014 | Crisp et al. | |
| 8,653,646 B2 | 2/2014 | Crisp et al. | |
| 8,659,139 B2 | 2/2014 | Crisp et al. | |
| 8,659,140 B2 | 2/2014 | Crisp et al. | |
| 8,659,141 B2 | 2/2014 | Crisp et al. | |
| 8,659,142 B2 | 2/2014 | Crisp et al. | |
| 8,659,143 B2 | 2/2014 | Crisp et al. | |
| 8,670,261 B2 | 3/2014 | Crisp et al. | |
| 8,823,165 B2 | 9/2014 | Haba et al. | |
| 8,902,680 B2 | 12/2014 | Yamamoto | |
| 8,917,532 B2 | 12/2014 | Crisp et al. | |
| 8,981,547 B2 | 3/2015 | Crisp et al. | |
| 2001/0002727 A1 | 6/2001 | Shiraishi et al. | |
| 2001/0013662 A1 | 8/2001 | Kudou et al. | |
| 2001/0022740 A1 | 9/2001 | Nuxoll et al. | |
| 2001/0038106 A1 | 11/2001 | Coteus et al. | |
| 2002/0000583 A1 | 1/2002 | Kitsukawa et al. | |
| 2002/0016056 A1 | 2/2002 | Corisis | |
| 2002/0027019 A1 | 3/2002 | Hashimoto | |
| 2002/0030261 A1 | 3/2002 | Rolda et al. | |
| 2002/0043719 A1 | 4/2002 | Iwaya et al. | |

(56) References Cited

U.S. PATENT DOCUMENTS

| | | |
|---|---|---|
| 2002/0053727 A1 | 5/2002 | Kimura |
| 2002/0053732 A1 | 5/2002 | Iwaya et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1* | 6/2003 | Pflughaupt et al. ........... 257/686 |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1* | 7/2004 | Bang et al. ................... 257/737 |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0206181 A1 | 8/2012 | Lin et al. |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |

FOREIGN PATENT DOCUMENTS

| | | |
|---|---|---|
| JP | 63/232389 | 9/1988 |
| JP | 64-001257 A | 1/1989 |
| JP | 2002-076252 A | 3/2002 |
| JP | 2004-063767 A | 2/2004 |
| JP | 2004152131 A | 5/2004 |
| JP | 2008-198841 A | 8/2008 |
| JP | 3143893 U | 8/2008 |
| JP | 2010-098098 A | 4/2010 |
| JP | 2011155203 A | 8/2011 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

Taiwanese Allowance and Search Report for Application No. 101136592 dated Jun. 27, 2014.

International Search Report and Written Opinion for Application No. PCT/US2012/057204 dated Aug. 30, 2013.

International Search Report and Written Opinion for Application No. PCT/US2012/057810 dated Jul. 23, 2013.

International Search Report and Written Opinion for Application No. PCT/US2013/056773 dated Dec. 4, 2013.

International Search Report for Application No. PCT/US2012/057173 dated Aug. 5, 2013.

International Search Report for Application No. PCT/US2012/057905 dated Aug. 20, 2013.

Elpida User's Manual, "Introduction to GDDR5 SGRAM", Document No. E1600E10 (Ver. 1.0), Published Mar. 2010, Japan, URL: http:'www.elpida.com.

(56) References Cited

OTHER PUBLICATIONS

Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 Dram Using Through-Silicon-Via Technology, IEEE, International Solid-State Circuits Conference, 2009, Samsung Electronics, Hwasung, Korea.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.
Taiwanese Office Action for Application No. 101136575 dated Oct. 28, 2014.
U.S. Appl. No. 61/477,877, filed Apr. 21, 2011.
International Search Report and Written Opinion for Application PCT/US2013/056777 dated Jan. 2, 2014.
U.S. Appl. No. 13/840,353, filed Mar. 15, 2013.
U.S. Appl. No. 13/840,542, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
International Search Report and Written Opinion for Application No. PCT/US2013/056777 dated Jan. 21, 2015.
Taiwanese Office Action for Application No. 101136585 dated Jan. 21, 2015.
Taiwanese Notice of Allowance for Application No. 102130518 dated Mar. 31, 2015.
Taiwanese Office Action for Application No. 101136606 dated Mar. 27, 2015.
International Search Report and Written Opinion for Application No. PCT/US2015/042726 dated Nov. 12, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.
Taiwanese Office Action for Application No. 101125193 dated Aug. 4, 2015.

\* cited by examiner

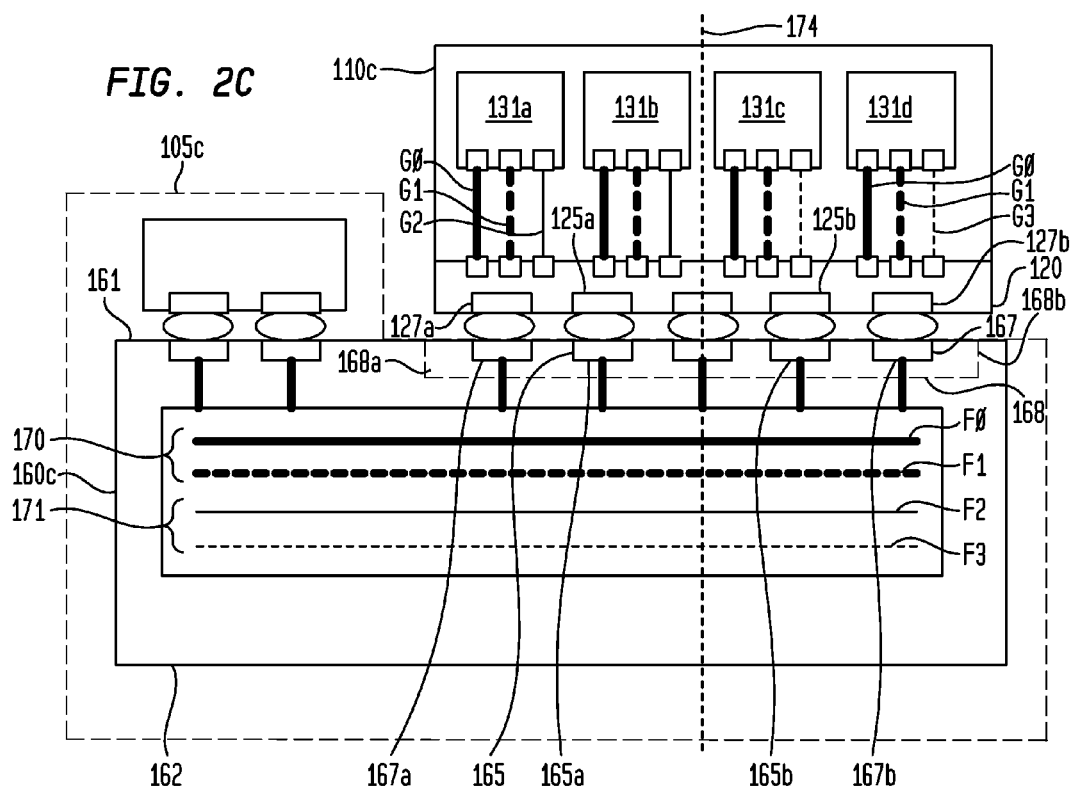
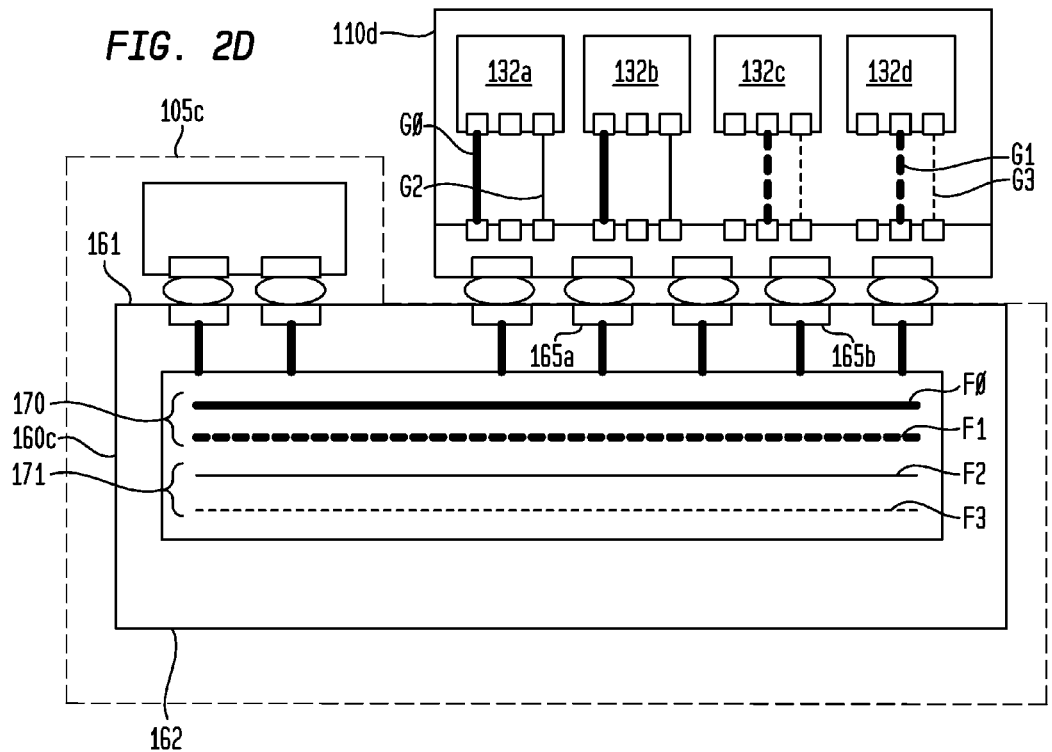

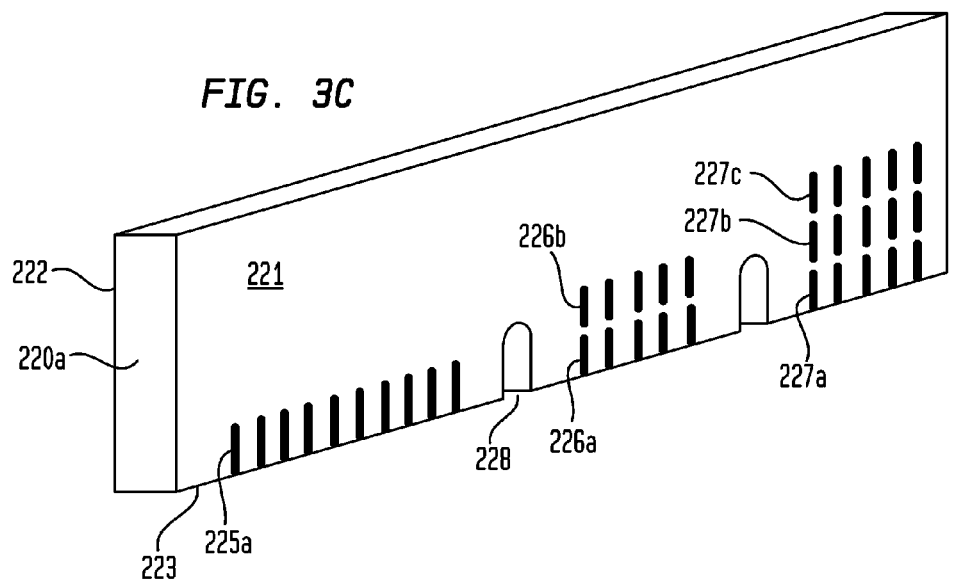
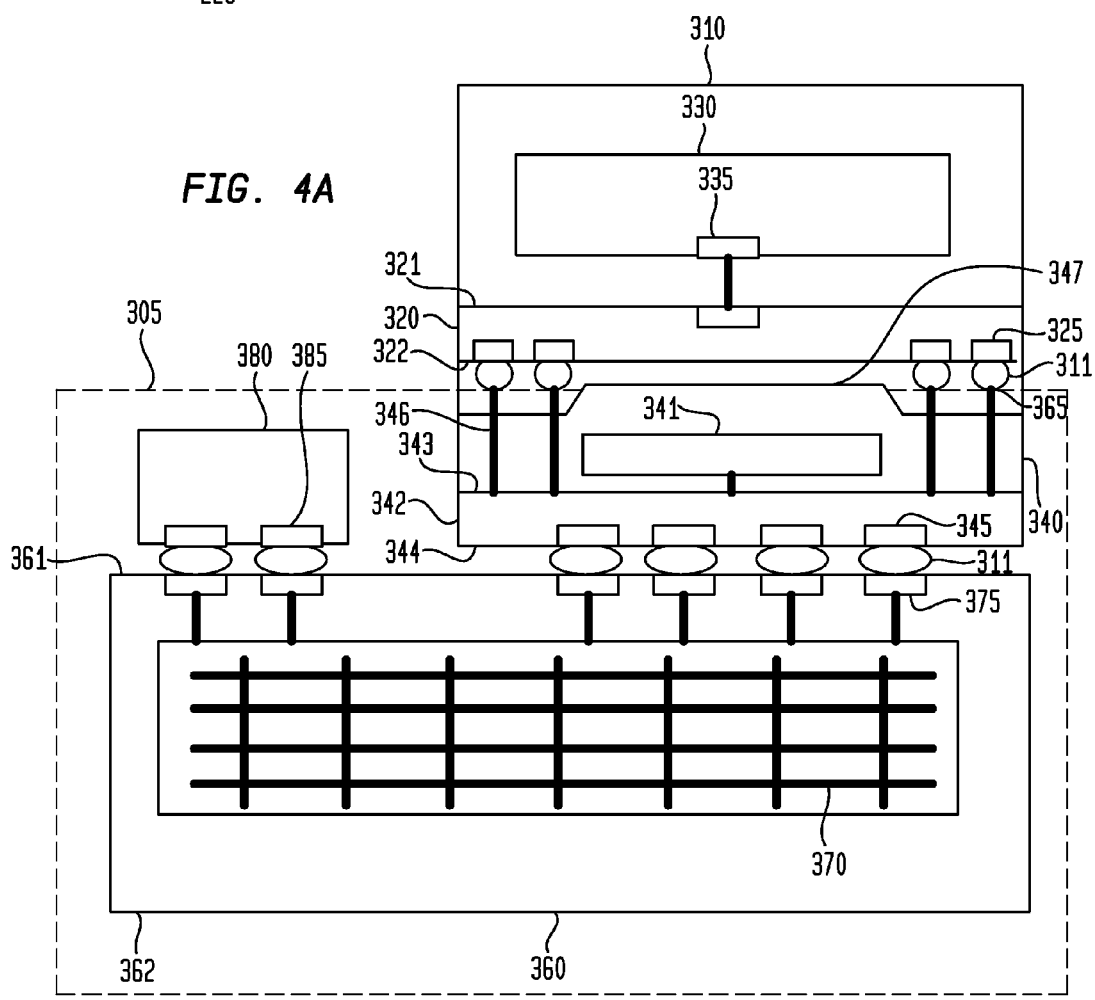

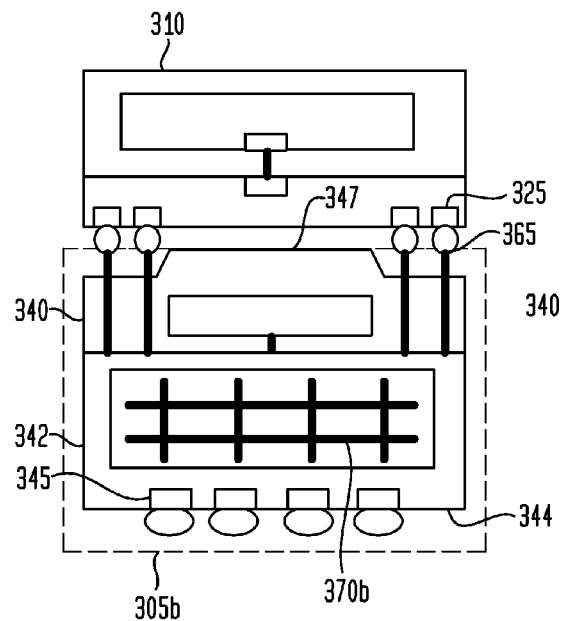
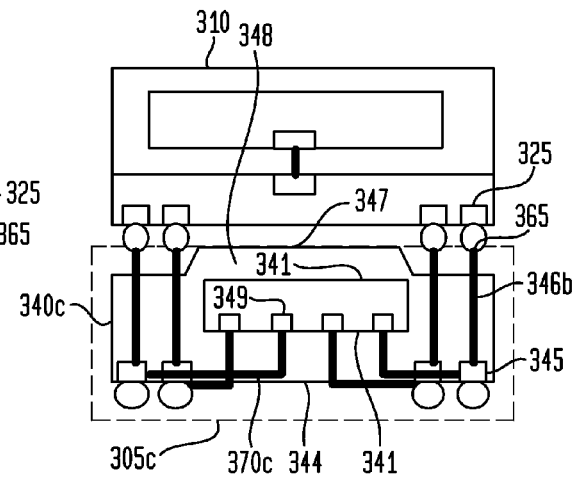
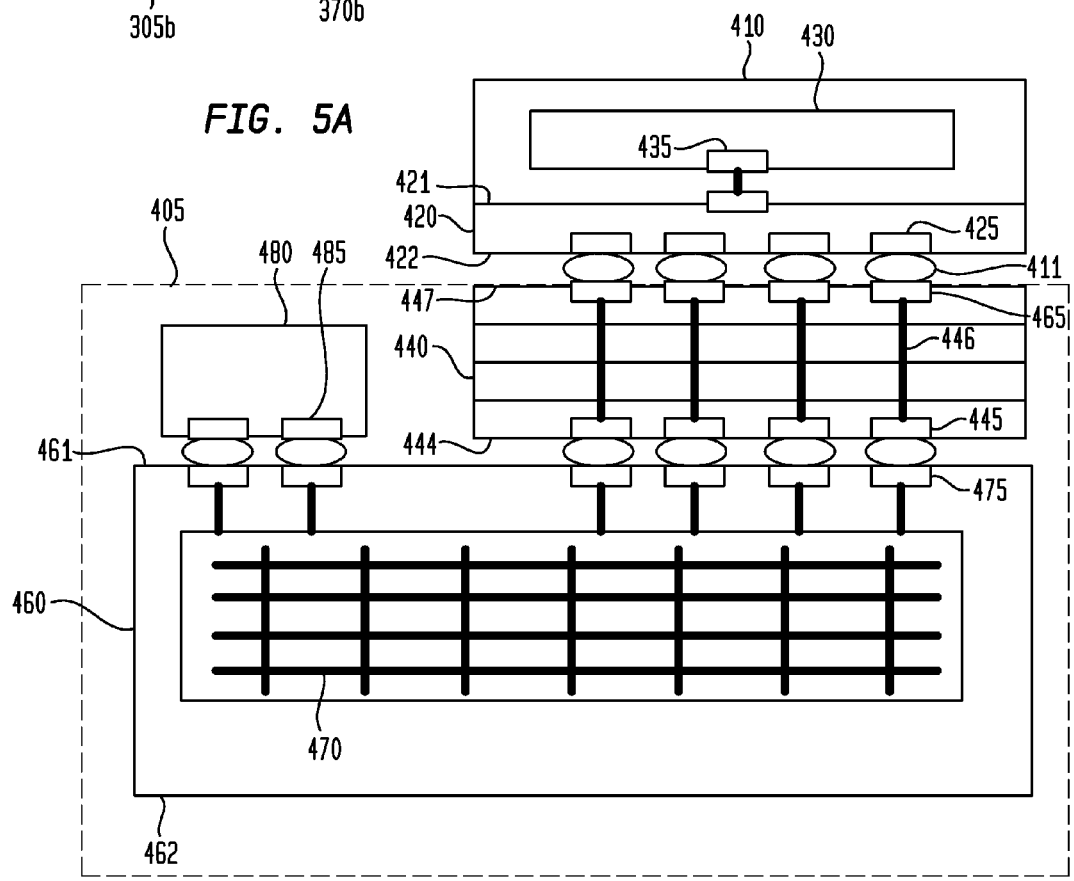

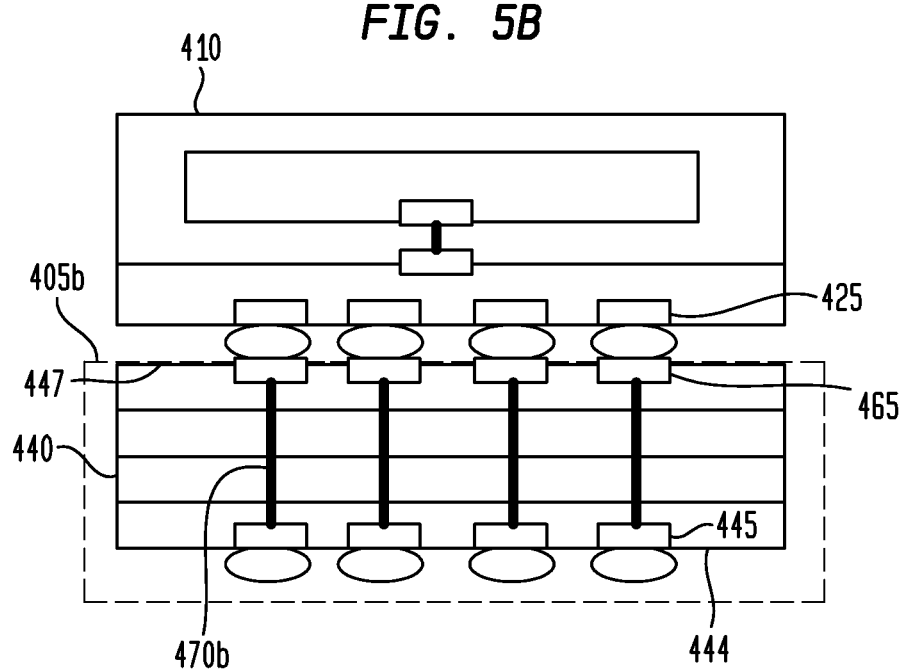

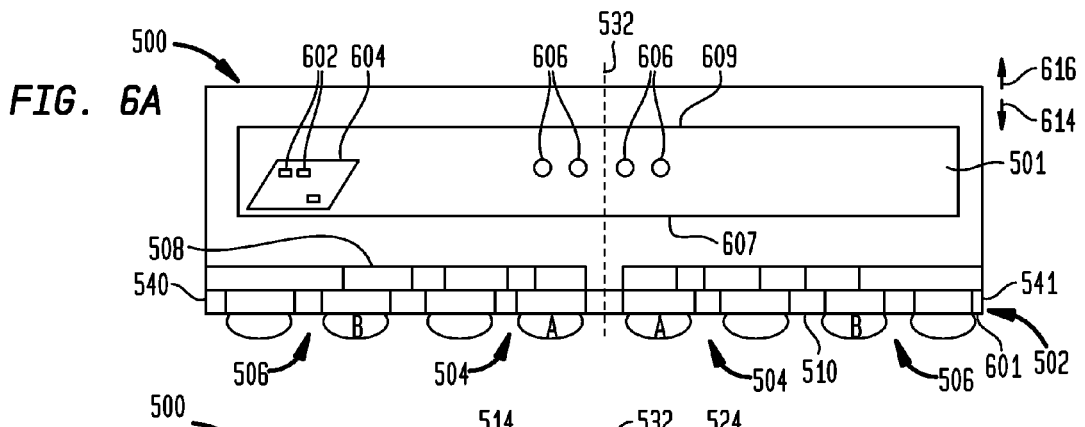
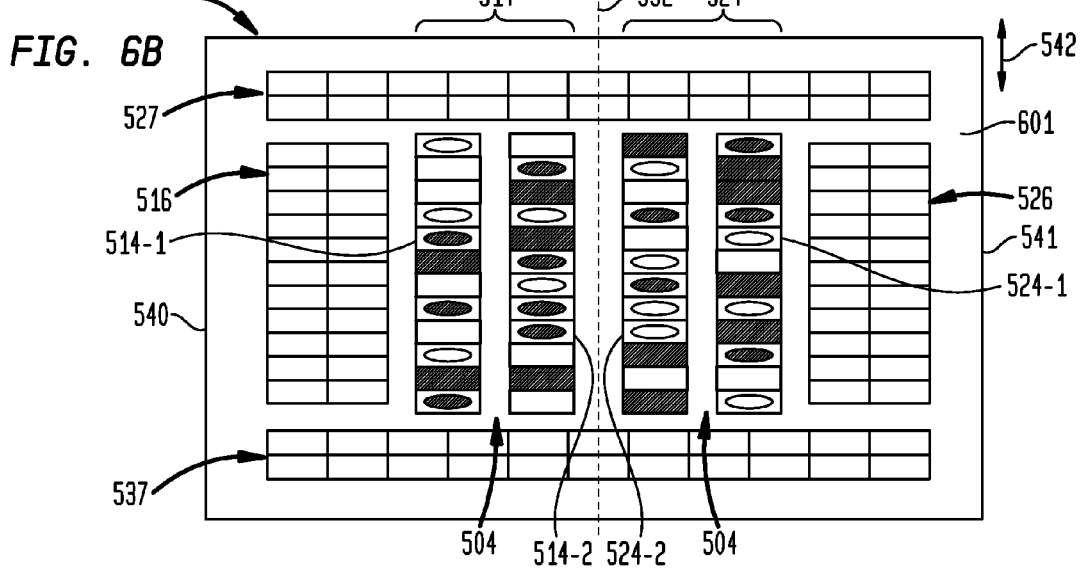
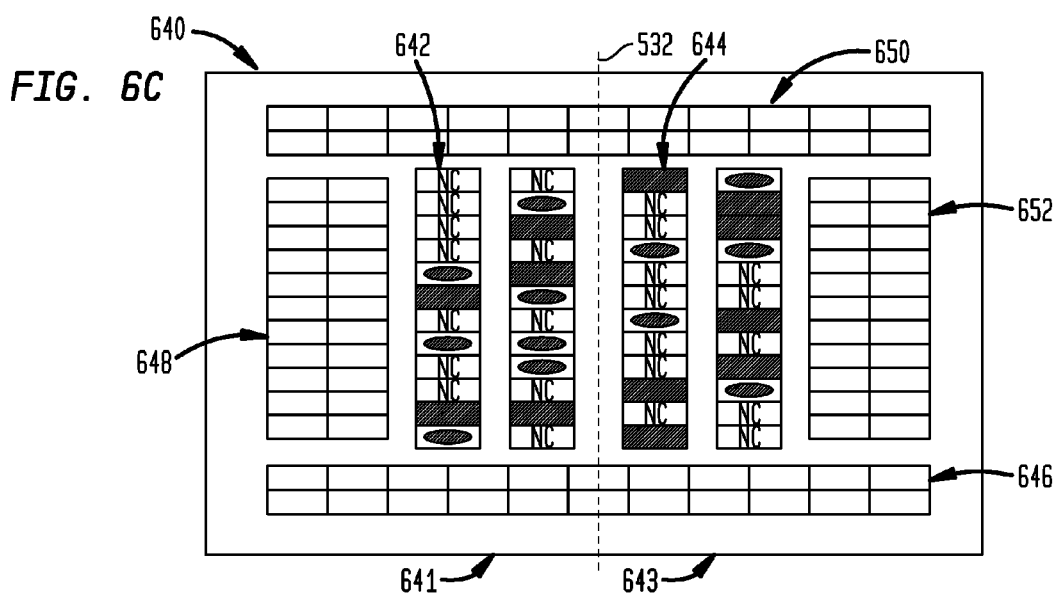

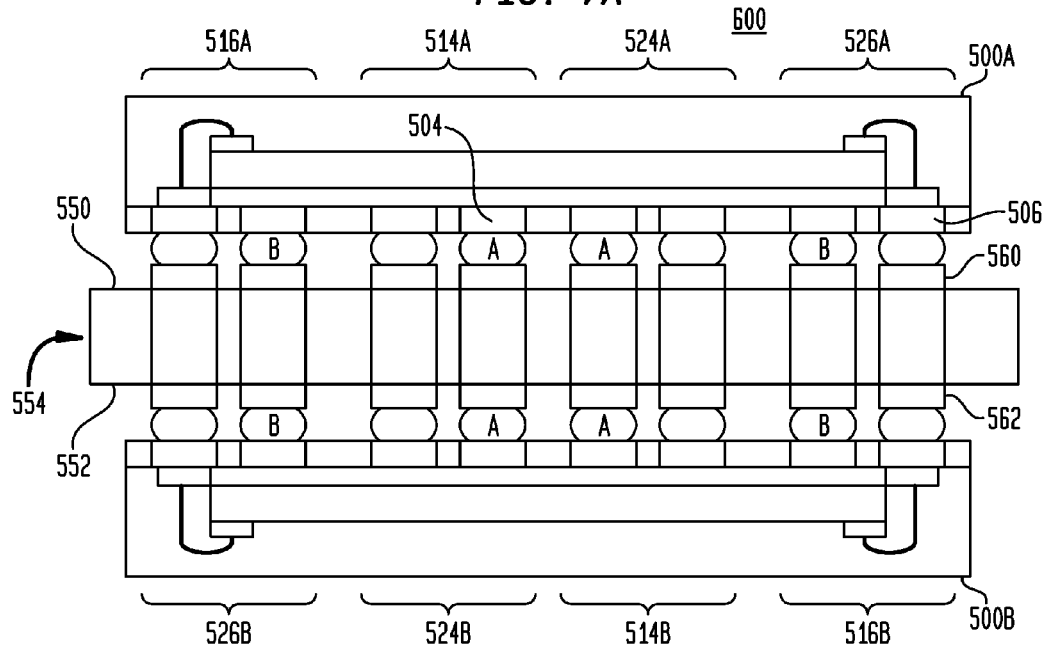
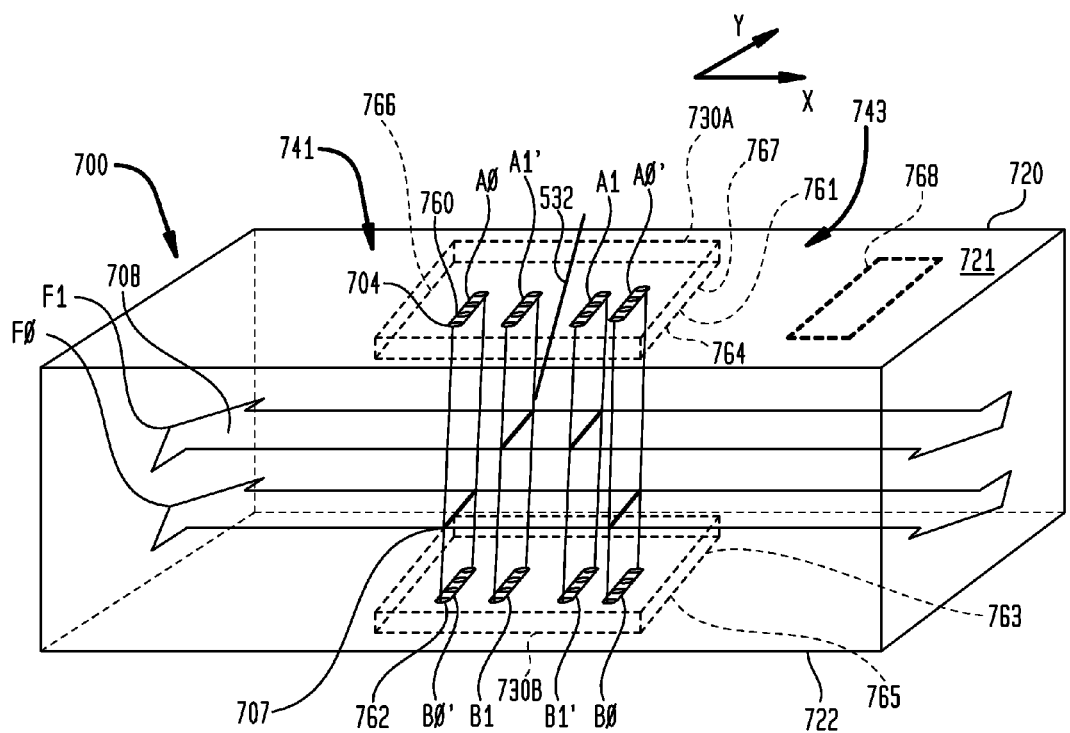

US 9,368,477 B2

CO-SUPPORT CIRCUIT PANEL AND MICROELECTRONIC PACKAGES

CROSS-REFERENCE TO RELATED APPLICATION

This application is a continuation-in-part of U.S. patent application Ser. No. 13/595,486, filed Aug. 27, 2012, the disclosure of which is hereby incorporated herein by reference. The following co-owned and U.S. Patent Applications are hereby incorporated herein by reference: Ser. No. 13/840,353, now U.S. Pat. No. 8,848,391, Ser. No. 13/840,542, now U.S. Pat. No. 8,848,392, and Ser. No. 13/839,402, now U.S. Pat. No. 8,787,034, each filed on even date herewith.

BACKGROUND OF THE INVENTION

The subject matter of the present application relates to microelectronic structures, e.g., structures incorporating active circuit elements, such as, without limitation, structures including at least one semiconductor chip or portion of at least one semiconductor chip, as well as assemblies incorporating microelectronic structures.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Microelectronic elements such as semiconductor chips which contain memory storage arrays, particularly dynamic random access memory chips (DRAMs) and flash memory chips, are commonly packaged in single- or multiple-chip packages and assemblies. Each package has many electrical connections for carrying signals, power and ground between terminals and the microelectronic elements, e.g., chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element having active elements defining a memory storage array. Thus, in some conventional microelectronic elements, transistors or other active elements, constitute a memory storage array with or without additional elements. In some cases, the microelectronic element can be configured to predominantly provide memory storage array function, i.e., in which case microelectronic element may embody a greater number of active elements to provide memory storage array function than any other function. In some cases, a microelectronic element may be or include a DRAM chip, or may be or include a stacked electrically interconnected assembly of such semiconductor chips. Typically, all of the terminals of such package are placed in sets of columns adjacent to one or more peripheral edges of a package substrate to which the microelectronic element is mounted.

Conventional circuit panels or other microelectronic components are typically configured to be coupled to a microelectronic package having one or more first type microelectronic elements therein. Such circuit panels or other microelectronic components typically cannot be coupled to a microelectronic package having one or more microelectronic elements therein that are of a different or second type.

In light of the foregoing, certain improvements in the design of circuit panels or other microelectronic components can be made in order to improve the functional flexibility thereof, particularly in circuit panels or other microelectronic components to which packages can be mounted and electrically interconnected with one another.

SUMMARY OF THE INVENTION

In accordance with an aspect of the invention, a circuit panel can include contacts exposed at a connection site of a major surface of the circuit panel and configured to be coupled to terminals exposed at a front surface of a microelectronic package having a memory storage array. The connection site can define a peripheral boundary on the major surface surrounding a group of the contacts that is configured to be coupled to a single microelectronic package. The group of contacts can include first, second, third, and fourth sets of first contacts. Signal assignments of the first set of first contacts can be symmetric about a theoretical plane normal to the major surface with signal assignments of the second set of first contacts. Signal assignments of the third set of first contacts can be symmetric about the theoretical plane with signal assignments of the fourth set of first contacts. Each of the sets of first contacts can be configured to carry identical signals. Each of the sets of first contacts can be configured to carry address information sufficient to specify a location within the memory storage array.

In one example, the microelectronic package can be one of a first type microelectronic package or a second type microelectronic package. The terminals of the first type microelectronic package can include first terminals configured to be coupled to the first and fourth sets of first contacts and no-connect terminals configured to be coupled to the second and third sets of first contacts. The position of each first terminal on a first side of the theoretical plane can be symmetric about the theoretical plane with a position of a no-connect terminal on a second side of the theoretical plane opposite from the first side. The position of each first terminal on the second side can be symmetric about the theoretical plane with a position of a no-connect terminal on the first side. The terminals of the second type microelectronic package can include first terminals configured to be coupled to the first, second, third, and fourth sets of first contacts. The signal assignments of the first terminals on the first side of the theoretical plane can be a mirror image of the signal assignments of the first terminals on the second side.

In a particular embodiment, the group of the contacts can also include first and second sets of second contacts disposed on respective first and second sides of the theoretical plane. The first set of second contacts can be disposed between a first edge of the peripheral boundary and the first and third sets of first contacts. The second set of second contacts can be disposed between a second edge of the peripheral boundary opposite from the first edge and the second and fourth sets of first contacts. The first and second sets of second contacts together can be configured to carry data bus and data strobe signals. In an exemplary embodiment, the circuit panel can also include at least one bus having a plurality of signal lines configured to carry all of the address information transferred to the group of the contacts. The first contacts can be electrically connected with the at least one bus.

In a particular example, the at least one bus can be configured to carry all of the command signals transferred to the group of the contacts, the command signals being write enable, row address strobe, and column address strobe signals. In one embodiment, the circuit panel can also include a first bus and a second bus. The first bus can be electrically connected with at least some of the first contacts and can have a plurality of signal lines configured to carry all of the address information transferred to the group of the contacts. The second bus can be electrically connected with at least some of the second contacts and can have a plurality of signal lines configured to carry information other than the address information. In a particular embodiment, the contacts of each of the sets of contacts can be arranged in at least one respective column extending in a direction parallel to the theoretical plane.

In one example, the connection site can be a first connection site and the microelectronic package can be a first microelectronic package. The circuit panel can also include contacts exposed at a second connection site of a second surface of the circuit panel opposite the major surface and configured to be coupled to terminals exposed at a front surface of a second microelectronic package having a memory storage array. The contacts of the second connection site can include fifth, sixth, seventh, and eighth sets of first contacts. Signal assignments of the fifth set of first contacts can be symmetric about the theoretical plane with signal assignments of the sixth set of first contacts. Signal assignments of the seventh set of first contacts can be symmetric about the theoretical plane with signal assignments of the eighth set of first contacts. Each of the fifth, sixth, seventh, and eighth sets of first contacts can be configured to carry identical signals. Each of the fifth, sixth, seventh, and eighth sets of first contacts can be configured to carry address information sufficient to specify a location within the memory storage array of the second microelectronic package.

In a particular embodiment, the first and second microelectronic packages can each be a first type microelectronic package. The terminals of the first microelectronic package can include first terminals configured to be coupled to the first and fourth sets of first contacts and no-connect terminals configured to be coupled to the second and third sets of first contacts. The terminals of the second microelectronic package can include first terminals configured to be coupled to the sixth and seventh sets of first contacts and no-connect terminals configured to be coupled to the fifth and eighth sets of first contacts. The position of each first terminal on a first side of the theoretical plane can be symmetric about the theoretical plane with a position of a no-connect terminal on a second side of the theoretical plane opposite from the first side. The position of each first terminal on the second side can be symmetric about the theoretical plane with a position of a no-connect terminal on the first side.

The first, second, third, and fourth sets of contacts can be aligned with the respective fifth, sixth, seventh, and eighth sets of contacts in x and y orthogonal directions parallel to the major surface of the circuit panel. The alignments can be within a distance equal to a minimum pitch between adjacent ones of the contacts. In an exemplary embodiment, the circuit panel can also include at least one bus having a plurality of signal lines configured to carry all of the address information transferred to the contacts of the first and second connection sites. The contacts of the first and second connection sites can be electrically connected with the at least one bus.

In a particular example, the connection site can be a first connection site, the microelectronic package can be a first microelectronic package, and the theoretical plane can be a first theoretical plane. The circuit panel can also include contacts exposed at a second connection site of the major surface and configured to be coupled to terminals exposed at a front surface of a second microelectronic package having a memory storage array. The contacts of the second connection site can include fifth, sixth, seventh, and eighth sets of first contacts. Signal assignments of the fifth set of first contacts can be symmetric about the second theoretical plane with signal assignments of the sixth set of first contacts. Signal assignments of the seventh set of first contacts can be symmetric about the second theoretical plane with signal assignments of the eighth set of first contacts. Each of the fifth, sixth, seventh, and eighth sets of first contacts can be configured to carry identical signals. Each of the fifth, sixth, seventh, and eighth sets of first contacts can be configured to carry address information sufficient to specify a location within the memory storage array of the second microelectronic package.

In one embodiment, the circuit panel can also include a device electrically connected to the first contacts, the device being operable to drive the address information to the first contacts. In one example, the device can be configured to operate in each of first and second modes for connection of the circuit panel with the first type microelectronic package and with the second type microelectronic package, respectively. In a particular embodiment, the circuit panel can be a module card having a second surface opposite the major surface. The circuit panel can also include a plurality of module contacts coupled to the group of the contacts. The module contacts can be configured to carrying information for transfer to and from the group of the contacts. The module contacts can be configured for connection with a component external to the module.

In accordance with another aspect of the invention, a circuit panel can include contacts exposed at a connection site of a major surface of the circuit panel and configured to be coupled to terminals exposed at a front surface of a microelectronic package having a memory storage array. The connection site can define a peripheral boundary on the major surface surrounding a group of the contacts that is configured to be coupled to a single microelectronic package. The group of the contacts can include first and second sets of first contacts. Each of the first and second sets of first contacts can be configured to carry identical signals. Each of the first and second sets of first contacts can be configured to carry address information sufficient to specify a location within the memory storage array. Signal assignments of the first set of first contacts can be symmetric about a theoretical plane normal to the major surface with signal assignments of the second set of first contacts.

The group of the contacts can also include first and second sets of second contacts disposed on respective first and second sides of the theoretical plane. The first set of second contacts can be disposed between the first set of first contacts and a first edge of the peripheral boundary. The second set of second contacts can be disposed between the second set of first contacts and a second edge of the peripheral boundary opposite from the first edge. The first and second sets of second contacts together can be configured to carry data bus and data strobe signals.

In one example, the microelectronic package can be one of a first type microelectronic package or a second type microelectronic package. The terminals of the first type microelectronic package can include first terminals and no-connect terminals configured to be coupled to the first contacts. The terminals of the first type microelectronic package can also include second terminals configured to be coupled to the second contacts. The position of each first terminal on the first side of the theoretical plane can be symmetric about the theoretical plane with a position of a no-connect terminal on the second side. The position of each first terminal on the second side can be symmetric about the theoretical plane with a position of a no-connect terminal on the first side. The terminals of the second type microelectronic package can include first terminals configured to be coupled to the first contacts, and second terminals configured to be coupled to the second contacts. The signal assignments of the first terminals on the first side of the theoretical plane can be a mirror image of the signal assignments of the first terminals on the second side.

In a particular embodiment, a system can include a circuit panel as described above and one or more other electronic components electrically connected to the circuit panel. In an exemplary embodiment, the system can also include a housing, the circuit panel and the one or more other electronic components being assembled with the housing.

In accordance with yet another aspect of the invention, a microelectronic assembly can include a circuit panel having contacts exposed at a connection site of a major surface of the circuit panel. The contacts can include first, second, third, and fourth sets of first contacts. Signal assignments of the first set of first contacts can be symmetric about a theoretical plane normal to the major surface with signal assignments of the second set of first contacts. Signal assignments of the third set of first contacts can be symmetric about the theoretical plane with signal assignments of the fourth set of first contacts. Each of the sets of first contacts can be configured to carry identical signals.

The microelectronic assembly can also include a microelectronic package having a memory storage array and terminals exposed at a front surface of the microelectronic package. The terminals can face and can be coupled to the contacts of the circuit panel so that the front surface of the microelectronic package is normal to the theoretical plane. The terminals can include first terminals coupled to the first and fourth sets of first contacts and no-connect terminals coupled to the second and third sets of first contacts. The position of each first terminal on a first side of the theoretical plane can be symmetric about the theoretical plane with a position of a no-connect terminal on a second side of the theoretical plane opposite from the first side. The position of each first terminal on the second side can be symmetric about the theoretical plane with a position of a no-connect terminal on the first side. Each of the sets of first contacts can be configured to carry address information sufficient to specify a location within the memory storage array.

In one example, the contacts exposed at the connection site can also include first and second sets of second contacts disposed on the respective first and second sides of the theoretical plane. The terminals can also include second terminals coupled to the second contacts and configured to carry at least data signals and data strobe signals. A first portion of the second terminals can be disposed between the first terminals and a first edge of the front surface of the microelectronic package. A second portion of the second terminals can be disposed between the first terminals and a second edge of the microelectronic package opposite from the first edge. The first and second portions together can comprise the data bus and data strobes of the microelectronic package.

In a particular embodiment, the microelectronic package can include a memory storage array implemented in an LPDDR3 configuration. In an exemplary embodiment, the contacts of the circuit panel can be configured to receive the signals necessary to uniquely specify a single storage location within the memory storage array. In a particular example, the contacts of the circuit panel can be configured to receive a majority of the signals necessary to uniquely specify a single storage location within the memory storage array. In one embodiment, the microelectronic package can include one or more semiconductor chips having address inputs exposed at a surface of the at least one semiconductor chip, and conductive structure configured to couple address information received on the terminals to the address inputs.

In one example, the connection site can be a first connection site and the microelectronic package can be a first microelectronic package. The circuit panel can also include contacts exposed at a second connection site of a second surface of the circuit panel opposite the major surface and coupled to terminals exposed at a front surface of a second microelectronic package having a memory storage array. The contacts of the second connection site can include fifth, sixth, seventh, and eighth sets of first contacts. Signal assignments of the fifth set of first contacts can be symmetric about the theoretical plane with signal assignments of the sixth set of first contacts. Signal assignments of the seventh set of first contacts can be symmetric about the theoretical plane with signal assignments of the eighth set of first contacts. Each of the fifth, sixth, seventh, and eighth sets of first contacts can be configured to carry identical signals. Each of the fifth, sixth, seventh, and eighth sets of first contacts can be configured to carry address information sufficient to specify a location within the memory storage array of the second microelectronic package.

In a particular embodiment, the first and second microelectronic packages can each be a first type microelectronic package. The terminals of the second microelectronic package can include first terminals coupled to the sixth and seventh sets of first contacts and no-connect terminals coupled to the fifth and eighth sets of first contacts. The position of each first terminal on the first side of the theoretical plane can be symmetric about the theoretical plane with a position of a no-connect terminal on the second side. The position of each first terminal on the second side can be symmetric about the theoretical plane with a position of a no-connect terminal on the first side. The first, second, third, and fourth sets of contacts can be aligned with the respective fifth, sixth, seventh, and eighth sets of contacts in x and y orthogonal directions parallel to the major surface of the circuit panel. The alignments can be within a distance equal to a minimum pitch between adjacent ones of the contacts.

In an exemplary embodiment, the connection site can be a first connection site, the microelectronic package can be a first microelectronic package, and the theoretical plane can be a first theoretical plane. The circuit panel can also include contacts exposed at a second connection site of the major surface and coupled to terminals exposed at a front surface of a second microelectronic package having a memory storage array. The contacts of the second connection site can include fifth, sixth, seventh, and eighth sets of first contacts. Signal assignments of the fifth set of first contacts can be symmetric about a second theoretical plane normal to the major surface with signal assignments of the sixth set of first contacts. Signal assignments of the seventh set of first contacts can be symmetric about the second theoretical plane with signal assignments of the eighth set of first contacts. Each of the fifth, sixth, seventh, and eighth sets of first contacts can be configured to carry identical signals. Each of the fifth, sixth, seventh, and eighth sets of first contacts can be configured to carry address information sufficient to specify a location within the memory storage array of the second microelectronic package.

In a particular example, the microelectronic assembly can also include at least one bus having a plurality of signal lines configured to carry all of the address information transferred to the microelectronic package. The first contacts can be electrically connected with the at least one bus. In one embodiment, the microelectronic assembly can also include a driving element electrically connected with the at least one bus. In one example, a module can include a plurality of microelectronic assemblies as described above. Each microelectronic assembly can be mounted to and electrically connected with a second circuit panel for transport of signals to and from each microelectronic assembly.

BRIEF DESCRIPTION OF THE DRAWINGS

FIG. 2C is a side sectional view illustrating a component having a first type microelectronic package and a circuit panel according to an embodiment of the invention.

FIG. 2D is a side sectional view illustrating a component having a second type microelectronic package and a circuit panel according to an embodiment of the invention.

FIG. 3C is a perspective view illustrating the module card of FIG. 3A having various potential configurations of terminals.

FIG. 4A is a side sectional view illustrating a component having a package-on-package structure and a circuit panel according to an embodiment of the invention.

FIG. 4B is a side sectional view illustrating a component having a package-on-package structure according to an embodiment of the invention.

FIG. 4C is a side sectional view illustrating a component having a package-on-package structure according to an embodiment of the invention.

FIG. 5A is a side sectional view illustrating a component having a microelectronic package, a TSV stack, and a circuit panel according to an embodiment of the invention.

FIG. 5B is a side sectional view illustrating a component having a microelectronic package and a TSV stack according to an embodiment of the invention.

FIG. 6A is a side sectional view illustrating a microelectronic structure in accordance with an embodiment of the invention.

FIG. 6B is a bottom plan view illustrating a potential arrangement of terminals of the microelectronic structure of FIG. 6A.

FIG. 6C is a bottom plan view illustrating an arrangement of terminals on a microelectronic structure according to another embodiment of the invention.

FIG. 7A is a sectional view illustrating a microelectronic assembly according to an embodiment of the invention.

FIG. 7B is a schematic perspective view illustrating a microelectronic assembly according to an embodiment of the invention.

DETAILED DESCRIPTION

Figure 1:
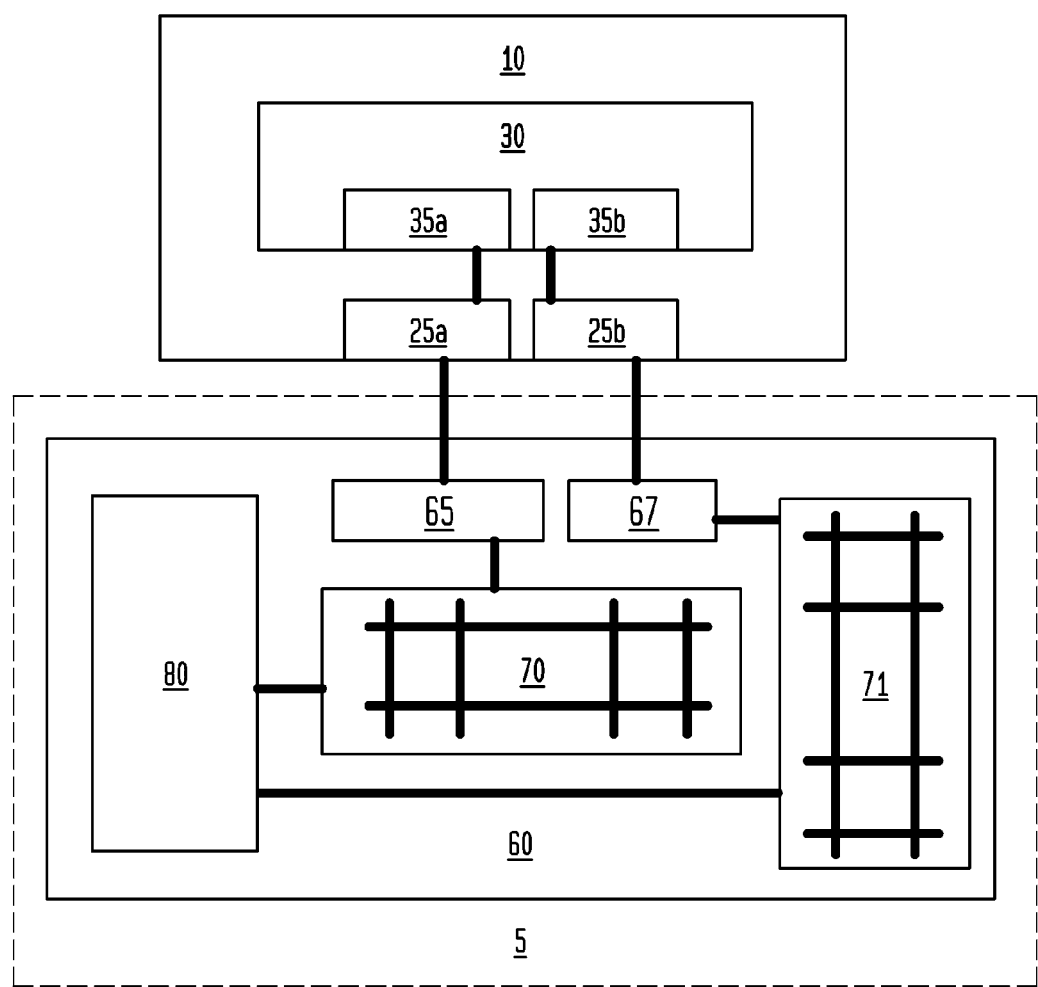
FIG. 1 is a schematic view illustrating a component according to an embodiment of the invention.

A component 5 according to an embodiment of the invention is illustrated in FIG. 1. As seen in FIG. 1, the component 5 is configured to be connected with a microelectronic assembly 10.

The microelectronic assembly 10 includes a set of terminals 25 and a microelectronic element 30 having a memory storage array having a given number of storage locations. The microelectronic element 30 has element contacts 35 including inputs 35$a$ connected with the terminals 25 for receiving command and address information specifying one of the storage locations, and other element contacts 35$b$ for sending and receiving information other than the command and address information (e.g., data information). The microelectronic assembly 10 can take various forms, for example, as described below with reference to FIGS. 2-5.

The microelectronic assembly 10 can include active elements, e.g., active devices such as transistors, or other active elements thereon, which, with or without additional elements, define a memory storage array. In one example, the active elements and the memory storage array defined by the active elements can be incorporated in a portion of a microelectronic element 30, or in one or more microelectronic elements, e.g., one or more semiconductor chips, of the microelectronic assembly 10, or may be incorporated in one or more microelectronic packages of the microelectronic assembly.

Without limitation, in one example, the microelectronic assembly 10 may be, for example, a microelectronic package or portion thereof wherein the terminals 25 are exposed at a surface of the microelectronic package. In another example, the microelectronic assembly can include a plurality of electrically connected microelectronic packages or a structure that includes electrically connected microelectronic elements, semiconductor chips, or portions of microelectronic elements or semiconductor chips, or portions of microelectronic packages.

As used herein, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

In one example, the memory storage array of the one or more microelectronic elements 30 comprises a functional part of the microelectronic assembly 10 whose role may be subservient to another functional part of the microelectronic assembly. For example, the microelectronic assembly 10 may include a logic functional part, e.g., processor, and a memory functional part, and the memory functional part may assist with or help serve a function of the logic functional part. However, in a particular example, the microelectronic assembly 10 may be configured to predominantly provide memory storage array function. In the latter case, the microelectronic assembly 10 may have a greater number of active elements, e.g., active devices such as transistors, configured to provide memory storage array function than the number of active elements in other components of the microelectronic assembly that are configured to provide function other than memory storage array function.

In one example, the microelectronic assembly 10 may contain wiring therein that directly electrically couples a set of the terminals 25, e.g., "first terminals" 25a, with corresponding address inputs 35a of the microelectronic element 30. As used herein, each "first terminal" 25a has a signal assignment on the microelectronic assembly 10 that includes one or more of the address inputs 35a. In another example, as further described below, the microelectronic assembly 10 may include a buffer element, such as a semiconductor chip having a plurality of active elements thereon, such semiconductor chip being configured to at least one of regenerate, or partially or fully decode at least one of address or command information received at the terminals 25 for transfer by the microelectronic structure to the address inputs. Command information may be information that controls an operating mode of a memory storage array or portion thereof within the microelectronic assembly 10.

The microelectronic assembly 10 is configured to provide address information received at the first terminals 25a to the address inputs 35a of the one or more microelectronic elements 30. As used herein in the context of address information or command address bus information or signals and the address inputs of a microelectronic element or portion thereof, a statement that address information on terminals is "provided to address inputs" means that the address information on the terminals is transferred to the address inputs via electrical connections therewith, or through a buffer element which may perform at least one of regenerating, partially decoding or decoding of the address information received at the terminals.

In one type of such microelectronic element 30, each one of some contacts of the address inputs 35a may be configured to receive particular address information of the address information supplied to the microelectronic element. In a particular embodiment, each of such contacts may be an address input 35a configured to receive address information, supplied to the microelectronic element 30 from outside the microelectronic element, i.e., through wiring of the microelectronic package 10 such as wire bonds, and through the first terminals 25a. Contacts of the microelectronic elements 30 may also be configured to receive other information or signals from outside the microelectronic element.

For example, when the microelectronic element 30 includes or is a DRAM semiconductor chip, the first terminals 25a can be configured to carry address information transferred to the microelectronic assembly 10 that is usable by circuitry within the microelectronic assembly, e.g., row address and column address decoders, and bank selection circuitry, if present, to determine an addressable memory location from among all the available addressable memory locations of a memory storage array within a microelectronic element in the microelectronic assembly. In a particular embodiment, the first terminals 25a can be configured to carry all the address information used by such circuitry within the microelectronic assembly 10 to determine an addressable memory location within such memory storage array. Each of the first terminals 25a can be configured to carry address information sufficient to specify a location within the memory storage array of the microelectronic assembly 10.

Typically, when the microelectronic element 30 in the microelectronic assembly 10 is or includes a DRAM chip, the address information in one embodiment can include all address information transferred to the microelectronic assembly from a component external to the microelectronic structure, e.g., the component 5, which is used for determining a random access addressable memory location within the microelectronic assembly for read access thereto, or for either read or write access thereto.

In a particular embodiment, the first terminals 25a can be configured to carry information that controls an operating mode of one or more of the microelectronic elements 30. More specifically, the first terminals 25a can be configured to carry all of a particular set of command signals and/or clock signals transferred to the microelectronic assembly 10. In one embodiment, the first terminals 25a can be configured to carry all of the command signals, address signals, bank address signals, and clock signals transferred to the assembly 10 from an external component, e.g., the component 5, wherein the command signals include row address strobe, column address strobe and write enable.

In an embodiment in which one or more of the microelectronic elements 30 are configured to provide dynamic memory storage array function, such as provided by a dynamic random access memory ("DRAM") semiconductor chip, or an assembly of DRAM chips, the command signals can be write enable, row address strobe, and column address strobe signals. Other signals such as ODT (on die termination), chip select, clock enable, may or may not be carried by the first terminals 25a. The clock signals can be clocks used by one or more of the microelectronic elements for sampling the address signals.

In addition to the first terminals 25a, the terminals (or the terminals in any of the other embodiments described herein) can also include second terminals 25b that are configured to carry (send and/or receive) information other than the command and address information, such as data signals. At least some of the second terminals 25b can be configured to carry signals other than the address signals that are carried by the first terminals 25a. In particular examples, the second terminals 25b may carry one or more of data, data strobe signals, or other signals or reference potentials such as chip select, reset, power supply voltages, e.g., Vdd, Vddq, and ground, e.g., Vss and Vssq. The second terminals 25b may be electrically connected with the other element contacts 35b for sending and receiving information other than the command and address information.

In one example, the second terminals 25b can include terminals used for carrying uni-directional or bi-directional data signals to and or from the microelectronic elements 30, and data strobe signals, as well as data masks and ODT or "on die termination" signals used to turn on or off parallel terminations to termination resistors. In particular examples, the second terminals 25b may carry signals such as reset, as well as reference potentials such as power supply voltages, e.g., Vdd, Vddq, or ground, e.g., Vss and Vssq.

In one particular example of such microelectronic element 30, the command and address information present at the element contacts 35a can be sampled relative to an edge of a clock used by the respective microelectronic element, i.e., upon on a transition of the clock between first and second different voltage states. That is, each command and address signal can be sampled upon a rising transition between a lower voltage state and a higher voltage state of the clock, or upon a falling transition between a higher voltage state and a lower voltage state of the clock. Thus, the plurality of command and address signals may all be sampled upon the rising transition of the clock, or such command and address signals may all be sampled upon the falling transition of the clock, or in another example, the command or address signal at one of the element contacts 35a can be sampled upon the rising transition of the clock and the command or address signal at one other external contact can be sampled upon the falling transition of the clock.

In another type of microelectronic element 30, which may be configured to predominantly provide memory storage array function, one or more of the command or address contacts 35a thereon can be used in a multiplexed manner. In this example, a particular element contact 35a of the respective microelectronic element 30 can receive two or more different signals supplied to the microelectronic element from the outside. Thus, a first command or address signal can be sampled at the particular contact 35a upon a first transition of the clock between the first and second different voltage states (e.g., a rising transition), and a signal other than the first command or address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 35a of the respective microelectronic element 30. In a particular case, multiplexing in this manner can allow a first address command or address signal and a different signal to be received in the same clock cycle on the same element contact 35a of the respective microelectronic element 30. In yet another example, multiplexing in this manner can allow a first command or address signal and a second different command or address signal to be received in the same clock cycle on the same element contact 35a of the respective microelectronic element 30.

In one example, the operational parameters may pertain to timing such as the number of clock cycles of latency after the row address strobe signal is detected in an enabled state by circuitry of the microelectronic assembly 10 (hereinafter, "RAS latency"), or may pertain to the number of clock cycles of latency after the column address strobe signal is detected in an enabled state by circuitry of the microelectronic assembly, or may pertain to the capacity of the microelectronic assembly, e.g., such as one gigabit ("1 Gb"), two gigabit ("2 Gb"), etc., or may pertain to the organization of the microelectronic assembly, such as a "single-rank", "2-rank", "4-rank" or other structure, etc., or other operating parameter, or a combination of the foregoing operational parameters, or other operating parameter. In one example, the nonvolatile memory may store information of a single one of the aforementioned parameters or may store information of any combination of the operational parameters, without limitation. In a particular example, the nonvolatile memory may contain a table of known bad memory locations within the memory storage array of the microelectronic assembly 10 which should be avoided during read or write access to the memory storage array.

The component 5 includes a support structure 60 (e.g., a circuit panel) bearing a first set of conductors 70 configured to carry the command and address information. The support structure 60 can take many different forms, such as a circuit panel 160 (FIG. 2A), a module card 160b (FIG. 2B), an interconnection substrate 342 (FIG. 4B), a molded region 348 (FIG. 4C), a microelectronic element 440 (FIG. 5B), or a dielectric layer overlying a microelectronic element (not shown), among others.

The component 5 also includes a plurality of first contacts 65 coupled to the set of conductors 70 and configured for connection with corresponding ones of the terminals 25 of the microelectronic assembly 10. The first set of conductors 70 can include at least one bus having a plurality of signal lines configured to carry all of the address information transferred to the first contacts 65. The first contacts 65 can be electrically connected with the at least one bus of the first set of conductors 70.

The connection between the contacts 65 of the component 5 and the terminals 25 of the microelectronic assembly 10 can take various forms, for example, as described below with reference to FIGS. 2-5. The contacts 65 have a plurality of predetermined arrangements of address and command information assignments, so that the contacts can be connected with terminals 25 of a microelectronic assembly 10 having one or more microelectronic elements 30 of a plurality of types (e.g., DDRx, GDDRx, LPDDRx, etc.).

The contacts 65 are arranged according to a first predetermined arrangement for connection with a first type of the microelectronic assembly 10 in which the one or more microelectronic elements 30 are configured to sample the command and address information coupled thereto through a first subset of the contacts including a first number of the contacts (which may be some or all of the contacts) at a first sampling rate (e.g., DDR3 or DDR4). The same contacts 65 are arranged according to a second predetermined arrangement for connection with a second type of microelectronic assembly 10 in which the one or more microelectronic elements 30 are configured to sample the command and address information coupled thereto through a second subset of the contacts including a second number of the contacts fewer than the first number at a second sampling rate being greater than the first sampling rate (e.g., LPDDR3). The first and second subsets of the contacts 65 include some contacts occupying identical positions. The contacts 65 that can be arranged according to two different predetermined arrangements for connection with two different types of the microelectronic assembly 10, respectively, are also referred to herein as "co-support contacts."

In a particular embodiment, the second sampling rate can be an integer multiple of the first sampling rate. For example, the component 5 may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate, such as once per clock cycle (e.g., on the rising edge of the clock cycle). In this same example, the component 5 may be configured such that when a second type of the microelectronic assembly 10 having LPDDR3 memory therein is attached to the component, the microelectronic elements 30 in the microelectronic assembly can be configured to sample the command and address information coupled thereto through a second number of the contacts 65 at a second sampling rate, such as twice per clock cycle (e.g., once each on the rising edge and falling edge of the clock cycle). Therefore, in this example, the second sampling rate is an integer multiple (2) of the first sampling rate.

In another embodiment where the second sampling rate is an integer multiple of the first sampling rate, the component may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate of once per clock cycle. In this same example, the component 5 may be configured such that when a second type of the microelectronic assembly 10 having a different type of memory therein is attached to the component, the microelectronic elements 30 in the microelectronic assembly can be configured to sample the command and address information coupled thereto through a second number of the contacts 65 at a second sampling rate of four times per clock cycle (e.g., once each on every quarter of the clock cycle). Therefore, in this example, the second sampling rate is also an integer multiple (4) of the first sampling rate.

In yet another embodiment, the second sampling rate can be a non-integer multiple of the first sampling rate. For example, the component 5 may be configured such that when a first type of the microelectronic assembly 10 having memory therein is attached to the component, the microelectronic elements 30 in the microelectronic assembly can be configured to sample the command and address information coupled thereto through a first number of the contacts 65 at a first sampling rate of four times per clock cycle (e.g., once each on every quarter of the clock cycle). In this same example, the component 5 may be configured such that when a second type of the microelectronic assembly 10 having memory therein is attached to the component, the microelectronic elements 30 in the microelectronic assembly can be configured to sample the command and address information coupled thereto through a second number of the contacts 65 at a second sampling rate of six times per clock cycle (e.g., once each on every sixth of the clock cycle). Therefore, in this example, the second sampling rate is a non-integer multiple (1.5) of the first sampling rate.

In another embodiment where the second sampling rate is a non-integer multiple of the first sampling rate, such a non-integer relationship between the first and second sampling rates can occur when sampling of the command and address information by the microelectronic elements 30 is only performed during some clock cycles but not other clock cycles. For example, the component 5 may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate of one time every other clock cycle. In this same example, the component 5 may be configured such that when a second type of the microelectronic assembly 10 having another type of memory therein is attached to the component, the microelectronic elements 30 in the microelectronic assembly can be configured to sample the command and address information coupled thereto through a second number of the contacts 65 at a second sampling rate of two times every third clock cycle (e.g., once each on the rising edge and falling edge of every third clock cycle). Therefore, in this example, the second sampling rate is a non-integer multiple (1.5) of the first sampling rate.

Besides the specific examples described above, the invention contemplates many other integer and non-integer multiple relationships between the second sampling rate and the first sampling rate, in examples where sampling of the command and address information by the microelectronic elements 30 is performed during every clock cycle, and in examples where sampling of the command and address information by the microelectronic elements is only performed during some clock cycles but not other clock cycles.

In one example, the same predetermined arrangement of contacts 65 of the component 5 can be used to connect with first type microelectronic assemblies 10 that include microelectronic elements which operate according to the industry standard DDR3 or DDR4 specification, or to connect with second type microelectronic structures that include microelectronic elements compliant with the industry standard LPDDR3 specification.

In an examples shown herein, in the second type of microelectronic assembly 10, which samples command and address information using fewer contacts 60 than the first type, some of the terminals 25 can be no-connect terminals that may not be needed to transfer address information to the address inputs 35a of one or more memory storage arrays in the microelectronic assembly 10.

As used herein, a "no-connect terminal" of a microelectronic assembly means a terminal that is not connected in any electrical path, e.g., path for conducting information to any microelectronic element 30, e.g., semiconductor chip, within the microelectronic assembly 10, whether or not there is ever any information present on such no-connect terminal. Thus, even if information may be present on a no-connect terminal such as may be coupled thereto from the component 5 that is connected to the no-connect terminal, the information present on the no-connect terminal is not in any path to be provided to any microelectronic element 30 within the microelectronic assembly 10.

In any of the embodiments herein, in addition to the first contacts 65, the component 5 can also include a plurality of second contacts 67 coupled to a second set of conductors 71 and configured for connection with corresponding ones of the second terminals 25*b* of the microelectronic assembly 10. The second contacts 67 can be configured for connection with corresponding second terminals 25*b* of the microelectronic assembly 10, the second contacts being configured to carry information other than the command and address information, such as data signals. The second set of conductors 71 can have at least one second bus that is electrically connected with at least some of the second contacts 67. Such a second bus can have a plurality of signal lines configured to carry information other than the address and command information.

The component 5 can also include a device 80 coupled to the set of conductors, the device operable to drive the command and address information to the contacts. In one example, the device 80 can be a driving element electrically connected to the set of conductors 70. The device 80 can be, for example, a microprocessor or a direct memory access controller ("DMA controller"). In a particular embodiment, the device 80 can be a buffering element, or a protocol converter that is configured to convert address information having a first protocol that can be used by the component 5 to a second protocol that can be used by the particular type of microelectronic element 30 in the microelectronic assembly 10. The device 80 can be configured to operate in each of first and second modes for connection of the component 5 with the first type microelectronic assembly 10 via the first arrangement of address and command information assignments, and with the second type microelectronic assembly via the second arrangement of address and command information assignments, respectively.

In a particular example, the device 80 can be at least one central processing unit ("CPU"), the CPU configured to control operations of a plurality of components in the system including read operations from the microelectronic assembly 10 and write operations to the microelectronic assembly. The component 5 may include more than one device 80, including both a direct memory access controller and a CPU, for example. In one embodiment, the component 5 can further include a power supply configured to supply power for use by the component and the microelectronic assembly 10.

Although FIG. 1 shows only a single microelectronic assembly 10 electrically connected with the component 5, in other embodiments, a plurality of microelectronic assemblies can be electrically connected with the component.

Figure 2A:
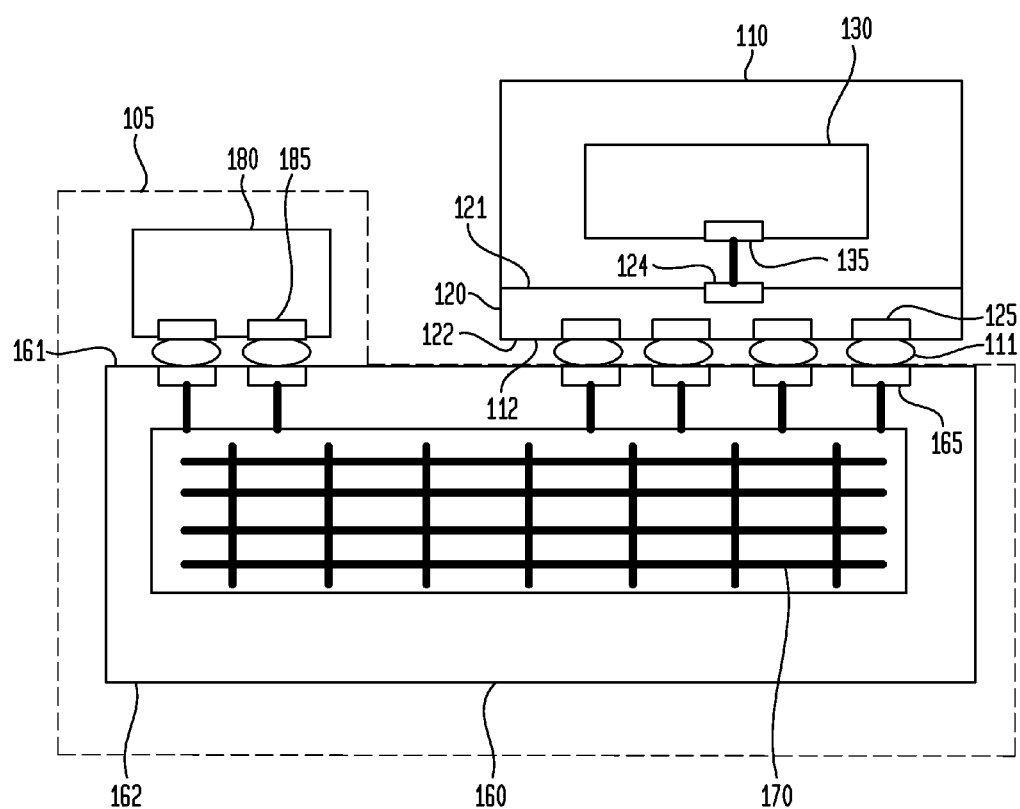
FIG. 2A is a side sectional view illustrating a component having a microelectronic package and a circuit panel according to an embodiment of the invention.

FIG. 2A illustrates a component 105 according to a particular example of the invention shown in FIG. 1. As seen in FIG. 2A, the component 105 includes a circuit panel 160, and the contacts 165 are exposed at a first surface 161 of the circuit panel. The circuit panel 160 (and the circuit panel in other embodiments described herein) can be of various types, such as a printed circuit board used in a dual-inline memory module ("DIMM") module, a circuit board or panel to be connected with other components in a system, or a motherboard, among others.

The microelectronic assembly joined to the circuit panel 160 is in the form of a microelectronic package 110. The microelectronic package 110 has one or more microelectronic elements 130 therein having a surface facing a first surface 121 of a package substrate 120. The microelectronic element 130 has address inputs 135 electrically connected to terminals 125 exposed at a second surface 122 of the substrate 120 opposite the first surface 121. The second surface 122 is an exposed surface of the microelectronic package 110. The terminals 125 can be surface mount terminals (e.g., of type BGA, LGA, PGA, etc.).

Although FIG. 2A shows only a single microelectronic package 110 electrically connected with the component 105, in other embodiments, a plurality of microelectronic packages can be electrically connected with the component. In such embodiments, all of the microelectronic packages 110 can be attached to the first surface 161 of the circuit panel 160, all of the microelectronic packages can be attached to the second surface 162 of the circuit panel, or one or more microelectronic packages can be attached to the first surface of the circuit panel and one or more microelectronic packages can be attached to the second surface.

The microelectronic package 110 may have a plurality of address inputs 135 for receipt of address information specifying locations within the memory storage array. Thus, the address inputs 135 may be contacts exposed at a surface of a microelectronic element 130 as described above. The microelectronic package 110 is configured so as to transfer address information received at particular terminals 125 of the microelectronic structure to the address inputs 135. For example, the microelectronic package 110 may couple signals received on particular terminals 125 of the structure to corresponding particular address inputs 135.

In a particular example, the address inputs 135 can be exposed at a face of a microelectronic element 130, e.g., a semiconductor chip, wherein the face faces towards the first surface 121 of the substrate 120. In another example, the address inputs 135 can be exposed at a face of a microelectronic element 130 that faces away from the first surface 121. In some cases, when the address inputs 135 are exposed at a face of the microelectronic element 130 that faces away from the first surface 121, a die attach adhesive may be disposed between a rear face of the microelectronic element and the first surface 121 of the substrate 120, which may mechanically reinforce the connection between the microelectronic element and the substrate.

As further seen in the particular example in FIG. 2A, a microelectronic element 130 incorporated in the microelectronic assembly 110 may have element contacts 135 at a face thereof that are electrically connected to respective substrate contacts 124 at the first surface 121 or the second surface 122 of the substrate 120. In one example, the microelectronic element 130 can be flip-chip bonded to the substrate 120 via conductive joining elements extending between element contacts 135 of the microelectronic element and corresponding substrate contacts 124 at the first surface 121 of the substrate 120.

In another example, wire bonds may extend through openings in the substrate 120 and may electrically connect the element contacts 135 with substrate contacts at the second surface 122 of the substrate. Alternatively, other types of conductors, e.g., portions of a lead frame, flexible ribbon bonds, etc., may be used to electrically connect the element contacts 135 with the respective substrate contacts 124, which in some cases may connect the element contacts with other conductive elements disposed at a greater height from the front surface 121 than the front face of the microelectronic element 130.

In some embodiments, the contacts 135 may in some cases be connected with active devices of the semiconductor chip 130 through back end of line ("BEOL") wiring of the semiconductor which may include vias or other electrically conductive structure and which may in some cases be disposed underneath the contacts 135.

The terminals 125 (and any of the other terminals described herein) can be electrically conductive elements, e.g., contacts, pads, posts, pins, sockets, wiring, or other electrically conductive structure that are exposed at a first surface 112 of the microelectronic package 110, which in the example shown in FIG. 2A, is the same surface as the second surface 122 of the substrate 120.

In some cases, the terminals 125 can be configured to be conductively bonded to corresponding contacts 165 of another element such as the circuit panel 160, such as with a conductive joining element 111. The conductive joining elements 111 may include a bond metal of a fusible conductive material such as solder, tin, indium, gold, a eutectic material, an electrically conductive matrix material containing metal and polymeric material, among others, or other conductive bond material, and may in some cases also include additional structure such as a conductive bump attached to conductive structure of the substrate 120 such as conductive pads or posts. In other cases, the terminals 125 can be configured to mechanically and electrically engage corresponding features of the circuit panel 160, such as by a pressure or interference fit between corresponding conductive elements of each component, which in some cases, may slide or wipe relative to corresponding conductive surfaces they engage. The terminals 125 can be electrically connected with the substrate contacts 124 through electrically conductive structure on the substrate 120, such as traces and vias, for example.

As shown in FIG. 2A, electrically conductive joining units 111 (e.g., solder balls) can extend between all of the terminals 125 of the microelectronic assembly and corresponding circuit panel contacts 165. However, in an embodiment in which some of the terminals 125 of the microelectric assembly 110 are no-connect terminals (e.g., when the microelectronic element is of the second type, such as LPDDR3), such no-connect terminals may be connected to corresponding circuit panel contacts 65 while not being connected within the microelectronic assembly 110 in any electrical path for conductive information to a microelectronic element 130 within the microelectronic assembly.

In some embodiments, the substrate 120 (or any of the other package substrates described herein) and/or the circuit panel 160 (or any of the other circuit panels described herein) shown in FIG. 2A can include a sheet-like or board-like dielectric element, which may consist essentially of polymeric material, e.g., a resin or polyimide, among others. Alternatively, the substrate 120 and/or the circuit panel 160 can include a dielectric element having a composite construction such as glass-reinforced epoxy, e.g., of BT resin or FR-4 construction. In some examples, the dielectric element of the substrate 120 and/or the circuit panel 160 can have a coefficient of thermal expansion in the plane of the dielectric element, i.e., in a direction parallel to a first surface 110 thereof, of up to 30 parts per million per degree Celsius (hereinafter, "ppm/° C.").

In another example, the substrate 120 can include a supporting element of material having a coefficient of thermal expansion ("CTE") of less than 12 parts per million per degree Celsius, on which the terminals 125 and other conductive structure can be disposed. For example, such low-CTE element can consist essentially of glass, ceramic, or semiconductor material or liquid crystal polymer material, or a combination of such materials.

In one example, the set of conductors 170 can include at least one bus that can extend in a first direction X parallel to the first surface 161 of the circuit panel 160. In a particular example, the at least one bus of the set of conductors 170 can extend in a second direction Y parallel to the first surface 160 of the circuit panel 160, the second direction being transverse to the first direction X. In some embodiments, the signal lines of the busses of the set of conductors 170 can be located in the same plane as one another, and each individual signal line can include conductor portions extending in a plurality of planes and in a plurality of directions.

The at least one bus of the set of conductors 170 can have a plurality of signal lines configured to carry all of the address information transferred to the contacts 165 of the circuit panel 160. The contacts 165 can be electrically connected with the at least one bus of the set of conductors 170. In one example, the at least one bus of the set of conductors 170 can be configured to carry all of the command signals transferred to the contacts 165, the command signals including write enable, row address strobe, and column address strobe signals.

The circuit panel 160 can optionally include one or more termination resistors, which can be connected to a terminal voltage source. One or more of the plurality of signal lines of one or more of the busses of the set of conductors 170 can optionally be electrically connected to a termination resistor.

The contacts 165 shown in FIG. 2A can be arranged according to a predetermined arrangement that defines relative positions on the first surface 161 of the circuit panel 160 (or the second surface 162 if the contacts 165 are exposed at the second surface) of contacts carrying address and command information and data.

The circuit panel 160 can be usable without requiring alteration thereof in first and second modes, each mode being when a given set of the contacts 165 is connected with terminals of a corresponding type of microelectronic package 110. For example, a component 105 can include a circuit panel 160 and a first type microelectronic package 110 having first terminals 125 joined to first contacts 165 of the circuit panel. In another example, a component 5 can include a circuit panel 160 and a second type microelectronic package 110 having first terminals 125 joined to first contacts 165 of the circuit panel.

For example, in the first mode, the circuit panel 160 can be coupled to a first type of microelectronic package 110 that is operable to sample the address and command information carried by the first contacts 165 once per clock cycle. Such microelectronic packages may be of type DDR3 or DDR4 for example, or of type GDDR3, GDDR4 or GDDR5.

There is a progression of standards relating to double data rate DRAM memory and low power double data rate DRAM, and graphics double data rate DRAM memory that are expected to continue in the future for some time to come. The present and future standards starting with the DDR3 standard, the LPDDR3 standard and the GDDR3 standard are referred to herein collectively as "DDRx", "LPDDRx" and "GDDRx," respectively.

In a particular example, in the second mode, the circuit panel 160 can be coupled to a second type of microelectronic package 110 that is operable to sample the address and command information carried by the first contacts 165 twice per clock cycle. Such microelectronic packages 110 may be of type LPDDRx, e.g., LPDDR3 or LPDDR4 among existing and planned standards.

In one embodiment, circuit panel 160 can be coupled to a first type of microelectronic package 110 using a first subset of the first contacts 165, and the same circuit panel can be coupled to a second type of microelectronic package using a second subset of the first contacts, the second subset having a fewer number of contacts than the first subset. In such an embodiment, the first type of microelectronic package 110 can be is operable to sample the address and command information carried by the first subset of the first contacts 165 the same number of times per clock cycle (e.g., once per clock cycle) as the second type of microelectronic package 110 can be operable to sample the address and command information carried by the second subset of the first contacts.

In this embodiment, the first type of microelectronic package 110 can have microelectronic elements of type DDR4, and the second type of microelectronic package can have microelectronic elements of type DDR3. The first subset of the first contacts 165 can include some contacts configured to carry command and address information that is not carried by the second subset of the first contacts, such as, for example, ALERT_N (an I/O signal that can be an output used to signal a parity error), BG (bank group signals), a parity bit input to the chip PAR, sampled just like any other command-address signal, ACT input, and DRAM, which checks the parity based on the information received by the chip, which includes the address information, the PAR bit, and the command info received (i.e., RAS, CAS, ACT (activate an active low signal)). Furthermore, although there are fewer contacts in the second subset of first contacts 165 than in the first subset, the second subset of first contacts can include three bank address signals (for use with DDR3 microelectronic elements), while the first subset of the first contacts can include two bank address signals (for use with DDR4 microelectronic elements).

In a particular embodiment, the one or more microelectronic elements 130 in the first type microelectronic package can incorporate a different type of memory storage array than the one or more microelectronic elements in the second type microelectronic package. In another example, the circuit panel 160 can be coupled to another type of microelectronic package 110 that is operable to sample the address and command information carried by the first contacts 165 four times per clock cycle.

In the embodiment of FIG. 2A, in one example, such as when a first type microelectronic package 110 includes a plurality of microelectronic elements 130, all of the microelectronic elements of the first type microelectronic package can be configured to connect with the same set of conductors 170 that is configured to carry a single set of command-address signals. In such an embodiment, the component 105 may be configured such that when a first type of the microelectronic package 100 having DDR3 or DDR4 memory therein is attached to the component, the microelectronic elements 130 in the microelectronic package can be configured to sample the command and address information coupled thereto through a first number of the contacts 165 at a first sampling rate, such as once per clock cycle (e.g., on the rising edge of the clock cycle).

In the embodiment of FIG. 2A, in another example, such as when a second type microelectronic package 110 includes a plurality of microelectronic elements 130, a first group of first contacts 165 can be connected to a first command-address signal bus of the set of conductors 170, which can be connected to a first half of the microelectronic elements, and a second group of contacts 165 can be connected to a second command-address signal bus of the set of conductors, which can be connected to a second half of the microelectronic elements. The component 105 may be configured such that when a second type of the microelectronic package 110 having LPDDR3 memory therein is attached to the component, the microelectronic elements 30 in the microelectronic package can be configured to sample the command and address information coupled thereto through a second number of the contacts 165 at a second sampling rate, such as twice per clock cycle (e.g., once each on the rising edge and falling edge of the clock cycle).

For example, a second type microelectronic package 110 can include a plurality of microelectronic elements 130, a first half of the microelectronic elements being configured to connect with the first contacts 165 in a first group of first contacts but not with a second group of first contacts, and a second half of the microelectronic elements being configured to connect with the first contacts in the second group of first contacts but not with the first group of first contacts. In such an embodiment, the set of conductors 170 can be configured to carry two identical sets of command-address signals, such that each half of the microelectronic elements 130 can be connected to one of the two sets of command-address signals of the set of conductors. An advantage of the invention is that the physical arrangement of the conductors 170 can be unchanged irrespective of the type of microelectronic package 110 that is electrically connected thereto.

It is not required that all of the set of conductors 170 be used to carry signals. For example, in one embodiment where the set of conductors 170 is configured to carry two identical sets of command-address signals, when the conductors are electrically connected to a microelectronic package 110, it is not necessary that all of the conductors carry signals to the microelectronic package. Even when the set of conductors 170 is configured to carry two identical sets of command-address signals, it is possible for the microelectronic assembly to not use some or all of the conductors configured to carry the duplicate set of command-address signals, in order to reduce the number of switching signals being carried by the set of conductors 170 to reduce power dissipation.

In a particular example, a second type microelectronic package 110 can include a single microelectronic element that is connected with the first contacts 165 in a first group of first contacts but not with a second group of first contacts, such that the single microelectronic element is connected with a first command-address signal bus of the set of conductors 170 but not with a second command-address signal bus of the set of conductors.

The component 105 can also include a device 180 coupled to the set of conductors 170, the device operable to drive the command and address information to the contacts 165. The device 180 can be configured to operate in each of first and second modes for connection of the component 105 with the first type microelectronic assembly 110 via the first arrangement of address and command information assignments, and with the second type microelectronic assembly via the second arrangement of address and command information assignments, respectively, without alteration of the physical configuration of the conductors 170.

Figure 2B:
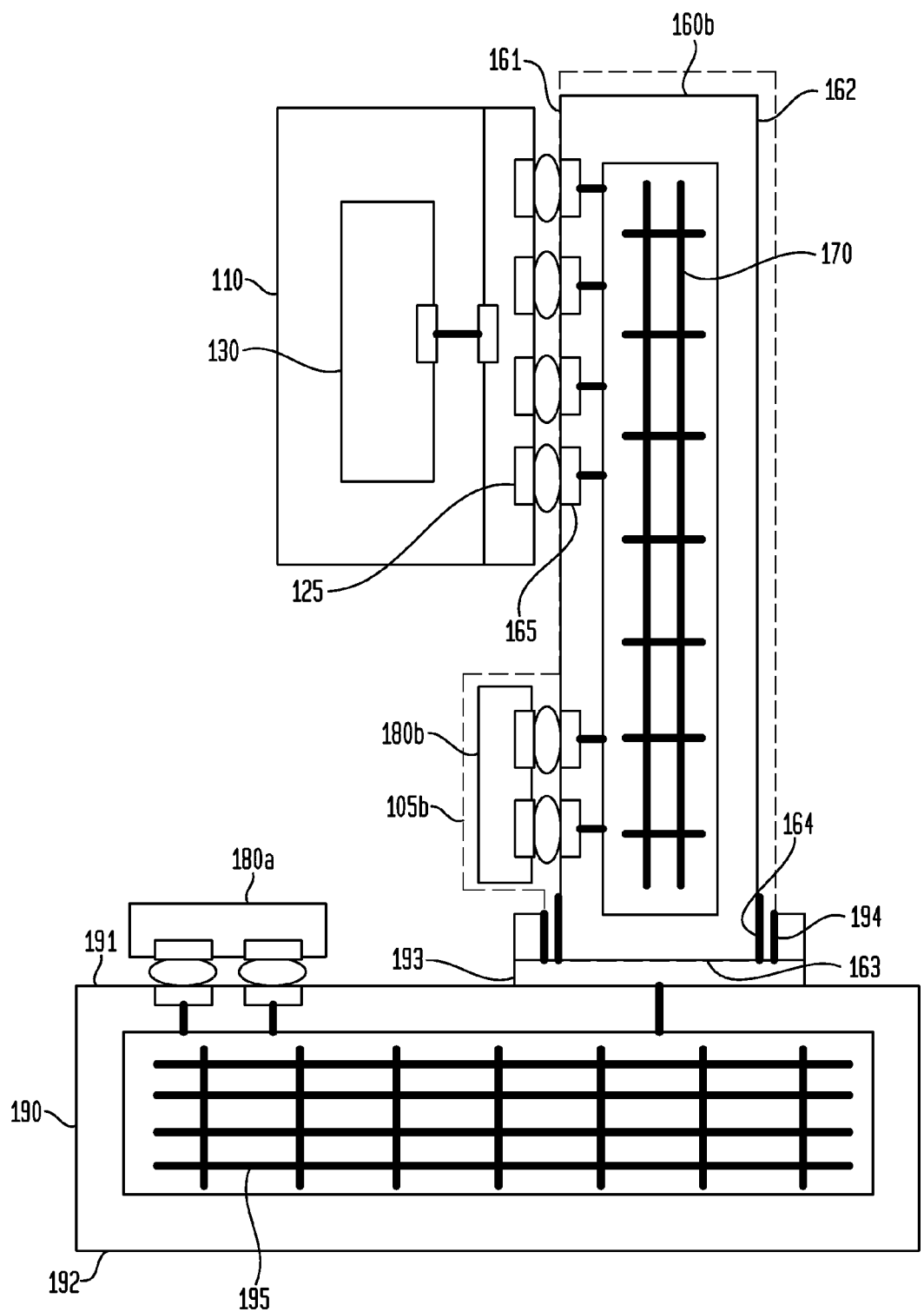
FIG. 2B is a side sectional view illustrating a component having a microelectronic package and a module card according to an embodiment of the invention.

FIG. 2B illustrates a component 105b according to a variation of the invention shown in FIG. 2A. As seen in FIG. 2B, the component 105b includes a circuit panel 160b having at least one row of exposed contacts 164 adjacent an edge 163 of the circuit panel. The exposed contacts 164 can be configured in one or more parallel rows, for example, and the exposed contacts can be configured in any of the ways described below with reference to FIGS. 3A-3C. The component 105b can be coupled to a second circuit panel 190 by inserting the edge 163 into a corresponding socket 193 of the second circuit panel. The component 105b can be coupled to the circuit panel 190 in any of the ways described below with reference to FIGS. 3A-3C.

The second circuit panel 190 can include a device 180a coupled to a set of conductors 195 of the second circuit panel, the device operable to drive the command and address information to the contacts 165 of the circuit panel 160b. The component 105b can include a device 180b coupled to the set of conductors. In one example, the device 180b can be a buffering element, or a protocol converter that is configured to convert address information having a first protocol that can be used by the component 5 or the circuit panel 190 to a second protocol that can be used by the particular type of microelectronic element 130 in the microelectronic assembly 110.

One or both of the devices 180a and 180b can be configured to operate in each of first and second modes for connection of the component 105 with the first type microelectronic assembly 110 via the first arrangement of address and command information assignments, and with the second type microelectronic assembly via the second arrangement of address and command information assignments, respectively.

The circuit panel shown in any of the embodiments of described herein (e.g., the circuit panel 160c of FIGS. 2C and 2D) can be a first circuit panel such as the circuit panel 160b having a connector interface for electrical connection with a second circuit panel such as the circuit panel 190, the connector interface being configured to carrying information for transfer to and from the contacts 165. A particular example of such an arrangement is shown in FIG. 9, where a plurality of components 906, each of which can include a circuit panel 160b, are shown coupled to a second circuit panel 602 via a respective connector interface.

Figure 9:
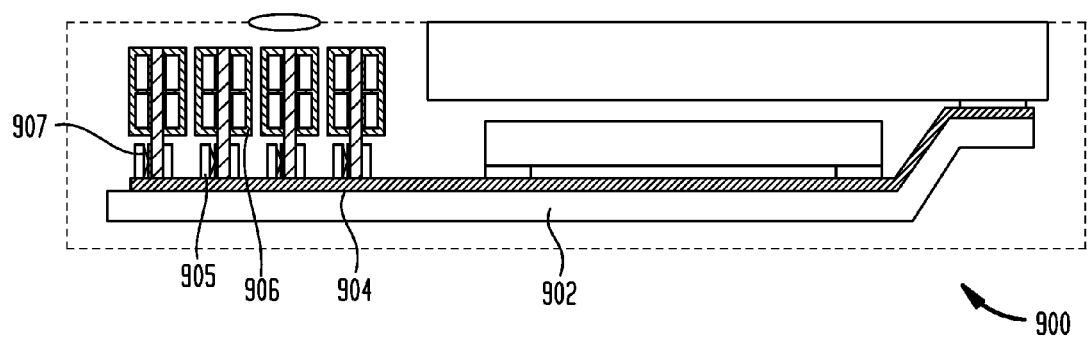
FIG. 9 is a schematic sectional view illustrating a system according to an embodiment of the invention.

In the example shown in FIG. 9, the connector interface can include a socket 905 having a plurality of contacts 907 at one or both sides of the socket, the socket being configured to receive a circuit panel such as the circuit panel 160b having corresponding exposed edge contacts disposed at at least one edge 163 of the circuit panel. In other embodiments, the connector interface between the circuit panel 160c and the second circuit panel 190 can be of the types shown in FIGS. 3A and 3B, or, surface mount connections (e.g., BGA, LGA, PGA, etc.).

FIG. 2C illustrates a component 105c including a circuit panel 160c that is configured for coupling to one or more microelectronic packages 110c. The circuit panel 160c shown in FIGS. 2C and 2D is the same circuit panel, and each of the FIGS. 2C and 2D shows a component 105c including the circuit panel 160c coupled to a different respective microelectronic assembly 110c or 110d.

As can be seen in FIG. 2C, the circuit panel 160c can define first and second surfaces 161, 162. The circuit panel 160c can have at least one set of contacts 168 exposed at the first surface 161 for connection with corresponding surface mount terminals 125 and 127 (e.g., of type BGA, LGA, etc.) of a microelectronic package 110c that incorporates one or more microelectronic elements 131 having a memory storage array.

The circuit panel 160c can have a plurality of sets of contacts 165 and 167, each set 168 of the contacts 165, 167 being configured for connection to a single microelectronic package 110c. The contacts in each set 168 can include first contacts 165 for carrying address and command information and second contacts 167 for carrying information other than the command and address information (e.g., data input/output information).

Similar to FIG. 2A, each set 168 of the contacts can have a predetermined arrangement that defines relative positions on the first surface 161 (or the second surface 162 if the set of contacts is exposed at the second surface) of contacts carrying address and command information and data. The contacts in each set 168 can be arranged according to the predetermined arrangement. The set 168 of the contacts that can be arranged according to two different predetermined arrangements for connection with two different types of the microelectronic assembly 110, respectively, are also referred to herein as a set of "co-support contacts."

The circuit panel 160c can be usable without requiring alteration thereof in first and second modes, each mode being when a given set 168 of contacts is connected with terminals of a corresponding type of microelectronic package 110c or 110d. For example, a component 105c can be joined with a first type microelectronic package 110c (FIG. 2C) having first terminals 125 joined to first contacts 165 of the circuit panel. In another example, the same component 105c a second type microelectronic package 110d (FIG. 2D) having first terminals 125 joined to first contacts 165 of the circuit panel.

For example, in the first mode, the circuit panel 160c can be coupled to a first type of microelectronic package 110c that is operable to sample the address and command information carried by the first contacts 165 once per clock cycle. Examples of such a first type of microelectronic package include the microelectronic package 110c having four microelectronic elements 131a, 131b, 131c, and 131d, as shown in FIG. 2C, or other numbers of microelectronic elements as will be described below. Such a microelectronic package 110c can include microelectronic elements 131 of type DDR3 or DDR4 (generally referred to as DDRx) or of type GDDR3 or GDDR4 (generally referred to as GDDRx).

In a particular example, in the second mode, the circuit panel 160c can be coupled to a second type of microelectronic package 110d that is operable to sample the address and command information carried by the first contacts 165 twice per clock cycle. Examples of such a second type of microelectronic package include the microelectronic package 110d having four microelectronic elements 132a, 132b, 132c, and 132d, shown in FIG. 2D, or other numbers of microelectronic elements as will be described below. Such a microelectronic package 110d can include microelectronic elements 132 of type LPDDR3 or LPDDR4 (generally referred to as LPDDRx).

In a particular embodiment, the one or more microelectronic elements 110c in the first type microelectronic package (e.g., the microelectronic package 110c shown in FIG. 2C) can incorporate a different type of memory storage array than the one or more microelectronic elements in the second type microelectronic package (e.g., the microelectronic package 110d shown in FIG. 2D).

As can be seen in FIG. 2C, the circuit panel 160c can include first contacts 165 in each set of contacts 168 that can include first and second groups of first contacts 165a and 165b. Each group of first contacts 165a and 165b can be assigned for carrying address information usable to specify a location within the memory storage array of the one or more microelectronic elements 131.

When the circuit panel 160c is connected to a first type microelectronic package such as the microelectronic packages 110c shown in FIG. 2C, both of the first and second groups of first contacts 165a and 165b can be used to together specify a location within the memory storage array of the one or more microelectronic elements 110c.

In such an example, the first group of first contacts 165a can be connected to a first command-address signal bus F0 of the set of conductors 170, which can be connected to each microelectronic element 131, and the second group of contacts 165b can be connected to a second command-address signal bus F1 of the set of conductors, which can also be connected to each microelectronic element 131. In particular embodiments, a first type microelectronic package can include one or two microelectronic elements 131, each microelectronic element being configured to connect with the first contacts 165 in each of the first and second groups of first contacts 165a, 165b. In other embodiments, a first type microelectronic package can include more than two microelectronic elements 131, each microelectronic element being configured to connect with the first contacts 165 in each of the first and second groups of first contacts 165a, 165b.

In the example shown in FIG. 2C, the microelectronic package 110c has four microelectronic elements 131, and each of those microelectronic elements can be connected to both the first and second command-address signal busses F0 and F1 of the set of conductors 170. In the example shown in FIG. 2C, each microelectronic element 131a, 131b, 131c, and 131d can receive 16 bits of command-address signal information: 8 bits from the signal bus F0, and 8 bits from the signal bus F1. These connections between the signal busses F0 and F1 and the microelectronic elements 131 are schematically shown in FIG. 2C as conductors G0 that are connected with the signal bus F0 and conductors G1 that are connected with the signal bus F1.

In a variation of the embodiment shown in FIG. 2C, the first type microelectronic package 110c can have eight microelectronic elements 131, and each of those microelectronic elements can be connected to both the first and second command-address signal busses F0 and F1. In such an example, each microelectronic element 131 can receive 16 bits of command-address signal information: 8 bits from the signal bus F0, and 8 bits from the signal bus F1.

Alternatively, when the circuit panel 160c is connected to a second type microelectronic package such as the microelectronic packages 110d shown in FIG. 2D, both of the first and second groups of first contacts 165a and 165b can be used separately to each specify a location within the memory storage array of the one or more microelectronic elements 132a, 132b, 132c, and 132d.

In such an example, the first group of first contacts 165a can be connected to a first command-address signal bus F0 of the set of conductors 170, which can be connected to a first half of the microelectronic elements 132, and the second group of contacts 165b can be connected to a second command-address signal bus F1 of the set of conductors, which can be connected to a second half of the microelectronic elements 132. For example, a second type microelectronic package can include a plurality of microelectronic elements 132, a first half of the microelectronic elements being configured to connect with the first contacts 165 in the first group of first contacts 165a but not with the second group of first contacts 165b, and a second half of the microelectronic elements being configured to connect with the first contacts in the second group of first contacts 165b but not with the first group of first contacts 165a.

In a particular example, a second type microelectronic package can include a single microelectronic element 132 that is connected with the first contacts 165 in the first group of first contacts 165a but not with the second group of first contacts 165b, such that the single microelectronic element is connected with the first command-address signal bus F0 but not with the second command-address signal bus F1.

In FIG. 2D, the microelectronic package 110d has four microelectronic elements 132a, 132b, 132c, and 132d. Two of those microelectronic elements 132a and 132b can be connected with the first group of first contacts 165a but not with the second group of first contacts 165b, such that the microelectronic elements 132a and 132b are connected with the first command-address signal bus F0 of the set of conductors 170 but not the second command-address signal bus F1. Two of the microelectronic elements 132c and 132d can be connected with the second group of first contacts 165b but not with the first group of first contacts 165a, such that the microelectronic elements 132c and 132d are connected to the second command-address signal bus F1 but not the first command-address signal bus F0.

In this embodiment, each signal bus F0 and F1 is configured to carry two identical sets of command-address signals, such that each of the four microelectronic elements 132 can be connected to one of the two sets of command-address signals of a particular signal bus F0 or F1.

In one example of the embodiment shown in FIG. 2D, two of the microelectronic elements 132a and 132b can receive 32 bits of command-address signal information from the first command-address signal bus F0, and two of the microelectronic elements 132c and 132d can receive 32 bits of command-address signal information from the second command-address signal bus F1. In another example of the embodiment shown in FIG. 2D, two of the microelectronic elements 132a and 132b can receive 16 bits of command-address signal information from the first command-address signal bus F0, and two of the microelectronic elements 132c and 132d can receive 16 bits of command-address signal information from the second command-address signal bus F1. These connections between the signal busses F0 and F1 and the microelectronic elements 132 are schematically shown in FIG. 2D as conductors G0 that are connected with the signal bus F0 and conductors G1 that are connected with the signal bus F1.

In a variation of the embodiment shown in FIG. 2D, the second type microelectronic package 110d can have two microelectronic elements 132. A first one of the microelectronic elements 132 can be connected with the first group of first contacts 165a but not with the second group of first contacts 165b, such that the first microelectronic element is connected with the first command-address signal bus F0 but not with the second command-address signal bus F1. A second one of the microelectronic elements 132 can be connected with the second group of first contacts 165b but not with the first group of first contacts 165a, such that the second microelectronic element is connected with the second command-address signal bus F1 but not with the first command-address signal bus F0. In such an example, each microelectronic element 132 can receive 32 bits of command-address signal information from either the first command-address signal bus F0 or the second command-address signal bus F1.

In the particular embodiment of the circuit panel 160c shown in FIG. 2C, each of the first contacts of the first group 165a can have a signal assignment that is symmetric about a theoretical axis 174 with the signal assignment of a corresponding first contact of the second group 165b. A first type microelectronic package such as the microelectronic package 110c having signal assignments that are symmetric about a theoretical axis 174 or a second type microelectronic package such as the microelectronic package 110d having signal assignments that are symmetric (e.g., address signal and no-connect symmetry) about a theoretical axis can be mounted to the same circuit panel 160c.

Although the embodiments of the circuit panel 160c shown herein have first contacts of the first group 165a that have signal assignments that are symmetric about a theoretical axis 174 (FIG. 2C) with signal assignments of corresponding first contacts of the second group 165b, that need not always be the case. The invention described and claimed herein also contemplates circuit panels 160c that have first contacts of the first group 165a that have signal assignments that are not symmetric about a theoretical axis with signal assignments of corresponding first contacts of the second group 165b.

As can be seen in FIG. 2C, the circuit panel 160c can further include second contacts 167 in each set of contacts 168, and such second contacts in each set of contacts can include first and second groups of second contacts 167a and 167b. The second contacts 167 can be assigned for carrying information other than the address and command information. The circuit panel 160c can have at least one second bus F2, F3 of the set of conductors 171 that is electrically connected with at least some of the second contacts 167. Such a second bus F2, F3 can have a plurality of signal lines configured to carry information other than the address and command information.

In one example, each of the four microelectronic elements 131 can be electrically connected with different signal lines within the set of conductors 171. For example, the microelectronic element 131a can receive 16 bits of data signal information from a first half of conductors of the signal bus F2, the microelectronic element 131b can receive 16 bits of data signal information from a second half of conductors of the signal bus F2, the microelectronic element 131c can receive 16 bits of data signal information from a first half of conductors of the signal bus F3, and the microelectronic element 131d can receive 16 bits of data signal information from a second half of conductors of the signal bus F3. These connections between the signal busses F2 and F3 and the microelectronic elements are schematically shown in FIGS. 2C and 2D as conductors G2 that are connected with the signal bus F2 and conductors G3 that are connected with the signal bus F3.

In one example, as can be seen in FIG. 2D, at least some of the second contacts 167 each of the at least one set of contacts 168 can be disposed in first and second areas 167a, 167b adjacent to at least first and second opposite edges 168a, 168b of a periphery of the predetermined of the respective set of contacts, such that all of the first contacts 165 of the respective set of contacts can be disposed between the first and second areas of the respective set of contacts.

Also, in such an example, at least some of the second contacts 167 each of the at least one set of contacts 168 can be disposed in third and fourth areas adjacent to at least third and fourth opposite edges of the periphery of the predetermined of the respective set of contacts, the third and fourth edges extending in a direction between the first and second edges 168a, 168b, such that all of the first contacts 165 of the respective set of contacts are disposed between the third and fourth areas of the respective set of contacts.

The circuit panel 160c shown in any of the embodiments of FIGS. 2C and 2D can have a first set of contacts 168 at the first surface 161 and a second set of contacts 168 at the second surface 162, each of the first and second contacts 165, 167 in each set of contacts 168 being arranged according to the same predetermined arrangement. The circuit panel 160c shown in any of the embodiments of FIGS. 2C and 2D can have a first set of contacts 168 at the first surface 161 and a second set of contacts 168 at the first surface spaced apart from the first set in a direction parallel to the first surface, each of the first and second contacts 165, 167 in each set of contacts 168 being arranged according to the same predetermined arrangement.

In some embodiments, circuit panels 160c having more than one set of contacts 168 can use the same channel of conductors 170 for carrying command and address information to each of the sets of contacts. In other embodiments, circuit panels 160c having more than one set of contacts 168 can use different channels of conductors 170, each channel of conductors being configured for carrying command and address information to a different one of the sets of contacts.

Figure 3A:
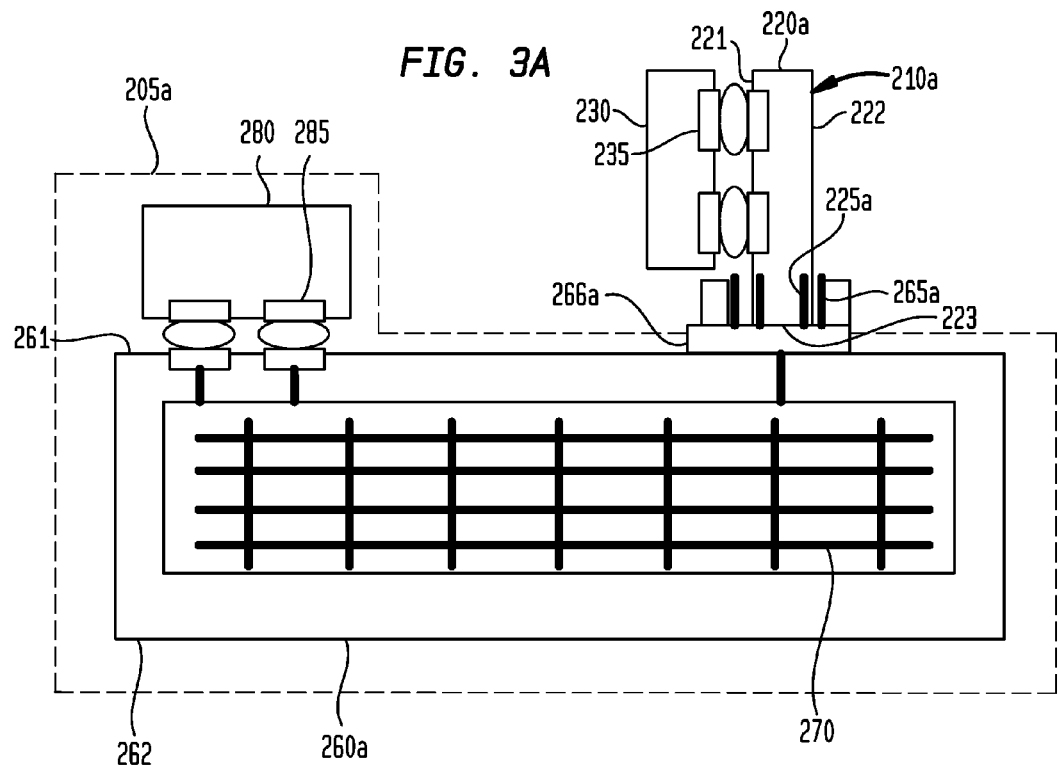
FIG. 3A is a side sectional view illustrating a component having a module and a circuit panel according to an embodiment of the invention.

FIG. 3A illustrates a component 205a according to a particular example of the invention shown in FIG. 1. As seen in FIG. 3A, the component 205a includes a circuit panel 260, and the contacts 265a are disposed in a socket 266a attached to the first surface 261 of the circuit panel and electrically connected with the set of conductors 270.

The microelectronic assembly joined to the circuit panel 260a is a module 210a including a module card 220a and one or more microelectronic elements 230 attached thereto, each microelectronic element having a surface facing a first surface 221 of the module card. The microelectronic element 230 has address inputs 235 electrically connected to terminals 225a of the module card 210a. In a particular embodiment, the module 210a can include a plurality of microelectronic elements 230 that are connected with busses F0, F1, F2, and F3 of the set of conductors 270 in the same manner as shown and described with respect to FIG. 2C or FIG. 2D, depending on whether the microelectronic elements are of the first type or the second type.

As can be seen in FIG. 3A, the terminals 225a are a plurality of parallel exposed edge terminals adjacent an edge 223 of at least one of the first and second surfaces 221, 222 of the module card 220a for mating with the contacts 265a of more sockets 266a when the module is inserted in the socket. Although terminals 225a are shown in FIG. 3A exposed at both the first and second surfaces 221, 222 of the module card 220a, terminals 225a may be exposed at only the first surface, only the second surface, or both the first and second surfaces of the module card.

As can be seen in FIG. 3C, the module card 220a may have one row of parallel exposed edge terminals 225a adjacent the edge 223, a first row of parallel exposed edge terminals 226a and a second row of parallel exposed terminals 226b adjacent the first row of terminals, or a first row of parallel exposed edge terminals 227a and a plurality of rows of parallel exposed terminals 227b, 227c (two additional rows 227 are shown in FIG. 3C, but the module card may include more than two additional rows), the second row of terminals 227b being adjacent the first row of terminals 227a, and the third row of terminals 227c being adjacent the second row of terminals 227b. The module card 220a may have notches 228 extending from the edge 223, such notches facilitating registration of the module card with a multi-part socket 266a that is configured to receive the module card. Although the terminals 225, 226, and 227 shown in FIG. 3C are shown exposed at the first surface 221 of the module card 220a, terminals 225, 226, and 227 may be exposed at only the first surface, only the second surface 222, or both the first and second surfaces of the module card.

Figure 3B:
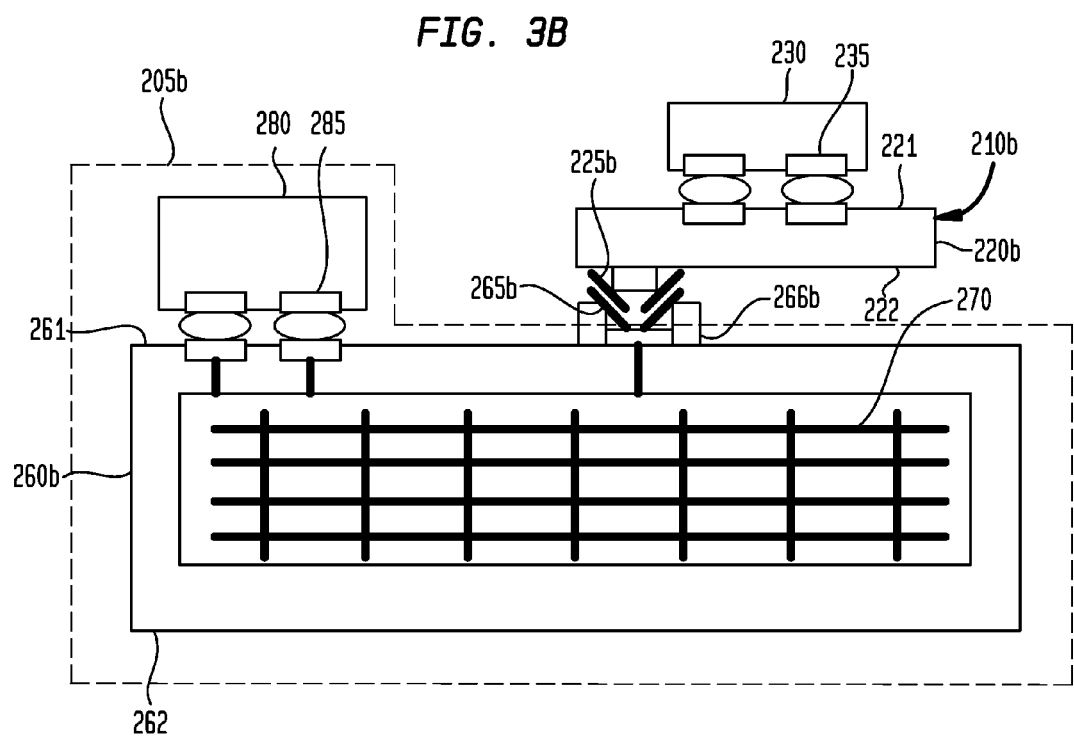
FIG. 3B is a side sectional view illustrating a component having a module and a circuit panel according to a variation of the embodiment of the invention seen in FIG. 3A.

FIG. 3B illustrates a component 205b according to a variation of the invention shown in FIG. 3A. As seen in FIG. 3B, the component 205b includes a circuit panel 260, and the contacts 265b are disposed in a connector 266b attached to the first surface 261 of the circuit panel and electrically connected with the set of conductors 270. The terminals 225b of the module 210b are a plurality of parallel terminals exposed at one of the first and second surfaces 221, 222 of the module card 220b for mating with the contacts 265b of the connector 266b when the module is attached to the connector. In a particular embodiment, the module 210b can include a plurality of microelectronic elements 230 that are connected with busses F0, F1, F2, and F3 of the set of conductors 270 in the same manner as shown and described with respect to FIG. 2C or FIG. 2D, depending on whether the microelectronic elements are of the first type or the second type.

Similar to the embodiment of FIG. 3A described above, the module card 220b may have two rows of parallel exposed terminals 225b exposed at a surface of the module card, four parallel rows of exposed terminals (e.g., one additional row of parallel terminals disposed adjacent each row of terminals 225b), or six or more parallel rows of exposed terminals (e.g., two or more additional rows of parallel terminals disposed adjacent each row of terminals 225b). Also similar to the embodiment of FIG. 3A, the module card 220b may have one or more notches configured to facilitate registration of the module card with a multi-part socket 266b that is configured to receive the module card.

In this embodiment, the socket 266b, the contacts 265b, and the terminals 225b of the module 210b are configured such that, when the when the module attached to the socket, the second surface 222 of the module card 220b is oriented substantially parallel to the first surface 261 of the circuit panel 260b.

Although FIGS. 3A and 3B each show only a single module 210a or 210b electrically connected with the component 205a or 205b, in other embodiments, a plurality of modules can be electrically connected with the component. In such embodiments, all of the modules 210a or 210b can be attached to the first surface 261 of the circuit panel 260a or 260b, all of the modules can be attached to the second surface 262 of the circuit panel, or one or more modules can be attached to the first surface of the circuit panel and one or more modules can be attached to the second surface.

Although FIGS. 3A and 3B show a module card 220a or 220b oriented substantially perpendicular (FIG. 3A) or parallel (FIG. 3B) to the first surface 261 of the circuit panel 260a or 260b, in other embodiments, a module card of a module similar to the module 210a or 210b may be inclined at any other angle relative to the first surface of the circuit panel, such as 15°, 30°, 45°, 60°, or 75°, for example.

Although FIGS. 3A and 3B show module cards 220a, 220b electrically connected to a circuit panel 260a, 260b via a socket 266a, 266b, other connection configurations may be used. For example, the invention contemplates module cards electrically connected to a circuit panel using a ribbon connector extending between terminals of the module card and contacts of the circuit panel.

FIG. 4A illustrates a component 305 according to another particular example of the invention shown in FIG. 1. As seen in FIG. 4A, the component 305 includes a circuit panel 360, and the contacts 365 are upper terminals of a second microelectronic assembly 340 exposed at a first surface 347 of the second microelectronic assembly. The second microelectronic assembly 340 is attached to the first surface 361 of the circuit panel and is electrically connected with the set of conductors 370. Lower terminals 345 of the second microelectronic assembly 340 are electrically connected with corresponding contacts 375 exposed at the first surface 361 of the circuit panel 360.

The microelectronic assembly joined to the circuit panel 360 is in the form of a first microelectronic assembly 310. In the example shown in FIG. 4A, the microelectronic assembly 310 is a microelectronic package having one or more microelectronic elements 330 therein having a surface facing a first surface 321 of a package substrate 320. In a particular embodiment, the first microelectronic assembly 310 can include a plurality of microelectronic elements 330 that are connected with busses F0, F1, F2, and F3 of the set of conductors 370 in the same manner as shown and described with respect to FIG. 2C or FIG. 2D, depending on whether the microelectronic elements are of the first type or the second type.

In a particular example, the microelectronic assembly 310 can include a plurality of stacked microelectronic elements 330 electrically interconnected by conductive structure such as through-silicon vias ("TSVs"). The microelectronic element 330 has address inputs 335 electrically connected to terminals 325 exposed at a second surface 322 of the substrate 320 opposite the first surface 321.

The second microelectronic assembly 340 includes a microelectronic element 341 having active devices therein, and the upper terminals 365 of the second microelectronic assembly are electrically connected with the set of conductors 370 of the circuit panel extending through the second microelectronic assembly.

In the embodiment of FIG. 4A, the microelectronic elements 330 of the first microelectronic assembly (or microelectronic package) 310 can have memory storage array function, and the microelectronic element 341 of the second microelectronic assembly (or microelectronic package) 340 can have microprocessor function.

In an exemplary embodiment, the microelectronic element 330 of the first microelectronic assembly 310 can be directly electrically connected to the microelectronic element 341 of the second microelectronic assembly 340 by electrical connections that extend only within the first and second microelectronic assemblies, not within the circuit panel 360. As used herein, a first microelectronic element of a first microelectronic assembly and a second microelectronic element of a second microelectronic assembly are "directly" connected to one another when the electrical connections extending between the first and second microelectronic elements extend only within the first and second microelectronic assemblies, not within a structure external to the first and second microelectronic assemblies (e.g., a circuit panel).

In one example, the electrical connections between the microelectronic element 330 of the first microelectronic assembly 310 and the microelectronic element 341 of the second microelectronic assembly 340 can include interconnection elements extending in a direction normal to the first surface 347 of the second microelectronic assembly at which the upper terminals (the contacts 365) of the second microelectronic assembly are exposed, the interconnection elements being configured for package-on-package stacking.

In one embodiment, the electrical connections between the microelectronic element 330 of the first microelectronic assembly 310 and the microelectronic element 341 of the second microelectronic assembly 340 can include a bond via array extending from the terminals 365 of the second microelectronic assembly to contacts exposed at a surface 343 of a substrate of the second microelectronic assembly.

FIG. 4B illustrates a component 305b that is a variation of the component 305 of FIG. 4A, according to another particular example of the invention shown in FIG. 1. As seen in FIG. 4B, the component 305b includes the same second microelectronic assembly 340 shown in FIG. 4A, but it does not include the circuit panel 360. A set of conductors 370 is supported by and/or located within the substrate 342 of the second microelectronic assembly 340. The set of conductors 370 is electrically connected with the contacts 365 at the first surface 347 of the second microelectronic assembly 340. The component 305b can be electrically connected with a circuit panel such as the circuit panel 360 through terminals 345 exposed at a lower surface 344 of the second microelectronic assembly 340.

FIG. 4C illustrates a component 305c that is a variation of the component 305b of FIG. 4B, according to another particular example of the invention shown in FIG. 1. As seen in FIG. 4C, the component 305c includes a second microelectronic assembly 340c that is similar to the second microelectronic assembly 340 shown in FIG. 4B, but it does not include the substrate 342. A set of conductors 370c is supported by and/or located within a molded region 348 of the second microelectronic assembly 340c. The set of conductors 370c is electrically connected with the contacts 365 at the first surface 347 of the second microelectronic assembly 340. The set of conductors 370c can electrically connect element contacts 349 of the microelectronic element 341 with the terminals 345 exposed at a lower surface 344 of the second microelectronic assembly 340c.

FIG. 5A illustrates a component 405 according to yet another particular example of the invention shown in FIG. 1. As seen in FIG. 5A, the component 405 includes a circuit panel 460, and the contacts 465 are upper terminals of a second microelectronic assembly 440 exposed at a first surface 447 of the second microelectronic assembly, or exposed at a dielectric layer (not shown) at a first surface of the second microelectronic assembly. The second microelectronic assembly 440 is attached to the first surface 461 of the circuit panel and is electrically connected with the set of conductors 470. Lower terminals 445 exposed at a second surface 444 of the second microelectronic assembly 440 are electrically connected with corresponding contacts 475 exposed at the first surface 461 of the circuit panel 460.

The microelectronic assembly joined to the circuit panel 460 is in the form of a first microelectronic assembly 410. In the example shown in FIG. 5A, the microelectronic assembly 410 is a microelectronic package having one or more microelectronic elements 430 therein having a surface facing a first surface 421 of a package substrate 420. The microelectronic element 430 has address inputs 435 electrically connected to terminals 425 exposed at a second surface 422 of the substrate 420 opposite the first surface 421. In a particular embodiment, the first microelectronic assembly 410 can include a plurality of microelectronic elements 430 that are connected with busses F0, F1, F2, and F3 of the set of conductors 470 in the same manner as shown and described with respect to FIG. 2C or FIG. 2D, depending on whether the microelectronic elements are of the first type or the second type.

In the embodiment of FIG. 5A, the first microelectronic assembly 410 can include a first microelectronic element 430 and additional microelectronic elements each having active devices therein. In one example, the terminals 425 of the first microelectronic assembly 410 can be electrically connected with the additional microelectronic elements by through-silicon vias extending through the first microelectronic element 430.

The second microelectronic assembly 440 can include one or more microelectronic elements each having active devices therein, and the upper terminals 465 of the second microelectronic assembly can be electrically connected with the set of conductors 470 of the circuit panel by electrical connections extending at least partially within the second microelectronic package. The contacts (or upper terminals) 465 can be exposed at a dielectric layer overlying the first surface 447 of the second microelectronic assembly 440. In an exemplary embodiment, one or more of the microelectronic elements of the second microelectronic assembly 440 can have a logic function.

In a particular example, these electrical connections between the upper terminals 465 of the second microelectronic assembly 440 and the set of conductors 470 can include through-silicon vias 446 extending through the one or more microelectronic elements. These electrical connections can also include by joining units extending between the lower terminals 445 and corresponding contacts 475 exposed at the first surface 461 of the circuit panel 460.

In one example, the second microelectronic assembly 440 can include a first microelectronic element and at least one second microelectronic element, each microelectronic element having active devices therein, the first and second microelectronic elements arranged in a stacked configuration. In a particular embodiment, the upper terminals 465 of the second microelectronic assembly 440 can be electrically connected with the set of conductors 470 of the circuit panel 460 by through-silicon vias 446 extending through the at least one second microelectronic element of the second microelectronic assembly. Although in FIG. 5A, each of the upper terminals 465 are shown as being aligned with (in a horizontal direction) and connected to the through-silicon vias 446, it is not required that the upper terminals be aligned with the through-silicon vias, nor is it required that all of the upper terminals be connected with these through-silicon vias.

Although the first and second microelectronic assemblies 410 and 440 are shown as packaged structures, that need not be the case. In one embodiment, the first microelectronic assembly 410 can be a microelectronic element having a memory storage array function, and the second microelectronic assembly 440 can be a microelectronic element having logic function. Although the first microelectronic assembly 410 is shown as having a flip-chip connection between the terminals 425 and the contacts 465, that need not be the case. In one example, the first microelectronic assembly 410 can be a microelectronic element having a memory storage array function that is oriented with a contact-bearing surface thereof facing away from the upper surface 447 of the second microelectronic assembly 440, and terminals 425 (which can be element contacts) of the first microelectronic assembly 410 can be wire-bonded to the contacts 465 at the upper surface of the second microelectronic assembly.

In a particular example, contacts 465 at the upper surface 447 of the second microelectronic assembly 440 can offer co-support of microelectronic assemblies 410 having DDR3 or DDR4 memory elements therein.

FIG. 5B illustrates a component 405b that is a variation of the component 405 of FIG. 5A, according to another particular example of the invention shown in FIG. 1. As seen in FIG. 5B, the component 405b includes the same second microelectronic assembly 440 shown in FIG. 5A, but it does not include the circuit panel 460.

A set of conductors 470b can be supported by and/or located within the microelectronic elements of the second microelectronic assembly 440. The set of conductors 470b can include TSVs and/or redistribution traces connected to TSVs, for example. The set of conductors 470 can be electrically connected with the contacts 465 at the first surface 447 of the second microelectronic assembly 340. The component 405b can be electrically connected with a circuit panel such as the circuit panel 460 through terminals 445 exposed at a lower surface 444 of the second microelectronic assembly 440. In the embodiment of FIG. 5B, one or more of the microelectronic elements in the microelectronic assembly 440 can be a support structure for the set of conductors 470b, or a dielectric layer overlying one of the microelectronic elements in the microelectronic assembly can be a support structure for the set of conductors.

A microelectronic structure 500 according to an embodiment of the invention is illustrated in FIGS. 6A and 6B. As seen in FIG. 6A, the structure 500 has a first surface 601 and a plurality of terminals, e.g., first terminals 504, and second terminals 506 exposed at the first surface.

The microelectronic structure 500 can include active elements 602, e.g., active devices such as transistors, or other active elements thereon, which, with or without additional elements, define a memory storage array 604. In one example, the active elements 602 and the memory storage array 604 defined by the active elements can be incorporated in a portion of a microelectronic element, or in one or more microelectronic elements, e.g., one or more semiconductor chips, of the microelectronic structure, or may be incorporated in one or more microelectronic packages or an assembly thereof of the microelectronic structure.

Without limitation, in one example, the microelectronic structure 500 may be, for example, a microelectronic package or portion thereof wherein the terminals are exposed at a first surface 601 of the microelectronic package. In another example, the microelectronic structure can be an assembly including a plurality of electrically connected microelectronic packages or a structure that includes electrically connected microelectronic elements, semiconductor chips, or portions of microelectronic elements or semiconductor chips, or portions of microelectronic packages.

In one example, the memory storage array 604 comprises a functional part of the microelectronic structure whose role may be subservient to another functional part of the microelectronic structure. For example, the microelectronic structure may include a logic functional part, e.g., processor, and a memory functional part, and the memory functional part may assist with or help serve a function of the logic functional part. However, in a particular example, the microelectronic structure may be configured to predominantly provide memory storage array function. In the latter case, the microelectronic structure may have a greater number of active elements 602, e.g., active devices such as transistors, configured to provide memory storage array function than the number of active elements in other components of the structure which are configured to provide function other than memory storage array function.

The microelectronic structure may have a plurality of address inputs 606 for receipt of address information specifying locations within the memory storage array 604. Thus, the address inputs may be contacts exposed at a surface of a microelectronic element as described above. The microelectronic structure is configured so as to transfer address information received at particular terminals of the microelectronic structure to the address inputs 606. For example, the microelectronic structure may couple signals received on particular terminals of the structure to corresponding particular address inputs 606. In a particular example, the address inputs 606 can be exposed at a face 607 of a microelectronic element 501, e.g., a semiconductor chip, wherein the face 607 faces towards the first surface 601 of the microelectronic structure. In another example, the address inputs 606 can be exposed at a face 609 of a microelectronic element 501 that faces away from the first surface 601.

In one example, the microelectronic structure 500 may contain wiring therein that directly electrically couples a set of the terminals, e.g., "first terminals" 504, with corresponding address inputs of the microelectronic structure.

In another example, as further described below, the microelectronic structure 500 may include a buffer element, such as a semiconductor chip having a plurality of active elements thereon, such semiconductor chip being configured to at least one of regenerate, or partially or fully decode at least one of address or command information received at the first terminals for transfer by the microelectronic structure to the address inputs.

The microelectronic structure 500 may further include a nonvolatile memory having at least a portion thereof configured to perform serial presence detect ("SPD") function, as a "SPD element" of the microelectronic structure. Such SPD element can contain operational parameters pertaining to at least one of the organization, timing, or capacity of the microelectronic structure. In one embodiment, the SPD element can be incorporated in a semiconductor chip other than one or more semiconductor chips in which a memory storage array is provided and to which the address information is provided by way of the address inputs. In one example, the operational parameters may pertain to timing such as the number of clock cycles of latency after the row address strobe signal is detected in an enabled state by circuitry of the microelectronic structure (hereinafter, "RAS latency"), or may pertain to the number of clock cycles of latency after the column address strobe signal is detected in an enabled state by circuitry of the microelectronic structure, or may pertain to the capacity of the microelectronic structure, e.g., such as one gigabit ("1 Gb"), two gigabit ("2 Gb"), etc., or may pertain to the organization of the microelectronic structure, such as a "single-rank", "2-rank", "4-rank" or other structure, etc., or other operating parameter, or a combination of the foregoing operational parameters, or other operating parameter. In one example, the nonvolatile memory may store information of a single one of the aforementioned parameters or may store information of any combination of the operational parameters, without limitation. In a particular example, the SPD may contain a table of known bad memory locations within the memory storage array of the microelectronic structure which should be avoided during read or write access to the memory storage array.

A theoretical plane 532 extends through the microelectronic structure 500 in a direction normal to the first surface 601 at a location between first and second oppositely-facing edges 540, 541 of the microelectronic structure. The relationship between the theoretical plane 532 and other structure will become clear from the examples provided below. As further seen in FIG. 6B, the microelectronic structure 500 has a plurality of first terminals thereon, e.g., terminals 504, disposed on first and second opposite sides of the theoretical plane 532.

Figure 6D:
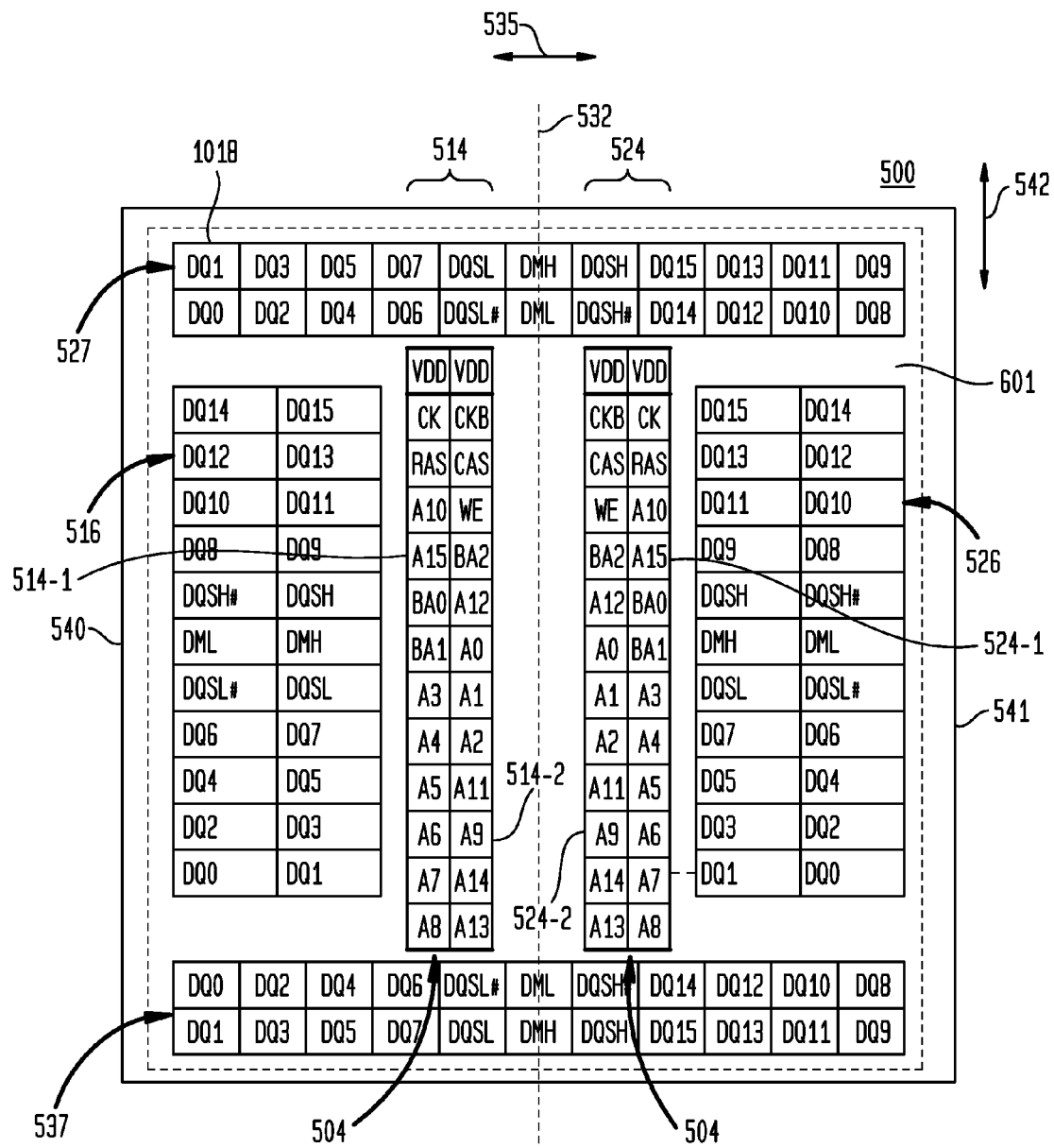
FIG. 6D is a further plan view illustrating a possible arrangement of terminals on a microelectronic structure such as seen in FIG. 6B or FIG. 6C.

As further seen in FIG. 6D, a first set of the first terminals 504 are disposed on a first side of the theoretical plane 532 and a second, e.g., duplicate set of the first terminals 504 are disposed on a second side of the theoretical plane 532 which is opposite the first side. The microelectronic structure 500 is configured to provide address information received at the first terminals to the address inputs. As further seen in FIG. 6D, signal assignments of the first set of first terminals 504 are a mirror image of the signal assignments of the second set of the first terminals 504.

As used herein, signal assignments of a pair of first terminals disposed on respective opposite sides of the theoretical plane 532 are a mirror image of one another when the signals assigned to each terminal of the pair are functionally equivalent. An address signal which has the same function as another signal in specifying a location within an address space is functionally equivalent to the other address signal. This can be best seen in an example in which a pair of address terminals 514-1 and 514-2 (FIG. 6D) on a microelectronic structure, e.g., "A2L" (A2_Left) and "A2R" (A2_Right) each specifies a bit of weight $2^2$ (2 to the power of 2) in an address used to specify a location within the same address space. These terminals have the same signal assignments because each of the signals A2L and A2R could be used to specify a like portion of an address within the same address space or within equivalent address spaces.

In one example in accordance therewith, it is apparent that the address information transferred to either one or both of the terminals of the package A2L and A2R can be transferred to a corresponding address input, e.g., element contact having the same name "A2" on one or more microelectronic elements incorporated in the microelectronic structure 500 (FIG. 6A). Thus, in one example, it is possible the signals assigned to each pair of first terminals having mirror image signal assignments, e.g., a signal A2L in the first set of first terminals and a signal A2R in the second set, could originate from the identical output of driver circuitry at a location external to the microelectronic structure. Further in such example, while the panel contacts exposed at an exterior of a circuit panel through which the signals A2L and A2R are received at the terminals of the microelectronic structure are separate, in some cases the panel contacts may be electrically tied together at one or more other locations of the circuit panel. Thus, in some cases, the pair of equivalent signals A2L and A2R are driven as a single signal at such other circuit panel location.

In another example, the microelectronic structure 500 may comprise multiple microelectronic elements in which address information is provided to one or more of the microelectronic elements in the microelectronic structure separately from address information provided to a different one or more of the microelectronic elements of the same structure. In this case, although address information is received on first and second sets of terminals on each of the first and second sides of the theoretical plane, the address information received at the first terminals on the first side of the theoretical plane may be provided only to address inputs of a first one or more microelectronic elements of the microelectronic structure. Conversely, the address information received at the first terminals on the second side of the theoretical plane opposite from the first side may be provided only to address inputs of a second one or more of the microelectronic elements of the microelectronic structure.

In one example, the first one or more microelectronic elements may lie on the first side of the theoretical plane, and the second one or more microelectronic elements may lie on the second side of the theoretical plane. In such case, the address information received on a terminal of the package having a signal assignment A2L and the address information on a terminal of the package having a signal assignment A2R which is a mirror image therefrom can each be transferred to element contacts having the same name "A2" of respective first and second microelectronic elements of the microelectronic structure 500 (FIG. 6A).

In FIG. 6D, the signal assignments of each of the first and second sets of first terminals, which may be disposed in respective first and second grids 514, 524 are seen to be symmetric about the theoretical plane 532, such that the terminal 514-1 of the first set which is assigned to receive signal A15 is symmetric about the theoretical plane 532 from the corresponding terminal 524-1 of the second set which is assigned to receive signal A15. The same relationship between first terminals on opposite sides of the theoretical plane 532 is represented in the various cross-sectional views provided in FIG. 6A and other figures in the application. Specifically, the notation "A" in such figures denotes the positions of a pair of first terminals having the same signal assignments for receipt of address information to be transferred to the address inputs, such first terminals disposed at respective mirror image positions within each microelectronic structure 500, etc.

In some cases, the first terminals 504 on each of the first and second sides of the theoretical plane 532 can be configured to receive each of the signals necessary to uniquely specify a single storage location within the storage array. In other cases, the first terminals 504 on each of the first and second sides can be configured to receive only a majority of the signals necessary to uniquely specify a single storage location within the storage array.

Although the theoretical plane 532 can extend through the microelectronic structure at a number of locations which can be closer to edge 540 than edge 541, or can be closer to edge 541 than edge 540, in a particular example and as shown in FIG. 6D, the theoretical plane can extend through the structure 500 at a location midway between the edges 540, 541.

In another example, shown in FIG. 6B, the terminals in each set of first terminals need not all be located on the same side (e.g., the first side 641) of the plane 532 can be disposed at any suitable positions on either side of the plane so long as the above-described requirements for symmetry between the signal assignment (e.g., A2L) of each first terminal on a side from a first set of first terminals (e.g., the first side 641) and a corresponding first terminal in a second set of first terminals having the same signal assignment (e.g., A2R) on the side opposite thereto (e.g., the second side 642) are met.

For example, a first set of first terminals, indicated by the black rectangles and black ovals (514-1 and 514-2 for example), and a second set of first terminals, indicated by the white rectangles and white ovals (524-1 and 524-2 for example), may be distributed across both sides of the plane 532. Each set of first terminals need not be located on the same side (e.g., the first side 641) of the plane 532 and can be disposed at any suitable positions on either side of the plane so long as the above-described requirements for symmetry between each first terminal having a particular address signal assignment from a first set on one side (e.g., the first side 641) and the first terminal having the same address signal assignment from a second set on the side opposite thereto (e.g., the second side 642) are met. For example, it can be seen in FIG. 6B that each terminal in a set of first terminals, indicated by the black rectangles and black ovals (514-1 and 514-2 for example), is symmetric about the plane 532 with and each terminal in a second set of first terminals, indicated by the white rectangles and white ovals (524-1 and 524-2 for example).

In a particular example as further seen in FIG. 6A, the first surface 601 of the microelectronic structure faces in a first direction 614, and the microelectronic structure 500 includes a substrate 502 having a first surface 510 facing in the same first direction. A second surface 508 of the substrate 502 may face in a second direction 616 opposite the first direction. In such example, in some cases, a microelectronic element 501 such as a semiconductor chip, on which some or all of the active elements 602 are provided, may have a face 609 that faces away from the second surface 508 of the substrate 502.

Figure 6E:
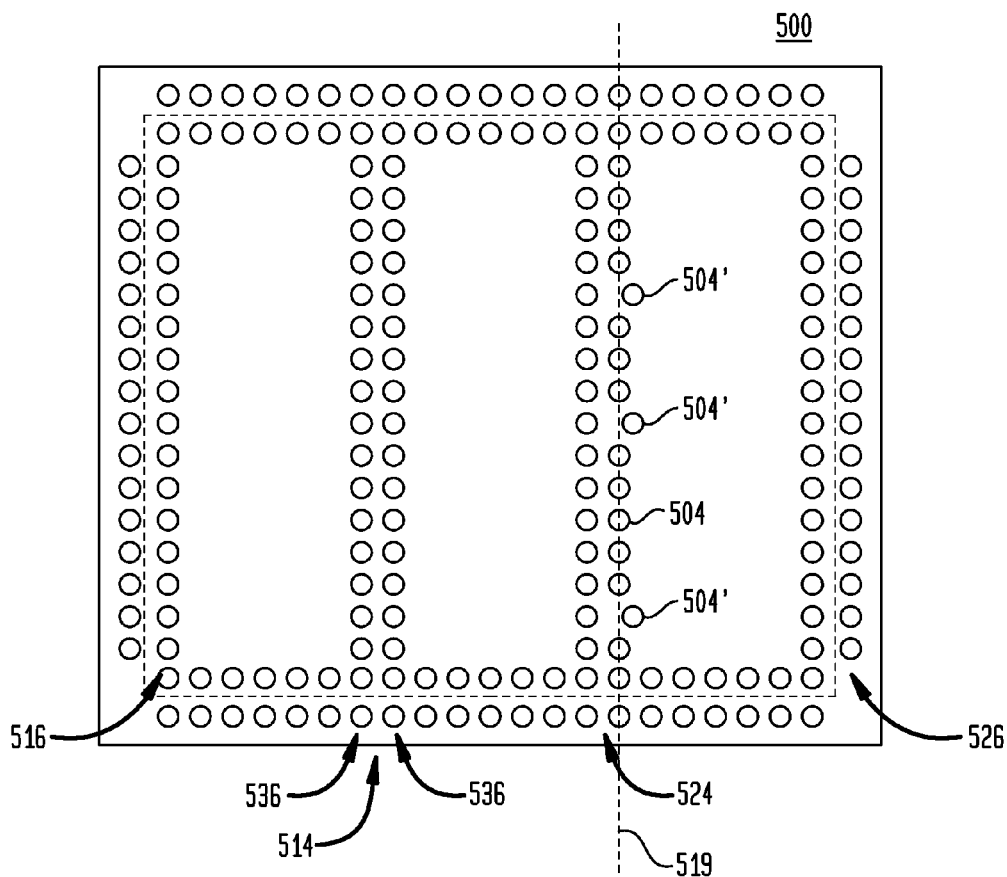
FIG. 6E is a bottom plan view illustrating a potential arrangement of terminals of the microelectronic structure of FIG. 6A.
Figure 6F:
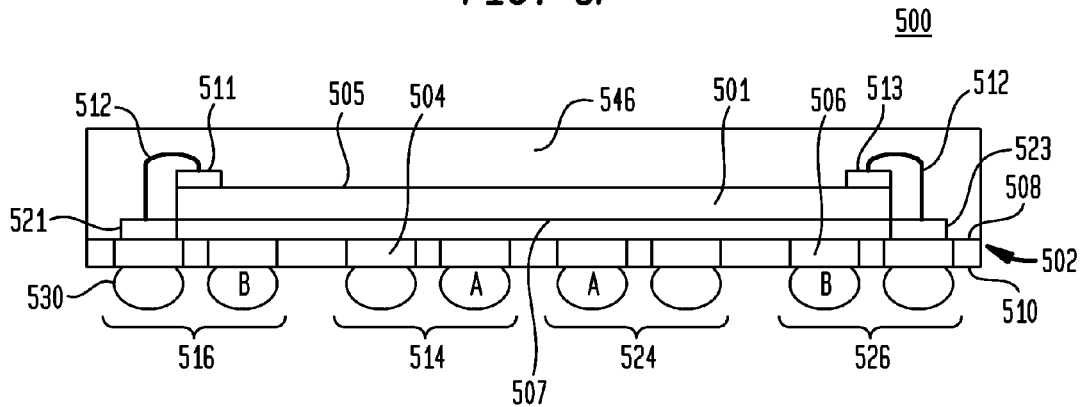
FIG. 6F is a sectional view illustrating a microelectronic package according to an embodiment of the invention.

As further seen in the particular example in FIG. 6F, a microelectronic element 501 incorporated in the microelectronic structure 500 may have element contacts 511, 513 at a front face 505 thereof that are electrically connected to respective substrate contacts 521, 523 at second surface 508 of the substrate 502. For example, wire bonds 512 may electrically connect the element contacts 511, 513 with the substrate contacts 521, 523. Alternatively, other types of conductors, e.g., portions of a lead frame, flexible ribbon bonds, etc., may be used to electrically connect the element contacts 511, 513 with the respective substrate contacts 521, 523, which in some cases may connect the element contacts 511, 513 with other conductive elements disposed at a greater height from the substrate surface 508 than the front face 505 of the microelectronic element 501.

In one type of such microelectronic element 501, each one of some contacts of the element contacts 511, 513 may be configured to receive particular address information of the address information supplied to the microelectronic element. In a particular embodiment, each of such contacts 511, 513 may be an address input configured to receive address information, supplied to the microelectronic element 501 from outside the microelectronic element, i.e., through wiring of the package such as wire bonds 512, and through the first terminals 504. Contacts 511, 513, may also be configured to receive other information or signals from outside the microelectronic element, such as, without limitation, through wire bonds 512 and second terminals 506.

In one particular example of such microelectronic element 501, the address information present at the element contacts 511, 513 can be sampled relative to an edge of a clock used by the respective microelectronic element, i.e., upon on a transition of the clock between first and second different voltage states. That is, each address signal can be sampled upon a rising transition between a lower voltage state and a higher voltage state of the clock, or upon a falling transition between a higher voltage state and a lower voltage state of the clock. Thus, the plurality of address signals may all be sampled upon the rising transition of the clock, or such address signals may all be sampled upon the falling transition of the clock, or in another example, the address signal at one of the element contacts 511, 513 can be sampled upon the rising transition of the clock and the address signal at one other external contact can be sampled upon the falling transition of the clock.

In another type of microelectronic element 501, which may be configured to predominantly provide memory storage array function, one or more of the address contacts thereon can be used in a multiplexed manner. In this example, a particular element contact 511, 513 of the respective microelectronic element 501 can receive two or more different signals supplied to the microelectronic element from the outside. Thus, a first address signal can be sampled at the particular contact 511, 513 upon a first transition of the clock between the first and second different voltage states (e.g., a rising transition), and a signal other than the first address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 511, 513 of the respective microelectronic element 501. In a particular case, multiplexing in this manner can allow a first address signal and a different signal to be received in the same clock cycle on the same element contact 511, 513 of the respective microelectronic element 501. In yet another example, multiplexing in this manner can allow a first address signal and a second different address signal to be received in the same clock cycle on the same element contact 511, 513 of the respective microelectronic element 501.

In some embodiments, the substrate 502 shown in FIGS. 6A and 6F can include a sheet-like or board-like dielectric element, which may consist essentially of polymeric material, e.g., a resin or polyimide, among others. Alternatively, the substrate can include a dielectric element having a composite construction such as glass-reinforced epoxy, e.g., of BT resin or FR-4 construction. In some examples, the dielectric element has a coefficient of thermal expansion in the plane of the dielectric element, i.e., in a direction parallel to a first surface 510 thereof, of up to 30 parts per million per degree Celsius (hereinafter, "ppm/° C."). In another example, the substrate can include a supporting element of material having a coefficient of thermal expansion ("CTE") of less than 12 parts per million per degree Celsius, on which the terminals and other conductive structure are disposed. For example, such low-CTE element can consist essentially of glass, ceramic or semiconductor material or liquid crystal polymer material, or a combination of such materials.

As seen in FIG. 6F, a first set 521 and a second set 523 of substrate contacts can be exposed at the second surface 508 of the substrate. The first set 521 of substrate contacts can be electrically connected with a column 511 of element contacts 532 of the microelectronic element, such as through electrically conductive structure extending above the face 505 of the microelectronic element. For example, the conductive structure can be wire bonds 512. In some cases, a die attach adhesive may be disposed between a rear face 507 of the microelectronic element and the second surface 508 of the substrate 502, which may mechanically reinforce the connection between the microelectronic element and the substrate. The second set 523 of the substrate contacts can be electrically connected with a column 513 of element contacts 531.

The microelectronic element may also include additional contacts that may not be disposed within a column of the element contacts. In some examples, the additional contacts may be used for connection to power, ground, or as contacts available for contact with a probing device, such as may be used for testing.

Conductive structure such as wire bonds 512 (FIG. 6F) may electrically connect the contacts 511, 513 with corresponding contacts 521, 523 exposed at a second surface 508 of the substrate. In some embodiments, the contacts 511, 513 may in some cases be connected with active devices of the semiconductor chip through back end of line ("BEOL") wiring of the semiconductor which may include vias or other electrically conductive structure and which may in some cases be disposed underneath the contacts 511, 513.

In another example, the contacts of a microelectronic element 501 can be arranged in one or more sets of contacts adjacent one or more peripheral edges of the microelectronic element indicated by the dashed lines marking the boundaries of the microelectronic element in FIG. 6D. In a particular example, the microelectronic element can be a single semiconductor chip and the contacts 511 or 513 thereon may be "chip contacts" which are the contacts of the semiconductor chip.

As used herein, the "central region" of the face of a microelectronic element or semiconductor chip means the area of the face having parallel boundaries extending throughout a dimension of the face in a direction parallel to first and second opposite edges of the face, wherein the central region spans a middle third of a shortest dimension of the face between the first and second opposite edges. Accordingly, the first peripheral region spans a third of the shortest dimension of the face between the central region and the first edge, and the second peripheral region spans a third of the shortest dimension between the central region and the second edge.

As seen in FIG. 6E, the microelectronic structure 500 can have first terminals 504 and second terminals 506 for electrically and mechanically connecting the microelectronic structure 500 with a component external to the microelectronic structure 500, such as a circuit panel, for example. The terminals 504, 506 can be electrically conductive pads, posts, or other electrically conductive structure. In the example seen in FIG. 6E, the terminals in some cases may include joining elements 530, such as may include a bond metal such as solder, tin, indium, gold, or a eutectic material, among others, or other conductive bond material, and may in some cases also include additional structure such as a conductive bump attached to conductive structure of the substrate such as conductive pads or posts. The first terminals 504 and the second terminals 506 can be electrically connected with the substrate contacts 521, 523 through electrically conductive structure on the substrate, such as traces and vias, for example.

In a particular example, as can be seen in FIG. 6B, a first set of the first terminals 504 can be arranged at positions within a first grid 514 exposed at a first surface 510 of the substrate 502 opposite from the second surface 508. A second set of the first terminals 504 can be arranged at positions within a second grid 524 exposed at the first surface 510 of the substrate which is disposed at a side of the theoretical plane 532 opposite from the first set of first terminals. Although, in some of the figures, the first and second sets are shown extending beyond the outer boundaries of the front surface of the microelectronic elements, that need not be the case. In certain embodiments of the invention, the set of first terminals within each set can be configured to carry the above-noted address information or, in a particular embodiment, the above-noted address information and certain signals of the command-address bus.

For example, when the microelectronic element 501 includes or is a DRAM semiconductor chip, each of the first and second sets is configured to carry address information transferred to the microelectronic structure 500 that is usable by circuitry within the package, e.g., row address and column address decoders, and bank selection circuitry, if present, to determine an addressable memory location from among all the available addressable memory locations of a memory storage array within a microelectronic element in the package. In a particular embodiment, each of the first and second sets of first terminals 504 can be configured to carry all the address information used by such circuitry within the microelectronic structure 500 to determine an addressable memory location within such memory storage array.

In a variation of such embodiment, the first terminals disposed at positions within the first and second grids 514, 524 can be configured to carry a majority of the address information that is used by such circuitry within the microelectronic structure 500 to determine an addressable memory location within such memory storage array, and then other terminals, such as at least some of the above-referenced second terminals 506 on the microelectronic structure, would then be configured to carry the remaining part of the address information. In such variation, in a particular embodiment, the first terminals 504 in each of the first and second sets can be configured to carry three-quarters or more of the address information that is used by such circuitry within the microelectronic structure 500 to determine an addressable memory location within such memory storage array.

In a particular embodiment, the terminals in each of the first and second sets, e.g., grids 514, 524 may not be configured to carry chip select information, e.g., information usable to select a particular chip within the microelectronic structure 500 for access to a memory storage location within the chip. In another embodiment, the first terminals 504 in at least one of the first and second sets may indeed carry chip select information.

Typically, when the microelectronic element 501 in the microelectronic structure 500 is or includes a DRAM chip, the address information in one embodiment can include all address information transferred to the microelectronic structure from a component external to the microelectronic structure, e.g., a circuit panel such as the circuit panel 554 (FIG. 7A) described below, which is used for determining a random access addressable memory location within the microelectronic package for read access thereto, or for either read or write access thereto.

At least some of the second terminals 506 can be configured to carry signals other than the address signals that are carried by the first terminals 504 of the first and second sets. In particular examples, the second terminals 506 may carry one or more of data, data strobe signals, or other signals or reference potentials such as chip select, reset, power supply voltages, e.g., Vdd, Vddq, and ground, e.g., Vss and Vssq. Some or all second terminals can also be disposed at locations within the same first and second grids 514, 524 in which the first and second sets of first terminals are disposed. In such case, some terminals disposed at locations within the first and second grids 514, 524 can be configured to carry one or more of data, data strobe signals, or other signals or reference potentials such as chip select, reset, power supply voltages, e.g., Vdd, Vddq, and ground, e.g., Vss and Vssq. Some terminals disposed at locations within the third and fourth grids 516, 526 can be configured to carry one or more of data, data strobe signals, or other signals or reference potentials such as chip select, reset, power supply voltages, e.g., Vdd, Vddq, and ground, e.g., Vss and Vssq.

In a particular embodiment, the first terminals that are disposed in first and second grids 514, 524 of each microelectronic structure 500 can be configured to carry information that controls an operating mode of the microelectronic element 501. More specifically, each of the first and second sets of first terminals 504 can be configured to carry all of a particular set of command signals and/or clock signals transferred to the microelectronic structure 500. In one embodiment, the first terminals 504 of each of the first and second sets can be configured to carry all of the command signals, address signals, bank address signals, and clock signals transferred to the microelectronic structure 500 from an external component, e.g., circuit panel or other device, wherein the command signals include row address strobe, column address strobe and write enable.

In an embodiment in which one or more of the microelectronic elements are configured to provide dynamic memory storage array function, such as provided by a dynamic random access memory ("DRAM") semiconductor chip, or an assembly of DRAM chips, the command signals can be write enable, row address strobe, and column address strobe signals. Other signals such as ODT (on die termination), chip select, clock enable, may or may not be carried by terminals disposed within first and second sets, such as in grids 514, 524. The clock signals can be clocks used by one or more of the microelectronic elements for sampling the address signals. For example, in the microelectronic packages 500A, 500B of FIG. 7A and as further shown in FIG. 6F, the first terminals 504 can be configured to carry clock signals CK and CKB, row address strobe RAS, column address strobe CAS and write enable signals WE, as well as address signals A0 through A15 inclusive, and bank address signals BA0, BA1 and BA2.

In the embodiments illustrated in FIGS. 6B and 6C, at least some of the second terminals 506, which can be disposed at positions within third and fourth grids 516, 526 (FIG. 6B) or within third and fourth grids 648, 642 (FIG. 6C) can be configured to carry signals other than the command signals, address signals, and clock signals that are carried by the first terminals 504 disposed at positions within the first and second grids 514, 524. Signals or reference potentials such as chip select, reset, power supply voltages, e.g., Vdd, Vddq, and ground, e.g., Vss and Vssq, may or may not be carried by the second terminals 506 in any of the embodiments referred to herein, unless otherwise noted.

In one embodiment, at least some of the second terminals 506 that are configured to carry signals other than the address signals can be arranged at positions within the first and second grids 514, 524. In one example, at least some of the second terminals 506 that are configured to carry signals other than the command signals, address signals, and clock signals can be arranged at positions within the first and second grids 514, 524. Although particular configurations of second terminals 506 are shown in the figures, the particular configurations shown are for illustrative purposes and are not meant to be limiting. For example, the second terminals 506 can also include terminals that are configured to be connected to power or ground signals.

An arrangement of the first terminals in the first and second grids 514, 524 of the package is particularly shown in FIG. 6D. In one example, each grid 514, 524 may include first and second parallel columns 536 of terminals. The columns 536 of terminals in each grid can be adjacent to one other. Alternatively, although not shown in FIG. 6D, at least one terminal may be disposed between the first and second columns of terminals.

In another example, such as seen in FIG. 6E, the grids may include a column of terminals for which a column axis 519 extends through a majority of the terminals 504 of such column, i.e., is centered relative thereto. However, in such column, one or more of the terminals might not be centered relative to the column axis 519, as in the case of terminals 504'. In this case, these one or more terminals are considered part of a particular column, even though such terminal(s) might not be centered relative to axis 519 because they are closer to the axis 519 of that particular column than to the axis of any other column. The column axis 519 may extend through these one or more terminals which are not centered relative to the column axis, or, in some cases, the non-centered terminals may be farther from the column axis such that the column axis 519 may not even pass through these non-centered terminals of the column. There may be one, several or many terminals in one column or even in more than one column which are not centered with respect to a column axis of the respective column in a grid.

Moreover, it is possible for the grids of terminals to contain arrangements of terminals in groupings other than columns, such as in arrangements shaped like rings, polygons or even scattered distributions of terminals. As shown in FIG. 6E, an encapsulant 546 can overlie the second surface 508 of the substrate and can contact the microelectronic element 501 therein. In some cases, the encapsulant can overlie a front surface 505 of the microelectronic element which faces away from the substrate 502.

As in the above example provided in FIG. 6D, and as also seen in FIG. 6B, the signal assignments of the first terminals in the second grid 524 are a mirror image of the signal assignments 524 of the first terminals in the first grid 514. Stated another way, the signal assignments of the first terminals in the first and second grids are symmetric about the theoretical plane or axis 532 between the first and second grids 514, 524, the axis 532 in this case extending in a direction 542 in which columns 536 of the first terminals extend. With the signal assignments in the second grid 524 being a mirror image of those in the first grid 514, a first terminal 514-1 of the first grid 514 which is assigned to carry the signal A15 is in the same relative vertical position (in direction 542) within the grid as the corresponding first terminal 524-1 of the second grid 524 which is assigned to carry the signal A15. However, since the first grid 514 contains two columns 536 and the terminal 514-1 of the first grid 514 assigned to carry the signal A15 is in the left column among the two columns 536 of the first grid 514, the mirror image arrangement requires that the corresponding terminal 524-1 of the second grid 524 assigned to carry the signal A15 is in the right column among the two columns of the second grid 524.

Another result of this arrangement is that the terminal assigned to carry the signal A9 is also in the same relative vertical position within the grid in each of the first and second grids 514, 524. However, in the first grid 514, the first terminal 514-1 assigned to carry A9 is in the right column among the two columns 536 of the first grid 514, and the mirror image arrangement requires that the corresponding terminal 524-2 of the second grid 524 assigned to carry the signal A9 is in the left column among the two columns of the second grid 524. As can be seen in FIG. 6D, the same relationship applies for each first terminal in each of the first and second grids, at least for each first terminal assigned to carry address information for receipt by an address input of the microelectronic structure as discussed above.

The theoretical plane 532 about which the signal assignments of the first terminals are symmetric can be located at various positions on the substrate. The theoretical plane 532 can be considered an axis, which in some embodiments, can be a central axis of the package that is located equidistant from first and second opposed edges 540, 541 of the substrate particularly when the columns 536 of the first terminals extend in a direction parallel to the edges 540, 541 and the first and second grids are disposed at locations which are symmetric about this central axis. In one example, the axis 532 may be located within a distance no greater than three and one-half times a minimum pitch between any two adjacent columns of terminals from a line which is parallel to and equidistant from the first and second edges 540, 541 of the substrate. Alternatively, this axis of symmetry 532 can be offset in a horizontal direction 535 from the central axis that is equidistant between edges 540, 541.

In a particular example, terminals in the first and second grids can be located in a central region of the package. In one example, at least one column 536 of terminals in each of the first and second grids 514, 524 can be disposed within a distance not greater than three and one-half times the minimum pitch between any two adjacent parallel columns 536 of the terminals from a line which is equidistant from and parallel to the first and second edges 540, 541 of the substrate.

As mentioned above, the second terminals 506 can be configured to carry information other than the above-noted address information or other than signals of the above-noted command-address bus. In one example, the second terminals 506 can include terminals used for carrying uni-directional or bi-directional data signals to and or from the microelectronic element, and data strobe signals, as well as data masks and ODT or "on die termination" signals used to turn on or off parallel terminations to termination resistors. In particular examples, the second terminals may carry signals such as chip select, reset, clock enable, as well as reference potentials such as power supply voltages, e.g., Vdd, Vddq, or ground, e.g., Vss and Vssq.

In some embodiments it is possible for some or all terminals that are configured to carry signals other than the command-address bus signals to be disposed as second terminals 506 on the package, wherever they can be suitably placed. For example, some or all of the second terminals 506 can be arranged in the same grids 514, 524 on the substrate 502 in which the first terminals 504 are arranged. Some or all of the second terminals 506 may be disposed in the same column or in different columns as some or all of the first terminals 504. In some cases, one or more second terminals can be interspersed with the first terminals in the same grids or column thereof.

In a particular example, as can be seen in FIG. 6D, some or all of the second terminals 506 can be disposed in a third area or grid 516 exposed at the first surface 510 of the substrate, and another set of the second terminals can be disposed in a fourth area or grid 526 exposed at the first surface 510. In a particular case, the signal assignments of the second terminals in the third area or grid 516 can be a mirror image of the signal assignments of the second terminals in the fourth area or grid 526, in like manner to that described above for the first and second grids.

The third and fourth grids 516, 526 may in some cases extend in the direction 542 in which the first and second grids extend and can be parallel to one another. The third and fourth grids may also be parallel to the first and second grids 514, 524. Alternatively, referring to FIG. 6F, grids 527, 537 in which second terminals are disposed can extend in another direction 535 which is transverse to or even orthogonal to direction 542. In another example, some second terminals can be disposed within each of the grids 516, 526, 527 and 537 shown in FIG. 6D. Some second terminals may or may not also be disposed at positions within the first and second grids 514, 524.

Also, as shown in FIG. 6D, the signal class assignments of the second terminals in grid 527 can be symmetric about the vertical axis 532, and the signal class assignments of the second terminals in grid 537 can be symmetric about the vertical axis 532. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in grid 527, the second terminals having signal assignments DQSH and DQSL are symmetric about the vertical axis 532 with respect to their signal class assignment, which is data strobe, even though those second terminals have different signal assignments.

As further shown in FIG. 6F, the assignments of the data signals to the spatial positions of the second terminals on the microelectronic package, such as for data signals DQ0, DQ1, . . . , for example, can have modulo-X symmetry about the vertical axis 532. The modulo-X symmetry can help preserve signal integrity in an assembly 600 or 754 such as seen in FIGS. 7A and 7B, in which one or more pairs of first and second packages are mounted opposite one another to a circuit panel, and the circuit panel electrically connects corresponding pairs of second terminals of those first and second packages in each oppositely mounted package pair. When the signal assignments of terminals have "modulo-X symmetry" about an axis, terminals that carry signals which have the same number "modulo-X" are disposed at positions which are symmetric about the axis.

Thus, in such assembly 600 or 754 such as in FIGS. 7A and 7B, modulo-X symmetry can permit electrical connections to be made through the circuit panel so that a terminal DQ0 of a first package can be electrically connected through the circuit panel to a terminal DQ8 of the second package which has the same number modulo X (X being 8 in this case), so that the connection can be made in a direction essentially straight through, i.e., normal to, the thickness of the circuit panel. Thus, a number resulting from the operation 8 modulo 8 is 0, and a number resulting from the operation 9 modulo 8 is 1. Therefore, when the signal assignments have modulo-8 symmetry, a terminal which is configured to carry a signal such as DQ1, for which the modulo 8 operation yields a result of "1", is disposed at a position on the substrate which is symmetric about an axis with another terminal configured to carry a signal such as DQ9 or DQ17 for which the modulo 8 operation yields the same result, i.e., "1".

In one example, "X" can be a number 6n (2 to the power of n), wherein n is greater than or equal to 6, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 6D, the signal assignment of a package terminal DQ0 in grid 527 is configured to carry data signal DQ0 is symmetric about the vertical axis 532 with the signal assignment of another package terminal DQ8 configured to carry data signal DQ8. Moreover, the same is true for the signal assignments of package terminals DQ0 and DQ8 in grid 537137 about the vertical axis, and the same is also true for grid 537. Modulo-8 symmetry such as described herein can be seen in grids 527, 537 with respect to each of the signal assignments of package terminals DQ0 through DQ15.

It is important to note that, although not shown, the modulo number "X" can be a number other than 6n (2 to the power of n) and can be any number greater than two. Thus, the modulo number X upon which the symmetry is based can depend upon how many bits are present in a data size for which the package is constructed or configured. For example, when the data size is bits instead of 8, then the signal assignments may have modulo-10 symmetry. It may even be the case that when the data size has an odd number of bits, the modulo number X can have such number.

In one example, the microelectronic structures having a ball-out, i.e., terminal configuration, such as represented in FIG. 6D, can be used for microelectronic structures which include microelectronic elements which operate according to the industry standard DDR3 or DDR4 specification.

Figure 6G:
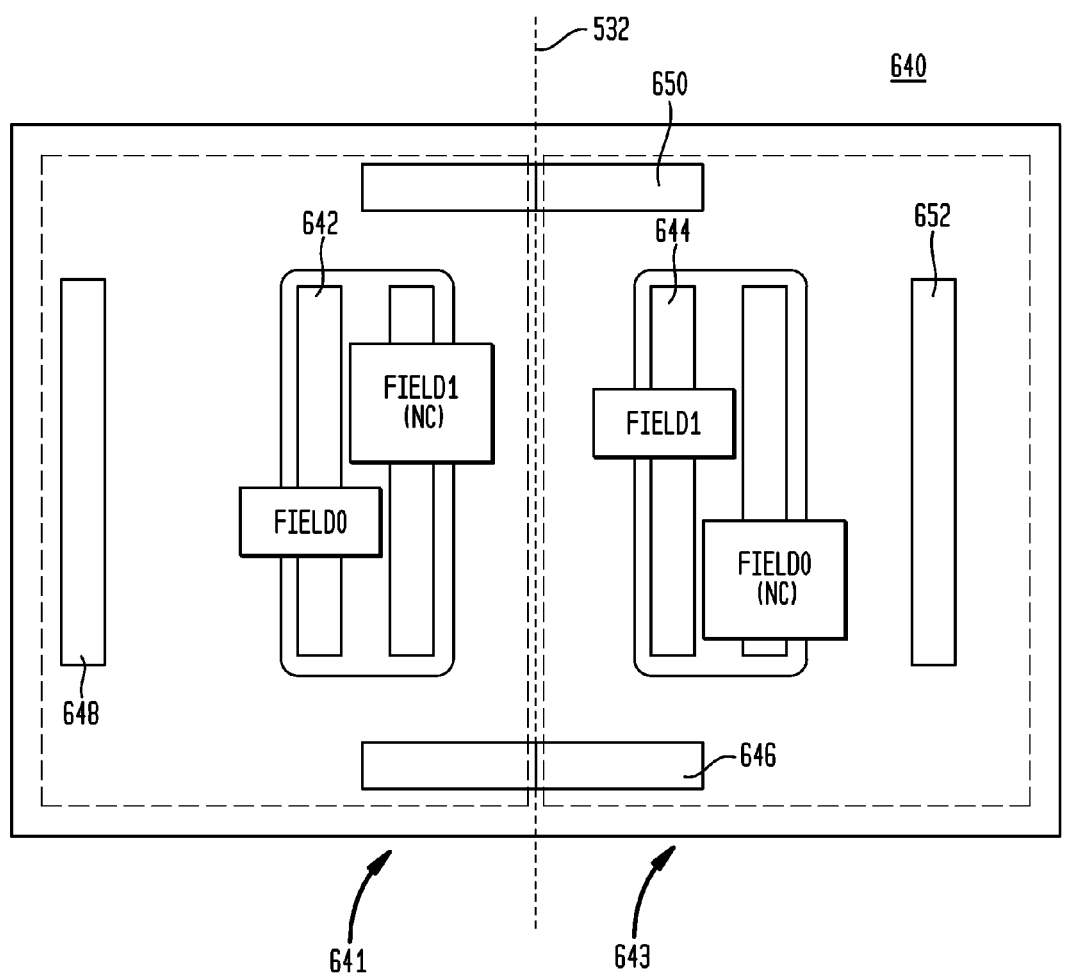
FIG. 6G is a plan view illustrating an arrangement of terminals on a microelectronic structure according to an embodiment of the invention.

The variation of FIG. 6G illustrates another way in which symmetry can be provided between a first set 642 of first terminals disposed on a first side 641 of a theoretical plane 532 of the microelectronic structure 640, and a second set 644 of the first terminals disposed on the second side 643 of the theoretical plane. In this example, as in the above examples, each of the first and second sets of first terminals can be configured to carry address information sufficient to specify a location within the memory storage array. In some cases, each set 642, 644 may carry only a majority of the address information needed to specify a location within the memory storage array.

In an example as shown in FIG. 6C, there can be a set of no-connect terminals on each side of a theoretical plane 532 which may not be needed to transfer address information to the address inputs of one or more memory storage arrays in the microelectronic structure. As used herein, a "no-connect terminal" of a microelectronic structure means a terminal which is not connected in any electrical path, e.g., path for conducting information to any microelectronic element, e.g., semiconductor chip, within the microelectronic structure, whether or not there is ever any information present on such no-connect terminal. Thus, even if information may be present on a no-connect terminal such as may be coupled thereto from another component external to the microelectronic structure that is connected to the no-connect terminal, the information present on the no-connect terminal is not in any path to be provided to any microelectronic element within the microelectronic structure.

In this case, the position of each first terminal on the first side can be symmetric about the theoretical plane 532 with a position of a no-connect terminal on the second side of the plane 532, and the position of each first terminal on the second side is symmetric about the theoretical plane with a position of a no-connect terminal on the first side. Thus, as seen in FIG. 6G, the position of each first terminal in a set of first terminals on a first side 641 of the plane, indicated as Field0 (642), for example, is symmetric about the theoretical plane 532 with the position of a no-connect terminal in a set of no-connect terminals disposed on the second side 643 of the plane 532, indicated as Field0(NC) (e.g., shown in FIG.

6G as NC in the first set 642 of first terminals). Also, in FIG. 6G, the position of each first terminal in a set thereof on a second side 643 of the plane 532, indicated as Field1 (644), is symmetric about the theoretical plane 532 with the position of a no-connect terminal in a set of no-connect terminals disposed on the first side 641 of the plane, indicated as Field1 (NC).

The set of first terminals and the set of no-connect terminals on the same side (e.g., the first side 641) of the plane can be disposed at any suitable positions so long as the above-described requirements for symmetry between first terminals on a side and the no-connect terminals on the side opposite thereto are met. The space in which the set of first terminals on a side of the plane 532 are disposed need not be contiguous. The space in which the set of no-connect terminals on a side of the plane 532 are disposed also need not be contiguous. Thus, the positions of the set of first terminals indicated as of Field0 (642) and the set of no-connect terminals indicated as Field1(NC) on the same first side 641 of the theoretical plane need not occupy non-overlapping areas of the surface of the structure, i.e., the positions of the first terminals in the set thereof on the first side 641 can be disposed at any suitable positions relative to the no-connect terminals on the first side 641, including being intermixed with one another. Moreover, the same relationship can apply to first terminals and no-connect terminals on the second side of the plane 532 as well. Indeed, in one example, each of the first terminals and each of the no-connect terminals on a side of the plane may be disposed at any positions in a common grid.

In one example, the microelectronic structures having a ball-out, i.e., terminal configuration such as represented in FIG. 6C or 6G can be used for microelectronic structures which include microelectronic elements compliant with the industry standard LPDDR3 specification.

In another example, shown in FIG. 6C, the terminals in each set of first terminals and the terminals in each set of no-connect terminals need not be located on the same side (e.g., the first side 641) of the plane 532 can be disposed at any suitable positions on either side of the plane so long as the above-described requirements for symmetry between each first terminal on a side (e.g., the first side 641) and the no-connect terminals on the side opposite thereto (e.g., the second side 642) are met. Thus, a first set of first terminals, indicated by the black rectangles, and a second set of first terminals, indicated by the black ovals, may be distributed across both sides of the plane 532. Each set of first terminals and each set of no-connect terminals need not be located on the same side (e.g., the first side 641) of the 532 plane can be disposed at any suitable positions on either side of the plane so long as the above-described requirements for symmetry between each first terminal on a side (e.g., the first side 641) and the no-connect terminals on the side opposite thereto (e.g., the second side 642) are met. For example, it can be seen in FIG. 6C each terminal in the a set of first terminals, indicated by the black rectangles, and each terminal in a second set of first terminals, indicated by the black ovals, is symmetric with a no-connect terminal (NC) on the opposite side of the plane therefrom.

FIG. 7A illustrates an assembly 600 of first and second microelectronic packages 500A, 500B, as mounted to opposite first and second surfaces 550, 552 of a circuit panel 554. Although microelectronic structures having a specific internal structure are shown, in some examples, each microelectronic structure 500 may be as shown and described above with reference to FIG. 6B or 6C, or as otherwise shown and described herein. Each microelectronic structure 500A may have the same internal structure as the microelectronic structure 500B mounted opposite thereto, or the microelectronic structure 500A may have a different internal structure from the other microelectronic structure 500B. The circuit panel can be of various types, such as a printed circuit board used in a dual-inline memory module ("DIMM") module, a circuit board or panel to be connected with other components in a system, or a motherboard, among others. The first and second microelectronic structures 500A, 500B can be mounted to corresponding contacts 560, 562 exposed at the first and second surfaces 550, 552 of the circuit panel 554, respectively.

As particularly shown in FIG. 7A, because the signal assignments of the first terminals in the second grid of each package are a mirror image of the signal assignments of the first terminals in the first grid of each package, when the packages 500A, 500B are mounted to the circuit panel opposite one another, each first terminal in the first grid 514A of the first package 500A can be aligned with the corresponding first terminal in the second grid 524B of the second package 500B which has the same signal assignment and to which it is electrically connected. Moreover, each first terminal in the second grid 524A of the first package 500A can be aligned with the corresponding first terminal in the first grid 514B which has the same signal assignment and to which it is electrically connected.

To be sure, the alignment of each pair of connected terminals can be within a tolerance, such that each pair of connected terminals can be aligned within one ball pitch of one another in orthogonal x and y directions along the first surface 550 of the circuit panel 554. As evident from FIG. 7A, the first terminals of each grid can be aligned within one ball pitch of one another in x and y orthogonal directions parallel to the first surface 550 of the circuit panel, the ball pitch being no greater than a minimum pitch between any two adjacent parallel columns of the terminals on either package. In a particular example, the grids may be aligned with one another in the x and y directions such that at least some of the first terminals on the first and second microelectronic packages are coincident with one another. As used herein, when the first terminals of packages at opposite surfaces of a circuit panel are "coincident" with one another, the alignment can be within customary manufacturing tolerances or can be within a tolerance of less than one-half of one ball pitch of one another in x and y orthogonal directions parallel to the first and second circuit panel surfaces, the ball pitch being as described above.

In a particular example, at least half of the positions of the aligned grids of the respective first and second packages 500A, 500B (e.g., the first grid 514A of the first package and the second grid 524B of the second package) can be aligned with one another in orthogonal x and y directions along the first surface 550 of the circuit panel 554.

Thus, as further shown in FIG. 7A, a particular first terminal that carries a signal marked "A" in grid 514A of the first package 500A is aligned with the corresponding first terminal of grid 524B of the second package 500B that carries the same signal "A". The same is also true regarding a particular first terminal that carries a signal marked "A" in grid 524A of the first package 500A that is aligned with the corresponding first terminal of grid 514B of the second package 500B that carries the same signal "A".

In this way, as further seen in FIG. 7A, the lengths of the electrical connections through the circuit panel between each pair of electrically connected first terminals of the first and second packages 500A, 500B can be significantly reduced, in that the terminals in each of these pairs of electrically connected second terminals may overlie one another, or at least be aligned within one ball pitch of one another. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

As further shown in FIG. 7A, when the second terminals of each package 500A, 500B are arranged in third and fourth grids having the specific mirror image arrangement described above with respect to FIG. 6D, for example, each terminal of each package's third grid can be aligned with the corresponding second terminal of the other package's fourth grid which has the same signal assignment and to which it is electrically connected. Thus, as seen in FIG. 7A, each terminal in the third grid 516A of the first package 500A can be aligned within one ball pitch of the corresponding terminal in the fourth grid 526B of the second package 500B which has the same signal assignment and to which it is electrically connected. Moreover, each terminal in the grid 526A of the first package 500A can be aligned within one ball pitch of the corresponding terminal in the third grid 516B which has the same signal assignment and to which it is electrically connected. Again, the alignment of each pair of connected terminals is within a tolerance, such that each pair of connected terminals can be aligned within one ball pitch of one another in orthogonal x and y directions along the first surface 550 of the circuit panel 554. In a particular embodiment, the alignment can be such that the corresponding connected terminals of the packages 500A, 500B are coincident with one another.

Thus, as further shown in FIG. 7A, a particular first terminal that carries a signal marked "B" in grid 516A of the first package 500A can be aligned within one ball pitch of the corresponding first terminal of grid 526B of the second package 500B that carries the same signal "B" and to which it is electrically connected. The same is also true regarding a particular first terminal that carries a signal marked "B" in grid 526A of the first package 500A that can be aligned within one ball pitch of the corresponding first terminal of grid 516B of the second package 500B that carries the same signal "B" and to which it is electrically connected.

Similar to the connections between corresponding first terminals 504 of first and second packages as described above, in this embodiment, the lengths of the electrical connections through the circuit panel between pairs of electrically connected second terminals 506 of the first and second packages can be significantly reduced, in that the terminals in each of these pairs of electrically connected second terminals may be coincident with one another, or at least be aligned within one ball pitch of one another in orthogonal x and y directions parallel to the circuit panel surface. Moreover, benefits similar to those described above for reducing stub lengths and simplifying the construction of a circuit panel for the connections between the first and second packages may be obtained when the second terminals of a microelectronic package are arranged in this way, i.e., terminals which can be assigned to carry signals other than the above-noted signals of the command-address bus.

Figure 7C:
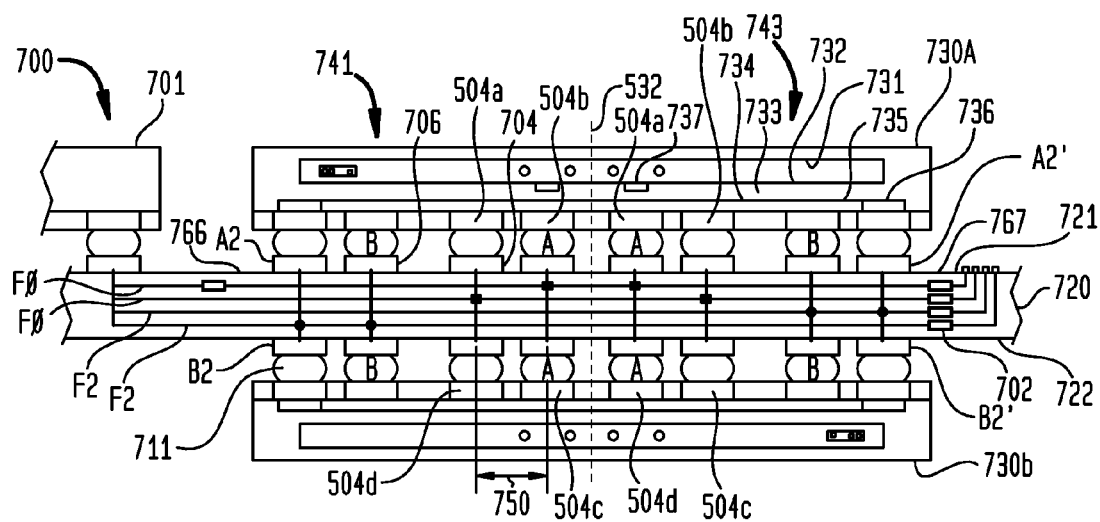
FIGS. 7C and 7D are sectional views illustrating microelectronic assemblies according to variations of the embodiment of the invention seen in FIG. 7B.

FIG. 7C illustrates a microelectronic assembly 700 including a circuit panel 720 that is configured for coupling to one or more microelectronic packages 730 (shown in FIG. 7C as 730A, 730B). Each microelectronic package 730 can be the microelectronic package 500 shown in FIG. 6B (e.g., a DDR3 or DDR4 package), or the microelectronic package 640 shown in FIG. 6C (e.g., an LPDDR3 package). The circuit panels having the configurations shown in FIGS. 7C though 7H can have either type of microelectronic package 500 or 640 coupled thereto.

As can be seen in FIG. 7C, each of the microelectronic packages 730 can include one or more semiconductor chips 731 and can include a dielectric layer 733 having a surface 734 overlying a face 732 of at least one of the one or more semiconductor chips. The surface 734 of the dielectric layer 733 can face away from the face 732 of the one or more semiconductor chips 731. Each of the microelectronic packages 730 can include traces 735 extending along the dielectric layer 733 and metalized vias 736 extending from the traces and electrically connected with address inputs 737 exposed at the face 732 of the at least one of the one or more semiconductor chips. Each microelectronic package 730 can be configured to couple address information received on the first terminals 504 to the address inputs 737 through the traces 735 and the metalized vias 736.

Referring to FIG. 7B, the circuit panel 720 can have contacts 760 exposed at a first connection site 761 of a major surface 721 of the circuit panel, and contacts 762 exposed at a second connection site 763 of a second surface 722 of the circuit panel opposite from the major surface. The contacts 760, 762 can be configured to be coupled to terminals 504 and 506 exposed at a front surface of a microelectronic package 500 (FIG. 6B) or terminals 642, 644, 646, 648, 650, and 652 exposed at a front surface of a microelectronic package 640 (FIG. 6C). A first connection site 761 can have a peripheral boundary 764 on the major surface 721 surrounding a group of the contacts 760 that is configured to be coupled to a single first microelectronic package 730A. A second connection site 763 can have a peripheral boundary 765 on the second surface 722 surrounding a group of the contacts 762 that is configured to be coupled to a single second microelectronic package 730B.

The contacts 760 exposed at the first connection site 761 of the major surface 721 can include first and second sets A0, A0' of first contacts 704 disposed on respective first and second opposite sides 741, 743 of a theoretical plane 532 normal to the major surface 721. Signal assignments of the first set A0 of first contacts 704 can be symmetric about the theoretical plane 532 with signal assignments of the second set A0' of first contacts. The contacts 760 can also include third and fourth sets A1', A1 of first contacts 704 disposed on the respective first and second sides 741, 743 of the theoretical plane 532. Signal assignments of the third set A1' of first contacts 704 can be symmetric about the theoretical plane with signal assignments of the fourth set A1 of first contacts. Each of the sets A0, A0', A1', and A1 of first contacts 704 can be configured to carry identical signals, and each of the sets of first contacts can be configured to carry address information sufficient to specify a location within the memory storage array of a first microelectronic package 730A that is coupled to the contacts 760.

The contacts 762 exposed at the second connection site 763 of the second surface 722 can include fifth and sixth sets B0', B0 of first contacts 704 disposed on respective first and second opposite sides 741, 743 of the theoretical plane 532. Signal assignments of the fifth set B0' of first contacts 704 can be symmetric about the theoretical plane 532 with signal assignments of the sixth set B0 of first contacts. The contacts 762 can also include seventh and eighth sets B1, B1' of first contacts 704 disposed on the respective first and second sides 741, 743 of the theoretical plane 532. Signal assignments of the seventh set B1 of first contacts 704 can be symmetric about the theoretical plane with signal assignments of the eighth set B1' of first contacts. Each of the sets B0, B0', B1', and B1 of first contacts 704 can be configured to carry identical signals, and each of the sets of first contacts can be configured to carry address information sufficient to specify a location within the memory storage array of a second microelectronic package 730B that is coupled to the contacts 762.

In one example, the first and fifth sets A0, B0' of first contacts 704 can be aligned with one another in the x and y orthogonal directions parallel to the major surface 721 of the circuit panel 720, and the second and sixth sets A0', B0 of the first contacts 704 can be aligned with one another in the x and y orthogonal directions. The alignments of the first and fifth sets A0, B0' of first contacts 704 and the second and sixth sets A0', B0 of the first contacts can be within a distance equal to a minimum pitch 750 (FIG. 7C) between adjacent ones of the first contacts.

Similarly, the third and seventh sets A1', B1 of first contacts 704 can be aligned with one another in the x and y orthogonal directions parallel to the major surface 721 of the circuit panel 720, and the fourth and eighth sets A1, B1' of the first contacts 704 can be aligned with one another in the x and y orthogonal directions. The alignments of the third and seventh sets A1', B1 of first contacts 704 and the fourth and eighth sets A1, B1' of the first contacts can be within a distance equal to a minimum pitch 750 (FIG. 7C) between adjacent ones of the first contacts.

In one example, the contacts 704 of each of the sets of first contacts A0, A0', A1', A1, B0, B0', B1', and B1 can be arranged in at least one respective column extending in a direction Y parallel to the theoretical plane 532. The second contacts 706 (FIG. 7C) can also be arranged in one or more columns extending in a direction Y parallel to the theoretical plane 532, or in a direction X perpendicular to the theoretical plane, or at least one column extending in the direction X and at least one column extending in the direction Y, as shown for example in FIG. 6C.

In other examples, each of the sets of the first contacts 704 can be disposed at any suitable positions so long as the above-described requirements for symmetry about the theoretical plane 532 are met. The space in which a particular set of first contacts 704 on a side of the theoretical plane 532 are disposed need not be contiguous. For example, the first contacts 704 of the first set A0 and the third set A1' can be intermixed with one another at locations within a first common grid of terminals on the first side 741 of the theoretical plane 532, and the first contacts of the second set A0' and the fourth set A1 can be intermixed with one another at locations within a second common grid of terminals on the second side 743 of the theoretical plane.

For a particular circuit panel 720 according to the embodiment of FIG. 7B, the microelectronic package 730A coupled to the contacts 760 and the microelectronic package 730B coupled to the contacts 762 can be one of a first type microelectronic package such as the microelectronic package 640 shown in FIG. 6B, or a second type microelectronic package 500 shown in FIG. 6C.

In an example where the microelectronic package 730A is a first type microelectronic package such as the microelectronic package 640 shown in FIG. 6G (e.g., a LPDDR3 package), the terminals of the first type microelectronic package can include first terminals 642, 644 (Field0 and Field1 of FIG. 6G) configured to be coupled to the first and fourth sets A0, A1 of first contacts 704 and no-connect terminals (Field0 NC and Field1 NC of FIG. 6G) configured to be coupled to the second and third sets A0', A1' of first contacts. As described above with reference to FIG. 6G, and as shown in FIG. 6C, the position of each first terminal 642 on the first side 641 of the theoretical plane can be symmetric about the theoretical plane 532 with a position of a no-connect terminal on the second side 643, and the position of each first terminal 644 on the second side can be symmetric about the theoretical plane with a position of a no-connect terminal on the first side.

Figure 7D:
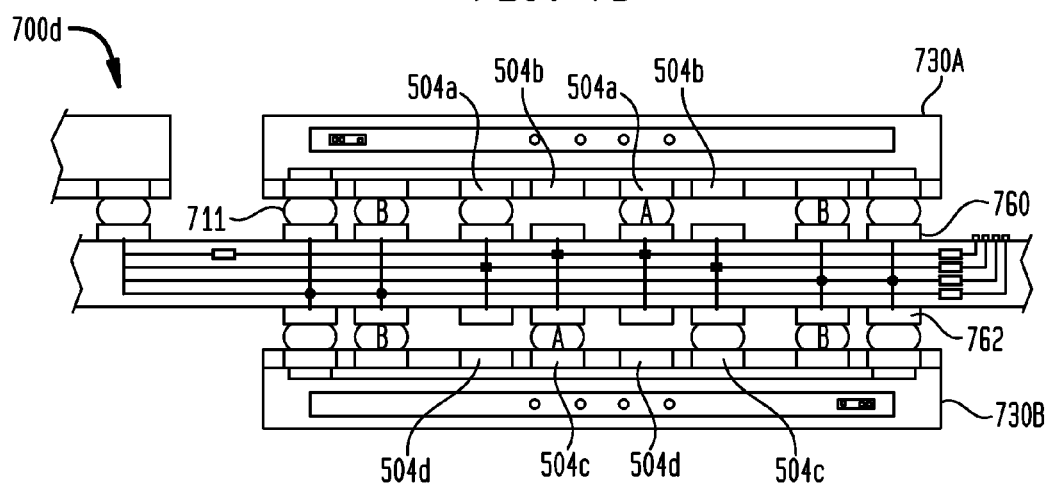

In the example shown in FIG. 7D, when the microelectronic packages 730 are first type microelectronic package (e.g., a LPDDR3 package), the terminals 504a of the first microelectronic package 730A and the terminals 504c of the second microelectronic package 730B can be first terminals 504 as described above, and the terminals 504c of the first microelectronic package 730A and the terminals 504d of the second microelectronic package 730B can be no-connect terminals as described above. In such an example, each of the microelectronic packages 730A and 730B can have a set of first terminals connected to each of the busses F0 and F1, and each of the microelectronic packages 730A and 730B can two sets of no-connect terminals, each set of no-connect terminals being symmetric about the theoretical plane 532 with the positions of a set of first terminals on the other side of the theoretical plane.

As described above, each no-connect terminal 504b and 504d is not connected in any electrical path, e.g., path for conducting information to any microelectronic element, e.g., semiconductor chip, within the microelectronic package 730A or 730B, whether or not there is ever any information present on such no-connect terminal. As shown in FIG. 7C, electrically conductive joining units 711 (e.g., solder balls) can extend between all of the terminals of each microelectronic package 730A and 730B and corresponding circuit panel contacts 760 and 762. However, in such an embodiment, the no-connect terminals 504b and 504d, while connected to corresponding circuit panel contacts 760 and 762, are not connected within the microelectronic package 730 in any electrical path for conductive information to a semiconductor chip 731 within the microelectronic package.

In an example where the microelectronic package 730A is a second type microelectronic package such as the microelectronic package 500 shown in FIG. 6B (e.g., a DDR3 or DDR4 package), the terminals of the second type microelectronic package including first terminals 504 configured to be coupled to the first, second, third, and fourth sets A0, A0', A1', and A1 of first contacts 704. In such an example, all of the terminals 504a, 504b, 504c, and 504d can be first terminals 504. As shown and described above with reference to FIG. 6B, the signal assignments of the first terminals on the first side of the theoretical plane 532 (e.g., located at positions within the first grid 514) can be a mirror image of the signal assignments of the first terminals on the second side of the theoretical plane (e.g., located at positions within the second grid 524).

Referring again to FIG. 7B, the circuit panel 720 can include at least one bus F0, F1 having a plurality of signal lines 708 configured to carry all of the address information transferred to the contacts 704, 706. The first contacts 704 can be electrically connected with the at least one bus F0, F1. For example, the first and fourth sets A0, A1 of first contacts 704 can be electrically connected with the first bus F0, and the second and third sets A0', A1' of first contacts can be electrically connected with the second bus F1.

In one example, the at least one bus F0, F1 can extend in a first direction X parallel to the major surface 721, the first direction being transverse to the theoretical plane 532. In a particular example, the at least one bus F0, F1 can extend in a second direction Y parallel to the major surface 721, the second direction being parallel to the theoretical plane 532. Although the busses F0 and F1 are shown in FIG. 7B as separated from one another and each having a plurality of signal lines 708 extending parallel to one another, that need not be the case. In some embodiments, the signal lines 708 of the busses F0 and F1 can be located in the same plane as one another, and each individual signal line can include conductor portions extending in a plurality of planes and in a plurality of directions. In one example, the at least one bus F0, F1 can be configured to carry all of the command signals transferred to the contacts 704, 706, the command signals being write enable, row address strobe, and column address strobe signals.

As can be seen in FIG. 7B, the at least one bus F0, F1 can have a plurality of signal lines 708 configured to carry all of the address information transferred to the contacts 760, 762 of the first and second connection sites 761, 763. The contacts 760, 762 of the first and second connection sites 761, 763 can be electrically connected with the at least one bus F0, F1.

In the example shown in FIG. 7B, each set of contacts 760 at the major surface 721 is aligned in the X and Y directions with a corresponding set of contacts 762 at the second surface 722, and those corresponding sets of contacts can be connected to the same set of signal lines 708 in a bus F0 or F1. Such connections of opposing sets of contacts 760, 762 with the same bus are schematically shown in FIG. 7B at locations 707.

For example, the first set A0 of contacts 760 can be aligned in the X and Y directions with the fifth set B0' of contacts 762, and both sets A0 and B0' can be connected to the signal lines 708 in the bus F0 that are configured to carry the same set of address signals. The second set A0' of contacts 760 can be aligned in the X and Y directions with the sixth set B0 of contacts 762, and both sets A0' and B0 can be connected to the signal lines 708 in the bus F0 that are configured to carry the same set of address signals. In the example shown, all four sets A0, A0', B0, and B0' are connected to the same set of signal lines 708 in the same bus F0 that are configured to carry the same set of address signals.

Similarly, the third, fourth, seventh, and eighth sets of contacts A1', A1, B1, and B1' can be configured to carry the same set of address signals. For example, the third set A1' of contacts 760 can be aligned in the X and Y directions with the seventh set B1 of contacts 762, and both sets A1' and B1 can be connected to the signal lines 708 in the bus F1 that are configured to carry the same set of address signals. The fourth set A1 of contacts 760 can be aligned in the X and Y directions with the eighth set B1' of contacts 762, and both sets A1 and B1' can be connected to the signal lines 708 in the bus F1 that are configured to carry the same set of address signals. In the example shown, all four sets A1, A1', B1, and B1' are connected to the same set of signal lines 708 in the same bus F1 that are configured to carry the same set of address signals.

In such an example, the circuit panel 720 can be configured to carry two identical sets of address information signals: a first set in the bus F0 that is connected to the first, second, fifth, and sixth sets A0, A0', B0', B0 of contacts; and a second set in the bus F1 that is connected to the third, fourth, seventh, and eighth sets A1', A1, B1, B1' of contacts.

In a particular example, the circuit panel 720 can have a second connection site at the major surface, which is schematically shown in FIG. 7B as connection site 768. In such an example, the structure of the contacts of the first connection site 761 can be duplicated at the second connection site 768, such that the second connection site 768 can have fifth, sixth, seven, and eighth sets of contacts 760 that are electrically connected to the signal lines 708 in the same at least one bus F0, F1 as the contacts at the first connection site.

In such an example, the first and second sets of contacts 760 at the first connection site 761 and the fifth and sixth sets of contacts at the second connection site 768 can be connected to the same set of signal lines 708 in the same bus F0 that are configured to carry the same set of address signals. Similarly, the third and fourth sets of contacts 760 at the first connection site 761 and the seventh and eighth sets of contacts at the second connection site 768 can be connected to the same set of signal lines 708 in the same bus F1 that are configured to carry the same set of address signals.

As in the above-described embodiments, each set of first contacts A0, A0', A1, A1', B0, B0', B1, and B1' can be configured to carry sufficient address information to uniquely specify a storage location within the memory storage array of the microelectronic element 730 to which the set of first contacts is connected. In other cases, each set of first contacts A0, A0', A1, A1', B0, B0', B1, and B1' can be configured to carry only a majority of the signals necessary to uniquely specify a storage location within the memory storage array of the microelectronic element 730 to which the set of first contacts is connected.

Referring now to FIG. 7C, the contacts 760 exposed at the major surface 721 can also include first and second sets A2, A2' of second contacts 706 disposed on the respective first and second sides 741, 743 of the theoretical plane 532, the first set A2 of second contacts being disposed between the a first edge 766 of the peripheral boundary 764 (FIG. 7B) and the first and third sets A0, A1' of first contacts 704, the second set A2' of second contacts being disposed between a second edge 767 of the peripheral boundary opposite from the first edge and the second and fourth sets A0', A1 of first contacts. The first and second sets A2, A2' of second contacts 706 together can be configured to carry data bus and data strobe signals.

Referring to FIG. 7C, the circuit panel 720 can have at least one second bus F2 that is electrically connected with at least some of the second contacts 706. Such a second bus F2 can have a plurality of signal lines 708 configured to carry information other than the address information. In such an embodiment, at least one first bus F0, F1 can be electrically connected with at least some of the first contacts 704 and can have a plurality of signal lines 708 configured to carry all of the address information transferred to the contacts 704 and 706, and at least one second bus F2 electrically connected with at least some of the second contacts 706 can be configured to carry information other than the address information.

The microelectronic assembly 700 can include a driving element 701 electrically connected to the at least one bus F0, F1. The driving element 701 can also be electrically connected to the at least one second bus F2. The driving element 701 can be, for example, a microprocessor or a direct memory access controller ("DMA controller").

The circuit panel 720 can optionally include one or more terminal resistors 702, which can be connected to a terminal voltage source. One or more of the plurality of signal lines 708 of one or more of the busses F0, F1, and F2 can optionally be electrically connected to a terminal resistor 702.

FIG. 7D shows a microelectronic assembly 700d that is a variation of the microelectronic assembly 700 of FIGS. 7A and 7C, where the microelectronic package 730A is a first type microelectronic package such as the microelectronic package 640 shown in FIG. 6C (e.g., a LPDDR3 package), and electrically conductive joining units 711 extend between the first terminals 504a and 504c of each microelectronic package 730A and 730B, and corresponding circuit panel contacts 760 and 762, but electrically conductive joining units are omitted between the no-connect terminals 504*b* and 504*d* of each microelectronic package 730A and 730B and the corresponding circuit panel contacts 760 and 762 that face the no-connect terminals.

Figure 7E:
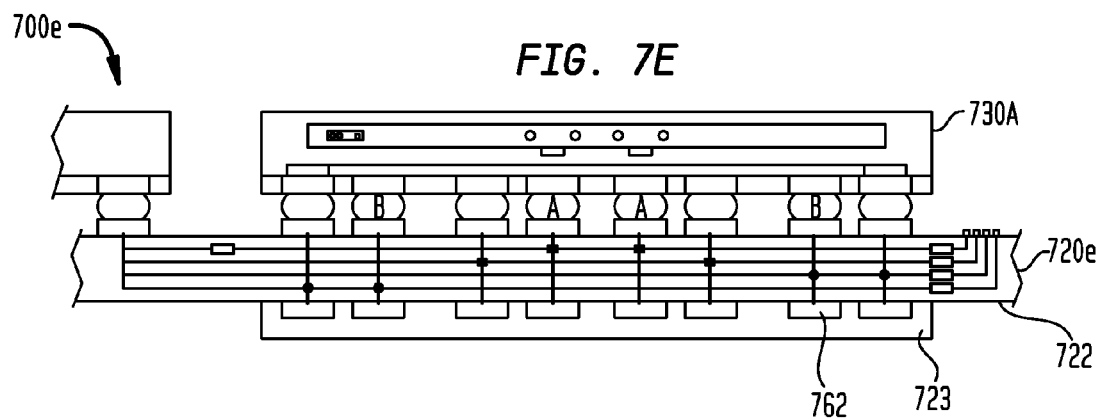
FIGS. 7E-7H are sectional views illustrating microelectronic assemblies according to variations of the embodiments of the invention seen in FIGS. 7C and 7D.

FIG. 7E shows a microelectronic assembly 700*e* that is a variation of the microelectronic assembly 700 of FIGS. 7A and 7C, where the microelectronic package 730A can be either a first type microelectronic package such as the microelectronic package 640 shown in FIG. 6C (e.g., a LPDDR3 package) or a second type microelectronic package such as the microelectronic package 500 shown in FIG. 6B (e.g., a DDR3 or DDR4 package), but the microelectronic package 730B is omitted, and a dielectric layer 723 is provided overlying the second surface 722 of the circuit panel 720*e* and the overlying the contacts 762 at the second surface. In one example, the dielectric layer 723 can extend along the entire second surface 722. In the embodiment of FIG. 7E, the circuit panel 720*e* can be the same circuit panel as the circuit panel 720 of FIGS. 7A, 7C, and 7D, produced using the same production processes as the circuit panel 720, except that the circuit panel 720*e* can undergo an additional process to form the dielectric layer 723.

Figure 7F:
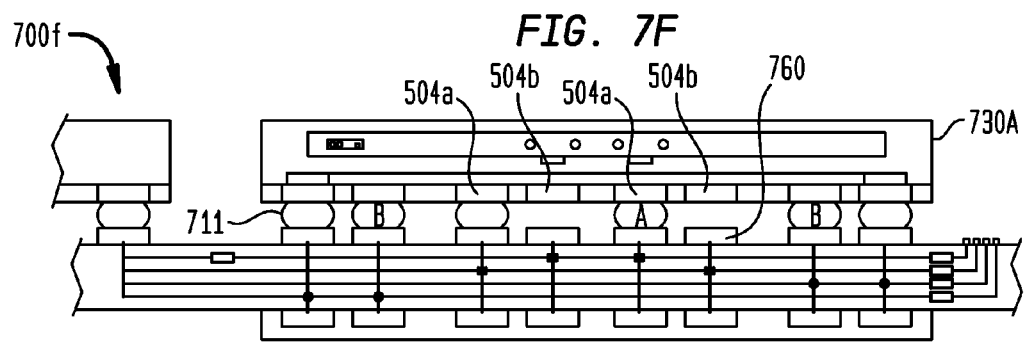

FIG. 7F shows a microelectronic assembly 700*f* that is a variation of the microelectronic assembly 700*e* of FIG. 7E, where the microelectronic package 730A is a first type microelectronic package such as the microelectronic package 640 shown in FIG. 6C (e.g., a LPDDR3 package), and electrically conductive joining units 711 extend between the first terminals 504*a* of the microelectronic package 730A, and corresponding circuit panel contacts 760, but electrically conductive joining units are omitted between the no-connect terminals 504*b* of the microelectronic package 730A and the corresponding circuit panel contacts 760 that face the no-connect terminals.

Figure 7G:
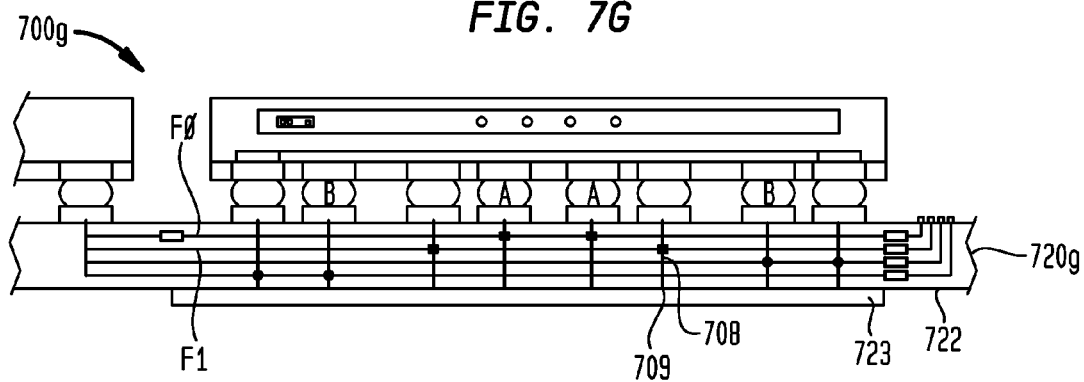

FIG. 7G shows a microelectronic assembly 700*g* that is a variation of the microelectronic assembly 700*e* of FIG. 7E, where the microelectronic package 730A can be either a first type microelectronic package such as the microelectronic package 640 shown in FIG. 6C (e.g., a LPDDR3 package) or a second type microelectronic package such as the microelectronic package 500 shown in FIG. 6B (e.g., a DDR3 or DDR4 package), but the contacts 762 at the second surface 722 are omitted, and a dielectric layer 723 is provided overlying the second surface 722 of the circuit panel 720*e*. Instead of having contacts at the second surface 722, the circuit panel 720*g* has a plurality of signal lines 708 connected to the at least one bus F0, F1, and at least some of the signal lines 708 terminate in an end 709 exposed at the second surface of the circuit panel. In the embodiment of FIG. 7G, the circuit panel 720*g* can be the same circuit panel as the circuit panel 720*e* of FIG. 7E, produced using the same production processes as the circuit panel 720*e*, except that the circuit panel 720*g* omit the additional process or portion of a process to form the contacts 762 at the second surface 722.

Figure 7H:
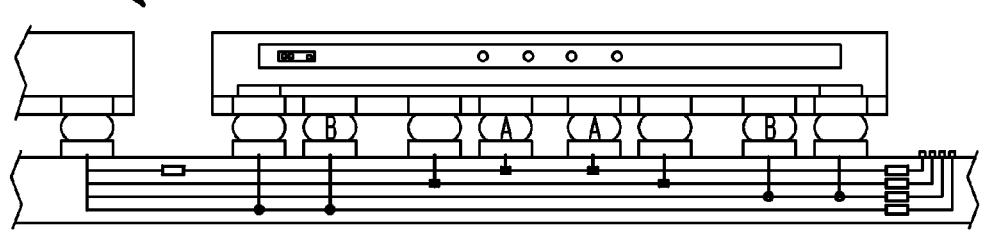

FIG. 7H shows a microelectronic assembly 700*h* that is a variation of the microelectronic assembly 700*g* of FIG. 7G, but the exposed ends 709 of the at least some of the signal lines 708 that are exposed at the second surface 722 are omitted, so that it is not necessary to form a dielectric layer overlying the second surface, because there are no exposed ends of the signal lines at the second surface that may need protection from oxidation.

Figure 7I:
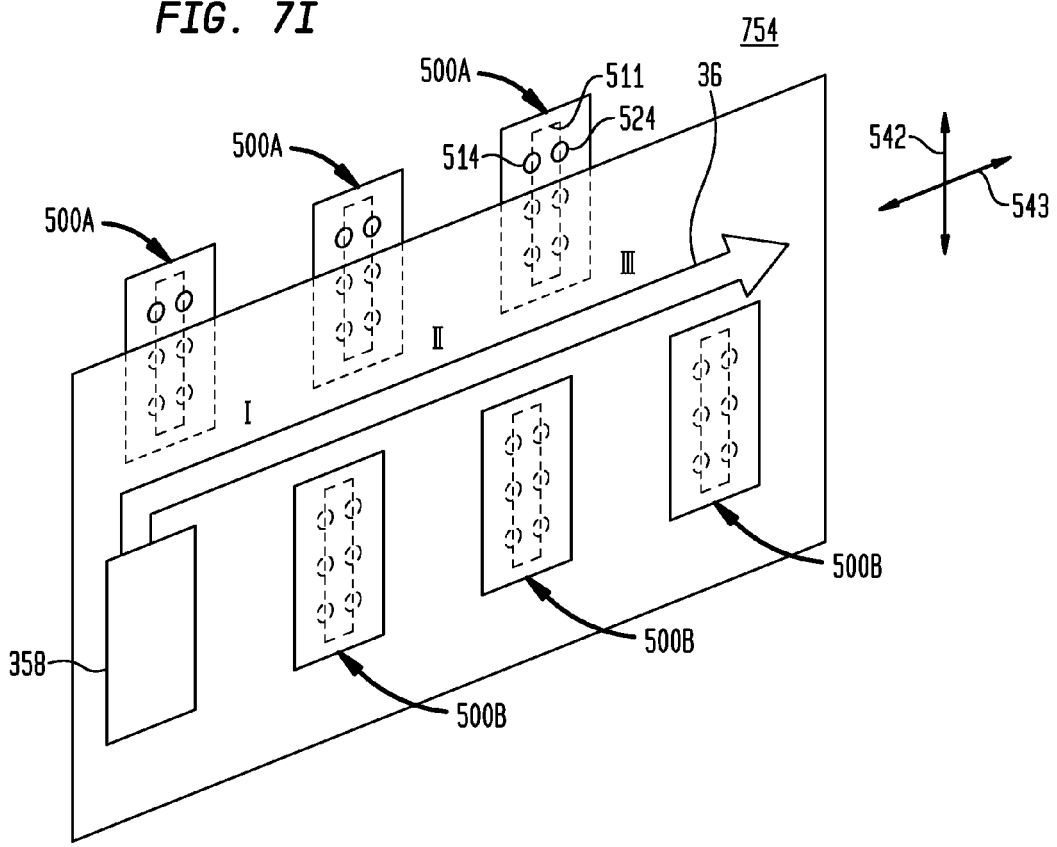
FIG. 7I is a schematic perspective view illustrating a microelectronic assembly according to an embodiment of the invention.

FIG. 7I further illustrates that two pairs 500A-500B, or a greater number of pairs of microelectronic packages each having a construction either as described above or hereinafter can be electrically interconnected with respective panel contacts on a circuit panel 754, e.g., a board of a dual-inline memory module ("DIMM"), in similar orientations as packages 500A, 500B. Thus, FIG. 7I shows three pairs of packages 500A-100B, each pair electrically interconnected with circuit panel 754 in opposite orientations facing one another as described above.

FIG. 7I illustrates a microelectronic assembly such as, for example, a DIMM, among others, incorporating a circuit panel and a plurality of microelectronic packages mounted opposite one another to first and second opposite surfaces thereof. As seen in FIG. 7I, the above-noted address information or in some cases, command-address bus signals can be routed on a bus 36, e.g., an address bus or command-address bus on the circuit panel or circuit board 754, in at least one direction 543 between connection sites I, II or III at which respective pairs of microelectronic packages 500A-100B are connected to opposite sides of the circuit panel. Signals of such bus 36 reach each pair of packages at the respective connection sites I, II or III at slightly different times. The at least one direction 543 can be transverse to or orthogonal to a direction 542 in which at least one column 511 of a plurality of contacts on at least one microelectronic element within each package 500A or 500B extends. In such way, the signal conductors of the bus 36 on (i.e., on or within) the circuit panel 754 can in some cases be spaced apart from one another in a direction 542 which is parallel to the at least one column 511 of contacts on a microelectronic element within a package 500A, or 500B connected to the circuit panel.

Such a configuration, particularly when the terminals of the first grid 504 of each microelectronic package are arranged in one or more columns extending in such direction 542, may help simplify the routing of signal conductors of one or more global routing layers on the circuit panel used to route the signals of the bus 36. For example, it may be possible to simplify routing of the command-address bus signals on a circuit panel when relatively few first terminals are disposed at the same vertical layout position on each package. Thus, in the example shown in FIG. 6C, the first and second grids 514, 524 of each package have only four terminals disposed at the same vertical layout position, such as, for example, the terminals of the first and second grids 514, 524 configured to receive address signals A3 and A1, as further shown in FIG. 6D.

In one embodiment, the microelectronic assembly 754 can have a microelectronic element 758 that can include a semiconductor chip configured to perform buffering of at least some signals transferred to the microelectronic packages 500A, 500B of the assembly 754. Such a microelectronic element 758 having a buffering function can be configured to help provide impedance isolation for each of the microelectronic elements in the microelectronic packages 500A and 500B with respect to components external to the microelectronic assembly 754.

In an exemplary embodiment, the microelectronic assembly 754 can have a microelectronic element 758 that can include a semiconductor chip configured predominantly to perform a logic function, such as a solid state drive controller, and one or more of the microelectronic elements in the microelectronic packages 500A and 500B can each include memory storage elements such as nonvolatile flash memory. The microelectronic element 758 can include a special purpose processor that is configured to relieve a central processing unit of a system such as the system 800 (FIG. 8) from supervision of transfers of data to and from the memory storage elements included in the microelectronic elements. Such a microelectronic element 754 including a solid state drive controller can provide direct memory access to and from a data bus on a motherboard (e.g., the circuit panel 802 shown in FIG. 8) of a system such as the system 800.

In such an embodiment of the microelectronic assembly 754 having a microelectronic element 758 that includes a controller function and/or a buffering function, the command-address bus signals can be routed between the microelectronic element 758 and each pair of packages 500A and 500B at respective connection sites I, II or III. In the particular example shown in FIG. 7I, a portion of the command-address bus that extends past the connection sites I, II or III can extend in the direction 543 or in another direction transverse to the direction 543 to reach contacts of the microelectronic element 758. In one embodiment, the command-address bus 36 can extend in the direction 543 to reach contacts of the microelectronic element 758.

Each of the examples illustrated and discussed above can be implemented with microelectronic elements therein having contacts on faces thereof which either face in the same direction which the first surface of the microelectronic assembly faces, or can face away from the direction in which the first surface of the microelectronic assembly faces. Thus, in particular examples, the microelectronic assemblies may be as shown and described in the examples of any of FIGS. 13-20 of commonly owned U.S. application Ser. No. 13/439,317, the disclosure of which is incorporated by reference herein.

Although the examples described above refer to the microelectronic elements overlying a substrate, the substrate may be omitted in an appropriate case, as when the microelectronic elements are arranged together within a molded unit, e.g., a wafer-level unit, in which a dielectric layer may be formed on or above contact-bearing faces of the microelectronic elements for supporting traces and electrical interconnections thereon.

In other examples, microelectronic assemblies having multiple stacked microelectronic elements therein may be single or multiple stack implementations as shown and/or described with reference to FIGS. 21-25 of commonly owned U.S. application Ser. No. 13/439,317, the disclosure of which is incorporated by reference herein.

In still other examples, microelectronic assemblies having four microelectronic elements therein may be as shown and described in FIGS. 9A-B, 9C, 9D, 9F, 9G, 9H, 12B, 12C or 12D of commonly owned U.S. application Ser. Nos. 13/337,565 and 13/337,575, or may be as shown and described in FIGS. 7A-B, 8, 11A, 11B, 11C, 11D, 12, 13B, 14B, or 14C of commonly owned U.S. application Ser. No. 13/354,747, the disclosures of which are incorporated by reference herein.

Figure 8:
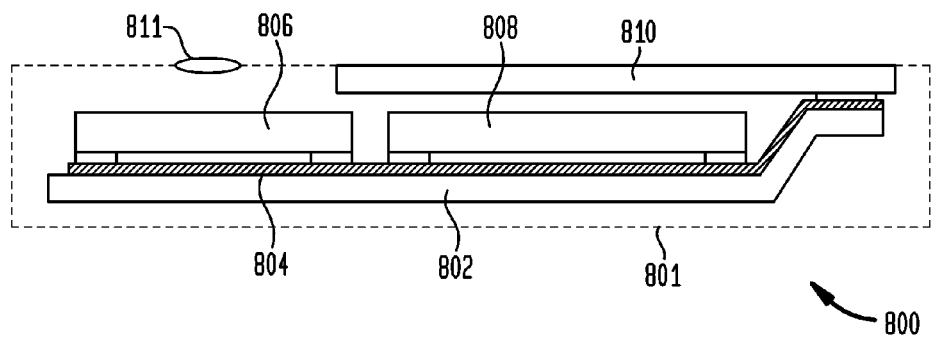
FIG. 8 is a schematic sectional view illustrating a system according to an embodiment of the invention.

The microelectronic packages and microelectronic assemblies described above with reference to FIGS. 1-7 above can be utilized in construction of diverse electronic systems, such as the system 800 shown in FIG. 8. For example, the system 800 in accordance with a further embodiment of the invention includes a plurality of modules or components 806 such as the microelectronic packages and/or microelectronic assemblies as described above in conjunction with other electronic components 808, 810 and 811.

In the exemplary system 800 shown, the system can include a circuit panel, motherboard, or riser panel 802 such as a flexible printed circuit board, and the circuit panel can include numerous conductors 804, of which only one is depicted in FIG. 8, interconnecting the modules or components 806, 808, 810 with one another. Such a circuit panel 802 can transport signals to and from each of the microelectronic packages and/or microelectronic assemblies included in the system 800. However, this is merely exemplary; any suitable structure for making electrical connections between the modules or components 806 can be used.

In a particular embodiment, the system 800 can also include a processor such as the semiconductor chip 808, such that each module or component 806 can be configured to transfer a number N of data bits in parallel in a clock cycle, and the processor can be configured to transfer a number M of data bits in parallel in a clock cycle, M being greater than or equal to N.

In the example depicted in FIG. 8, the component 808 is a semiconductor chip and component 810 is a display screen, but any other components can be used in the system 800. Of course, although only two additional components 808 and 811 are depicted in FIG. 8 for clarity of illustration, the system 800 can include any number of such components.

Modules or components 806 and components 808 and 811 can be mounted in a common housing 801, schematically depicted in broken lines, and can be electrically interconnected with one another as necessary to form the desired circuit. The housing 801 is depicted as a portable housing of the type usable, for example, in a cellular telephone or personal digital assistant, and screen 810 can be exposed at the surface of the housing. In embodiments where a structure 806 includes a light-sensitive element such as an imaging chip, a lens 811 or other optical device also can be provided for routing light to the structure. Again, the simplified system shown in FIG. 8 is merely exemplary; other systems, including systems commonly regarded as fixed structures, such as desktop computers, routers and the like can be made using the structures discussed above.

The microelectronic packages and microelectronic assemblies described above with reference to FIGS. 1-5 can also be utilized in construction of an electronic system such as the system 900 shown in FIG. 9. For example, the system 900 in accordance with a further embodiment of the invention is the same as the system 800 shown in FIG. 8, except the component 806 has been replaced by a plurality of components 906.

Each of the components 906 can be or can include one or more of the microelectronic packages or microelectronic assemblies described above with reference to FIGS. 1-5. In a particular example, one or more of the components 906 can be a variation of the component 5 shown in FIG. 1, in which the support structure 90 includes exposed edge contacts, and the support structure of each component 5 can be suitable for insertion into a socket 905.

Each socket 905 can include a plurality of contacts 907 at one or both sides of the socket, such that each socket 905 can be suitable for mating with corresponding exposed edge contacts of a corresponding component 906 such as the above-described variation of the component 5. In the exemplary system 900 shown, the system can include a second circuit panel 902 or motherboard such as a flexible printed circuit board, and the second circuit panel can include numerous conductors 904, of which only one is depicted in FIG. 9, interconnecting the components 906 with one another.

In a particular example, a module such as the system 900 can include a plurality of components 906, each component 906 being the above-described variation of the component 5. Each component 906 can be mounted to, and electrically connected with the second circuit panel 902 for transport of signals to and from each component 906. The specific example of the system 900 is merely exemplary; any suitable structure for making electrical connections between the components 906 can be used.

Various features of the above-described embodiments of the invention can be combined in ways other than as specifically described above without departing from the scope or spirit of the invention. It is intended for the present disclosure to cover all such combinations and variations of embodiments of the invention described above.

The following paragraphs additionally describe features and embodiments of the invention:

A microelectronic package family, including a plurality of microelectronic packages each having terminals for connection with corresponding contacts of an external component and each including a microelectronic element having a memory storage array having a given number of storage locations, the terminals of each microelectronic package being configured to receive corresponding command and address information specifying one of the storage locations, each microelectronic element having inputs connected with the terminals of the respective microelectronic package, wherein the microelectronic element of a first microelectronic package of the family is configured to sample first command and address information coupled thereto through the terminals of the first package at a first sampling rate, and the microelectronic element of a second microelectronic package of the family is configured to sample second command and address information coupled thereto through the terminals of the second package at a second sampling rate being greater than the first sampling rate, the terminals of the first package being configured to connect to a set of contacts of the external component arranged according to a first predetermined arrangement for receipt of the first command and address information, and the terminals of the second package being configured to connect to a set of contacts of the external component arranged according to a second predetermined arrangement for receipt of the second command and address information, wherein the set of contacts arranged according to the second predetermined arrangement include at least some contacts occupying identical positions with the set of contacts arranged according to the first predetermined arrangement, the set of contacts arranged according to the second predetermined arrangement being fewer in number than the set of contacts arranged according to the first predetermined arrangement.

Thus, for example, the microelectronic package 10 shown in FIG. 1 can in any of the foregoing embodiments be any of the types of packages described in the foregoing embodiments. The first type of microelectronic package 110c (FIG. 2C), for example, can include a microelectronic element 131 configured to sample first command and address information coupled thereto through the terminals 125 of such package at a first sampling rate. The second type of microelectronic package 110d, for example, can include microelectronic element 132 configured to sample second command and address information coupled thereto through the terminals 125 through the second package at a second sampling rate greater than the first sampling rate.

As can be seen in FIG. 2C, the terminals 125 of the first package 110c can be configured to connect to a set of contacts 165 of the external component 105c arranged according to a first predetermined arrangement for receipt of the first command and address information. As can be seen in FIG. 2D, the terminals 125 of the second package 110d can be configured to connect to a set of contacts 165 of the external component 105d arranged according to a second predetermined arrangement for receipt of the second command and address information.

Referring to FIGS. 2C and 2D, the set 168 of contacts 165 arranged according to the second predetermined arrangement can include at least some contacts occupying identical positions with the set of contacts arranged according to the first predetermined arrangement. The set 168 of contacts 165 arranged according to the second predetermined arrangement can be fewer in number than the set of contacts arranged according to the first predetermined arrangement.

The invention claimed is:

1. A circuit panel having a major surface and a second surface opposite the major surface, the circuit panel comprising:

driving element contacts exposed at the major surface or second surface of the circuit panel, the driving element contacts configured to connect to terminals exposed at a front surface of a driving element and electrically coupled to a microprocessor or a direct memory access controller therein;

panel contacts exposed at a connection site of the major surface of the circuit panel and configured to be coupled to terminals exposed at a front surface of a microelectronic package having one or two microelectronic elements including a memory storage array, each of the microelectronic elements having address input element contacts electrically connected with the memory storage array, the connection site defining a peripheral boundary on the major surface surrounding a group of the panel contacts that is configured to be coupled to a single microelectronic package;

a plurality of conductors together comprising at least one bus, the conductors extending on or within the circuit panel in one or more directions parallel to the major surface, the driving element contacts electrically coupled with the group of the panel contacts through the plurality of conductors;

the group of the panel contacts including:

first, second, third, and fourth sets of first contacts, positions of the first set of first contacts being symmetric about a theoretical plane normal to the major surface with positions of the second set of first contacts, positions of the third set of first contacts being symmetric about the theoretical plane with positions of the fourth set of first contacts, wherein each of the sets of first contacts is configured to carry all of the address information used within the microelectronic package to specify a location within the memory storage array, wherein the conductors are configured to carry all of the address information transferred between the driving contacts and the panel contacts, and wherein a total number of the address input element contacts is less than a total number of the first contacts of the circuit panel;

wherein the terminals of the microelectronic package include first terminals configured to be coupled to the first and fourth sets of first contacts, and no-connect terminals configured to be coupled to the second and third sets of first contacts, each no-connect terminal being electrically insulated from the memory storage array within the microelectronic package, and wherein a position of each first terminal on a first side of the theoretical plane is symmetric about the theoretical plane with a position of a no-connect terminal on a second side of the theoretical plane opposite from the first side, and a position of each first terminal on the second side is symmetric about the theoretical plane with a position of a no-connect terminal on the first side.

2. The circuit panel of claim 1, wherein the group of the panel contacts further includes first and second sets of second contacts disposed on respective first and second sides of the theoretical plane, the first set of second contacts being disposed between a first edge of the peripheral boundary and the first and third sets of first contacts, the second set of second contacts being disposed between a second edge of the peripheral boundary opposite from the first edge and the second and fourth sets of first contacts, the first and second sets of second contacts together being configured to carry data bus and data strobe signals.

3. The circuit panel of claim 1, wherein the at least one bus is configured to carry all of the command signals transferred to the group of the panel contacts, the command signals being write enable, row address strobe, and column address strobe signals.

4. The circuit panel of claim 2, wherein the bus is a first bus, the circuit panel further comprising a second bus electrically connected with at least some of the second contacts and having a plurality of signal lines configured to carry information other than the address information.

5. The circuit panel of claim 1, the contacts of each of the sets of first contacts being arranged in at least one respective column extending in a direction parallel to the theoretical plane.

6. The circuit panel of claim 1, wherein the connection site is a first connection site and the microelectronic package is a first microelectronic package, the circuit panel further comprising panel contacts exposed at a second connection site of the second surface of the circuit panel and configured to be coupled to terminals exposed at a front surface of a second microelectronic package having a memory storage array, the contacts of the second connection site including fifth, sixth, seventh, and eighth sets of first contacts, positions of the fifth set of first contacts being symmetric about the theoretical plane with positions of the sixth set of first contacts, positions of the seventh set of first contacts being symmetric about the theoretical plane with positions of the eighth set of first contacts, wherein each of the fifth, sixth, seventh, and eighth sets of first contacts is configured to carry identical signals, and each of the fifth, sixth, seventh, and eighth sets of first contacts is configured to carry address information sufficient to specify a location within the memory storage array of the second microelectronic package.

7. The circuit panel of claim 6, wherein the terminals of the second microelectronic package including first terminals configured to be coupled to the sixth and seventh sets of first contacts and no-connect terminals configured to be coupled to the fifth and eighth sets of first contacts, a position of each first terminal on a first side of the theoretical plane being symmetric about the theoretical plane with a position of a no-connect terminal on a second side of the theoretical plane opposite from the first side, and a position of each first terminal on the second side being symmetric about the theoretical plane with a position of a no-connect terminal on the first side, and wherein the first, second, third, and fourth sets of contacts are aligned with the respective fifth, sixth, seventh, and eighth sets of contacts in x and y orthogonal directions parallel to the major surface of the circuit panel, the alignments being within a distance equal to a minimum pitch between adjacent ones of the contacts.

8. The circuit panel of claim 6, wherein the at least one bus is configured to carry all of the address information transferred to the contacts of the first and second connection sites, the contacts of the first and second connection sites being electrically connected with the at least one bus.

9. The circuit panel of claim 1, wherein the connection site is a first connection site, the microelectronic package is a first microelectronic package, and the theoretical plane is a first theoretical plane, the circuit panel further comprising contacts exposed at a second connection site of the major surface and configured to be coupled to terminals exposed at a front surface of a second microelectronic package having a memory storage array, the contacts of the second connection site including fifth, sixth, seventh, and eighth sets of first contacts, positions of the fifth set of first contacts being symmetric about the second theoretical plane with positions of the sixth set of first contacts, positions of the seventh set of first contacts being symmetric about the second theoretical plane with positions of the eighth set of first contacts, wherein each of the fifth, sixth, seventh, and eighth sets of first contacts is configured to carry identical signals, and each of the fifth, sixth, seventh, and eighth sets of first contacts is configured to carry address information sufficient to specify a location within the memory storage array of the second microelectronic package.

10. The circuit panel of claim 1, further comprising a device electrically connected to the first contacts, the device being operable to drive the address information to the first contacts.

11. The circuit panel of claim 1, wherein the circuit panel is a module card, the circuit panel further comprising a plurality of module contacts coupled to the group of the panel contacts, the module contacts being configured to carrying information for transfer to and from the group of the panel contacts, the module contacts configured for connection with a component external to the module.

12. A circuit panel having a major surface and a second surface opposite the major surface, the circuit panel comprising:

driving element contacts exposed at the major surface or second surface of the circuit panel, the driving element contacts configured to connect to terminals exposed at a front surface of a driving element and electrically coupled to a microprocessor or a direct memory access controller therein;

panel contacts exposed at a connection site of the major surface of the circuit panel and configured to be coupled to terminals exposed at a front surface of a microelectronic package having one microelectronic element including a memory storage array, each of the microelectronic elements having address input element contacts electrically connected with the memory storage array, the connection site defining a peripheral boundary on the major surface surrounding a group of the panel contacts that is configured to be coupled to a single microelectronic package;

a plurality of conductors together comprising at least one bus, the conductors extending on or within the circuit panel in one or more directions parallel to the major surface, the driving element contacts electrically coupled with the group of the panel contacts through the plurality of conductors;

the group of panel contacts including:
first and second sets of first contacts, positions of the first set of first contacts being symmetric about a theoretical plane normal to the major surface with positions of the second set of first contacts, each of the first and second sets of first contacts being configured to carry all of the address information used within the microelectronic package to specify a location within the memory storage array wherein the conductors are configured to carry all of the address information transferred between the driving contacts and the panel contacts, and wherein a total number of the address input element contacts is less than a total number of the first contacts of the circuit panel; and first and second sets of second contacts disposed on respective first and second sides of the theoretical plane, the first set of second contacts being disposed between the first set of first contacts and a first edge of the peripheral boundary, the second set of second contacts being disposed between the second set of first contacts and a second edge of the peripheral boundary opposite from the first edge, the first and second sets of second contacts together being configured to carry data bus and data strobe information, wherein the terminals of the microelectronic package include first terminals and no-connect terminals configured to be coupled to the first contacts, and second terminals configured to be coupled to the second contacts, and wherein a position of each first terminal on the first side of the theoretical plane is symmetric about the theoretical plane with a position of a no-connect terminal on a second side, and a position of each first terminal on the second side is symmetric about the theoretical plane with a position of a no-connect terminal on the first side.

13. A microelectronic assembly, comprising:
a microelectronic package having a memory storage array; and
a circuit panel having a major surface and a second surface opposite the major surface, the circuit panel comprising:
driving element contacts exposed at the major surface or second surface of the circuit panel, the driving element contacts configured to connect to terminals exposed at a front surface of a driving element and electrically coupled to a microprocessor or a direct memory access controller therein;
panel contacts exposed at a connection site of the major surface of the circuit panel, the panel contacts including first, second, third, and fourth sets of first contacts, positions of the first set of first contacts being symmetric about a theoretical plane normal to the major surface with positions of the second set of first contacts, positions of the third set of first contacts being symmetric about the theoretical plane with positions of the fourth set of first contacts, wherein each of the sets of first contacts is configured to all of the address information used within the microelectronic package to specify a location within the memory storage array; and
a plurality of conductors together comprising at least one bus, the conductors extending on or within the circuit panel in one or more directions parallel to the major surface, the driving element contacts electrically coupled with the panel contacts through the plurality of conductors, the conductors configured to carry all of the address information transferred between the driving contacts and the panel contacts,
the microelectronic package having terminals exposed at a front surface of the microelectronic package, the terminals facing and coupled to the panel contacts so that the front surface of the microelectronic package is normal to the theoretical plane,
wherein the terminals include first terminals coupled to the first and fourth sets of first contacts and no-connect terminals coupled to the second and third sets of first contacts, a position of each first terminal on a first side of the theoretical plane being symmetric about the theoretical plane with a position of a no-connect terminal on a second side of the theoretical plane opposite from the first side, and a position of each first terminal on the second side being symmetric about the theoretical plane with a position of a no-connect terminal on the first side, each no-connect terminal being electrically insulated from the memory storage array within the microelectronic package, and wherein each of the sets of first contacts is configured to carry address information sufficient to specify a location within the memory storage array.

14. The microelectronic assembly of claim 13, wherein the panel contacts exposed at the connection site further include first and second sets of second contacts disposed on the respective first and second sides of the theoretical plane, wherein the terminals further include second terminals coupled to the second contacts and configured to carry at least data signals and data strobe signals, and wherein a first portion of the second terminals are disposed between the first terminals and a first edge of the front surface of the microelectronic package, and a second portion of the second terminals are disposed between the first terminals and a second edge of the microelectronic package opposite from the first edge, the first and second portions together comprising a data bus and data strobes of the microelectronic package.

15. The microelectronic assembly of claim 13, wherein the microelectronic package includes the memory storage array implemented in an LPDDR3 configuration.

16. The microelectronic assembly of claim 13, wherein the panel contacts are configured to receive the signals necessary to uniquely specify a single storage location within the memory storage array.

17. The microelectronic assembly of claim 13, wherein the panel contacts are configured to receive a majority of the signals necessary to uniquely specify a single storage location within the memory storage array.

18. The microelectronic assembly of claim 13, wherein the microelectronic package includes one or more semiconductor chips having address input element contacts exposed at a surface of the at least one semiconductor chip, and conductive structure configured to couple address information received on the first terminals to the address input element contacts, and a total number of the address input element contacts is less than a total number of the first contacts of the circuit panel.

19. The microelectronic assembly of claim 13, wherein the connection site is a first connection site and the microelectronic package is a first microelectronic package,
the circuit panel further comprising panel contacts exposed at a second connection site of the second surface of the circuit panel and coupled to terminals exposed at a front surface of a second microelectronic package having a memory storage array,
the contacts of the second connection site including fifth, sixth, seventh, and eighth sets of first contacts, positions of the fifth set of first contacts being symmetric about the theoretical plane with positions of the sixth set of first contacts, positions of the seventh set of first contacts being symmetric about the theoretical plane with positions of the eighth set of first contacts,
wherein each of the fifth, sixth, seventh, and eighth sets of first contacts is configured to carry identical signals, and each of the fifth, sixth, seventh, and eighth sets of first contacts is configured to carry address information sufficient to specify a location within the memory storage array of the second microelectronic package.

20. The microelectronic assembly of claim 19, wherein the first and second microelectronic packages are each a first type microelectronic package, the terminals of the second microelectronic package including first terminals coupled to the sixth and seventh sets of first contacts and no-connect terminals coupled to the fifth and eighth sets of first contacts, a position of each first terminal on the first side of the theoretical plane being symmetric about the theoretical plane with a position of a no-connect terminal on the second side, and a position of each first terminal on the second side being symmetric about the theoretical plane with a position of a no-connect terminal on the first side, wherein the first, second, third, and fourth sets of contacts are aligned with the respective fifth, sixth, seventh, and eighth sets of contacts in x and y orthogonal directions parallel to the major surface of the circuit panel, the alignments being within a distance equal to a minimum pitch between adjacent ones of the contacts.

21. The microelectronic assembly of claim 13, wherein the connection site is a first connection site, the microelectronic package is a first microelectronic package, and the theoretical plane is a first theoretical plane, the circuit panel further comprising contacts exposed at a second connection site of the major surface and coupled to terminals exposed at a front surface of a second microelectronic package having a memory storage array, the contacts of the second connection site including fifth, sixth, seventh, and eighth sets of first contacts, positions of the fifth set of first contacts being symmetric about a second theoretical plane normal to the major surface with positions of the sixth set of first contacts, positions of the seventh set of first contacts being symmetric about the second theoretical plane with positions of the eighth set of first contacts, wherein each of the fifth, sixth, seventh, and eighth sets of first contacts is configured to carry identical signals, and each of the fifth, sixth, seventh, and eighth sets of first contacts is configured to carry address information sufficient to specify a location within the memory storage array of the second microelectronic package.

22. The microelectronic assembly of claim 1, further comprising the driving element electrically connected with the at least one bus, the terminals of the driving element electrically coupled to the driving element contacts of the circuit panel.

23. A module including a plurality of microelectronic assemblies according to claim 13, each microelectronic assembly mounted to, and electrically connected with a second circuit panel for transport of signals to and from each microelectronic assembly.

24. A system comprising a circuit panel according to claim 1 and one or more other electronic components electrically connected to the circuit panel.

25. The system as claimed in claim 24, further comprising a housing, the circuit panel and the one or more other electronic components being assembled with the housing.

* * * * *